(12) United States Patent
Chang et al.

(10) Patent No.: US 11,710,774 B2
(45) Date of Patent: Jul. 25, 2023

(54) METHOD FOR FORMING EPITAXIAL SOURCE/DRAIN FEATURES AND SEMICONDUCTOR DEVICES FABRICATED THEREOF

(71) Applicant: TAIWAN SEMICONDUCTOR MANUFACTURING COMPANY, LTD., Hsinchu (TW)

(72) Inventors: Jung-Hung Chang, Changhua (TW); Zhi-Chang Lin, Hsinchu (TW); Shih-Cheng Chen, New Taipei (TW); Chien Ning Yao, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 146 days.

(21) Appl. No.: 17/238,505

(22) Filed: Apr. 23, 2021

(65) Prior Publication Data
US 2022/0344483 A1 Oct. 27, 2022

(51) Int. Cl.
*H01L 29/417* (2006.01)
*H01L 29/06* (2006.01)
*H01L 29/78* (2006.01)
*H01L 21/8234* (2006.01)
*H01L 21/308* (2006.01)

(52) U.S. Cl.
CPC .... *H01L 29/41791* (2013.01); *H01L 21/3086* (2013.01); *H01L 21/823412* (2013.01); *H01L 21/823431* (2013.01); *H01L 29/0665* (2013.01); *H01L 29/785* (2013.01); *H01L 2029/7858* (2013.01)

(58) Field of Classification Search
CPC .............. H01L 29/785; H01L 29/0653; H01L 29/42392; H01L 29/78696; H01L 29/41791
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0131394 A1* | 5/2019 | Reznicek .......... H01L 21/30604 |
| 2020/0168606 A1* | 5/2020 | Chan ................. H01L 29/66545 |

* cited by examiner

*Primary Examiner* — Changhyun Yi
(74) *Attorney, Agent, or Firm* — NZ Carr Law Office

(57) ABSTRACT

The present disclosure provides a method of forming N-type and P-type source/drain features using one patterned mask and one self-aligned mask to increase windows of error tolerance and provide flexibilities for source/drain features of various shapes and/or volumes. The present disclosure also includes forming a trench between neighboring source/drain features to remove bridging between the neighboring source/drain features. In some embodiments, the trenches between the source/drain features are formed by etching from the backside of the substrate.

20 Claims, 79 Drawing Sheets

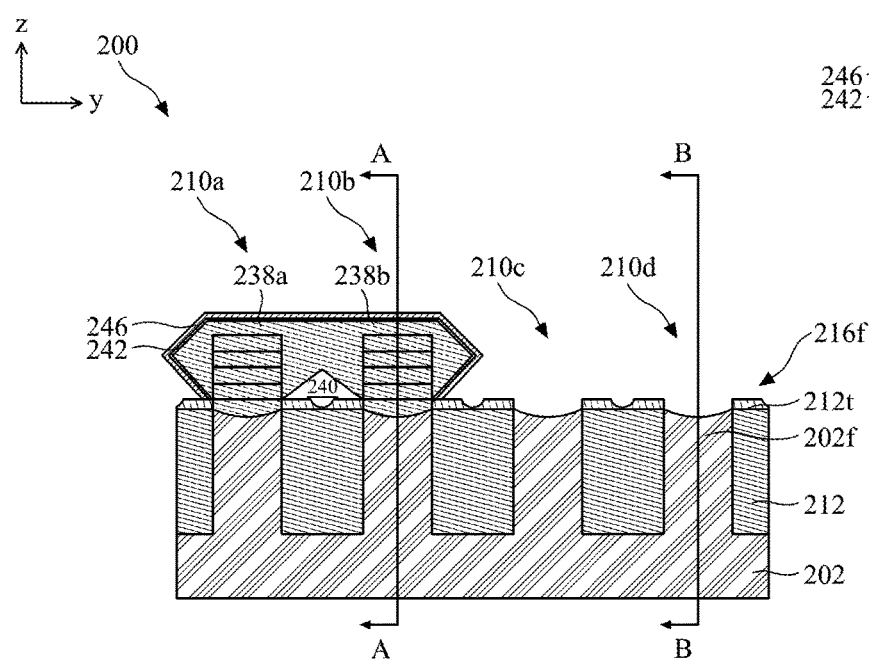
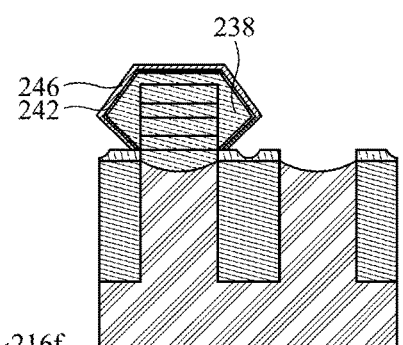
Fig. 14C
Fig. 14D

METHOD FOR FORMING EPITAXIAL SOURCE/DRAIN FEATURES AND SEMICONDUCTOR DEVICES FABRICATED THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, distance between neighboring epitaxial source/drain features become smaller and smaller, which leads to increased bridging between the neighboring source/drain features. Reduced distance between the neighboring source/drain features also reduces patterning alignment tolerance windows during processing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-5, 6A-B, 7A-B, 8A-B, 9A-B, 10A-C, 11A-D, 12A-D, 13A-D, 14A-D, 15A-D, 16A-E, 17A-C, 18A-G, 19A-G, 20A-G, 21A-H, 22A-H, 23A-H, and 24A-H schematically illustrate various stages of manufacturing a semiconductor device according to embodiments of the present disclosure.

DETAILED DESCRIPTION

Figure 1:
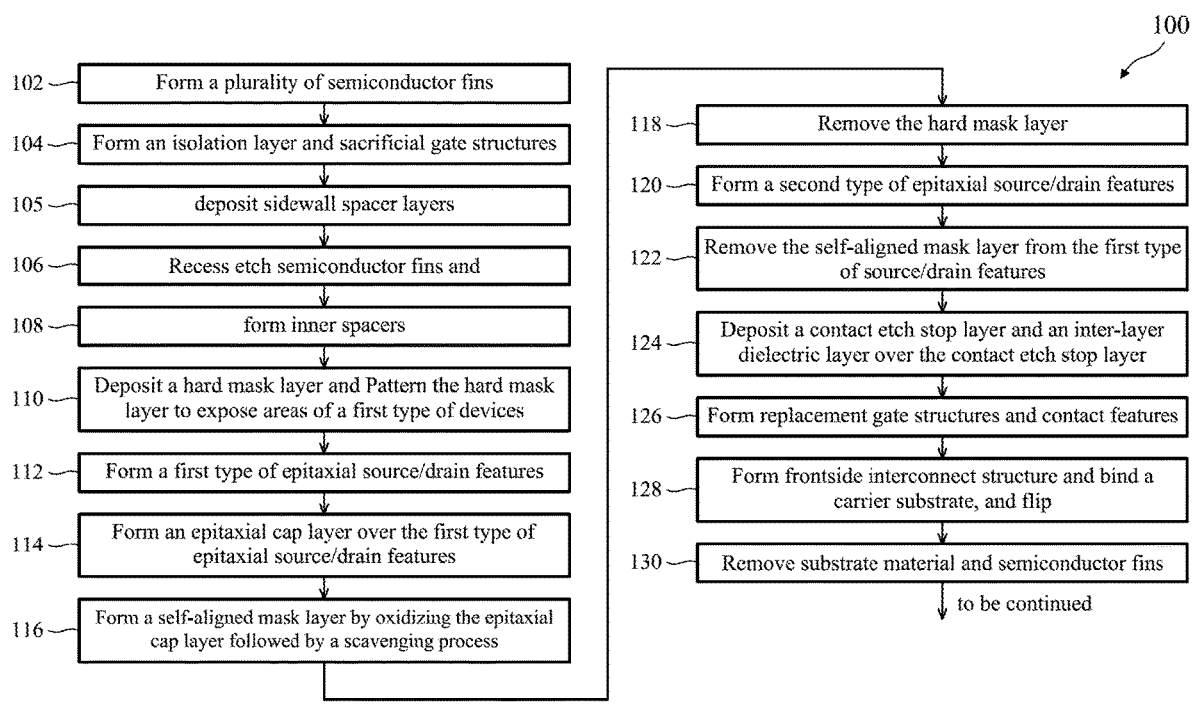
FIG. 1 is a flow chart of a method for manufacturing of a semiconductor device according to embodiments of the present disclosure.
Figure 1:
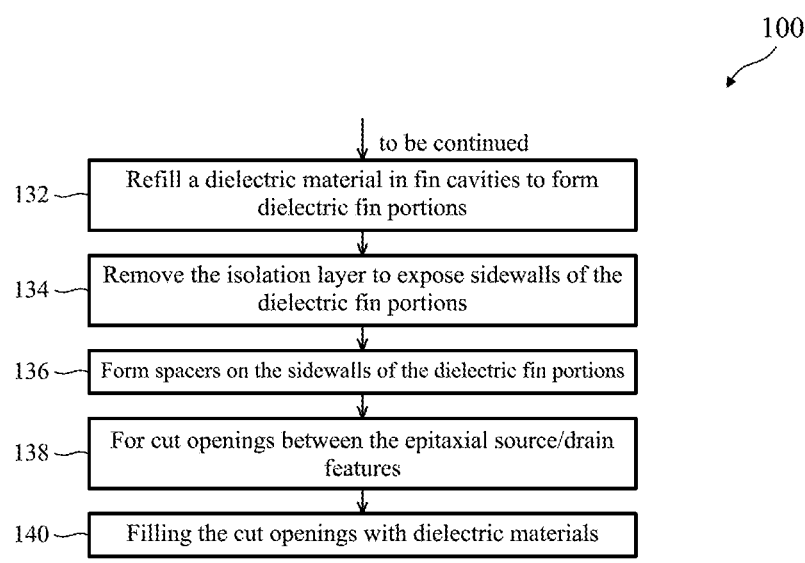

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure provide a method of forming N-type and P-type source/drain features using one patterned mask and one self-aligned mask to increase windows of error tolerance and provide flexibilities for source/drain features of various shapes and/or volumes. In some embodiments, after forming a first type of source/drain features, a self-aligned mask layer is formed over the first type of source/drain features without using photolithography process, thus, avoid damaging the first type of source/drain features in the patterning process. The self-aligned mask layer may be formed by oxidizing an epitaxial cap layer formed over the first type of source/drain features followed by a scavenging process. Embodiments also includes forming a trench between neighboring source/drain features to remove bridging between the neighboring source/drain features. In some embodiments, the trenches between the source/drain features are formed by etching from the backside of the substrate.

FIG. 1 is a flow chart of a method 100 for manufacturing of a semiconductor device according to embodiments of the present disclosure. FIGS. 2-5, 6A-B, 7A-B, 8A-B, 9A-B, 10A-C, 11A-D, 12A-D, 13A-D, 14A-D, 15A-D, 16A-E, 17A-C, 18A-G, 19A-G, 20A-G, 21A-H, 22A-H, 23A-H, and 24A-H schematically illustrate various stages of manufacturing an exemplary semiconductor device 200 according to embodiments of the present disclosure. Particularly, the semiconductor device 200 may be manufactured according to the method 100 of FIG. 1.

Figure 2:
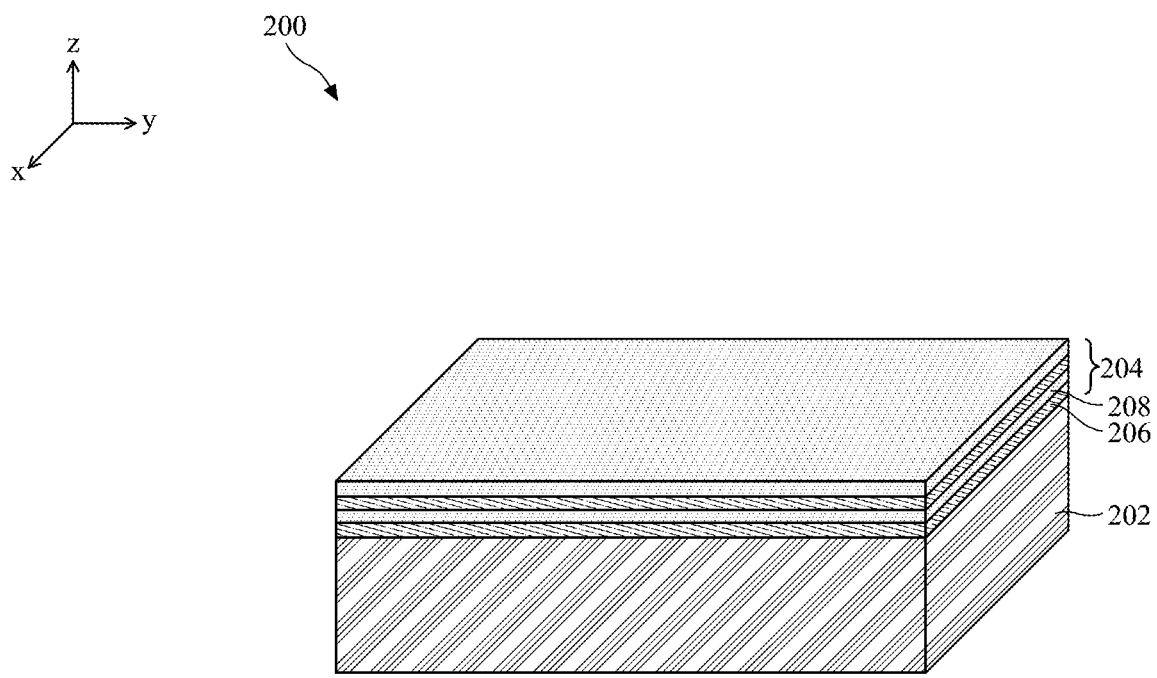
Figure 3:
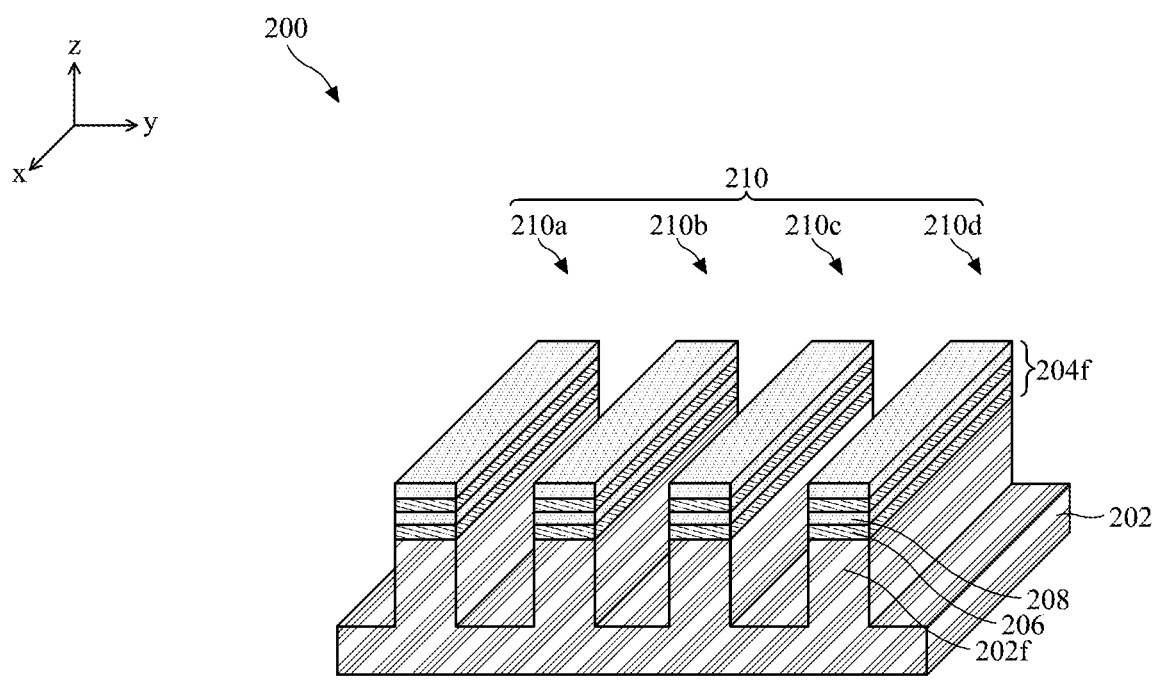

At operation 102 of the method 100, a plurality of semiconductor fin structures 210 are formed on a substrate where a semiconductor device is to be formed. FIGS. 2 and 3 are schematic perspective view of the semiconductor device 200. As shown in FIG. 2, a substrate 202 is provided to form the semiconductor device 200 thereon. The substrate 202 may include a single crystalline semiconductor material such as, but not limited to Si, Ge, SiGe, GaAs, InSb, GaP, GaSb, InAlAs, InGaAs, GaSbP, GaAsSb, and InP. The substrate 202 may include various doping configurations depending on circuit design. In FIG. 2, the substrate 202 may include a p-doped region or p-well and an n-doped region or n-well for forming N-type devices and P-type devices thereon.

A semiconductor stack 204 is formed over the substrate 202. The semiconductor stack 204 may include alternating semiconductor spacing layers 206 and semiconductor channel layers 208 to facilitate formation of nanosheet channels in a multi-gate device, such as nanosheet channel FETs. The semiconductor spacing layers 206 and semiconductor channel layers 208 have different compositions. In some embodiments, the two semiconductor layers 206 and 208 provide for different oxidation rates and/or different etch selectivity. In later fabrication stages, portions of the semiconductor channel layers 208 form nanosheet channels in a multi-gate device. Two semiconductor spacing layers 206 and two semiconductor channel layers 208 are alternately arranged as illustrated in FIG. 2 as an example. More or less semiconductor layers 206 and 208 may be included depending on the desired number of channels in the semiconductor device to be formed. In some embodiments, the number of semiconductor layers 206 and 208 is between 1 and 10.

In some embodiments, the semiconductor spacing layer 206 may include silicon germanium (SiGe). The semiconductor spacing layer 206 may be a SiGe layer including more than 25% Ge in molar ratio. For example, the semiconductor spacing layer 206 may be a SiGe layer including Ge in a molar ratio in a range between 25% and 50%. The semiconductor channel layer 208 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the semiconductor channel layer 208 may include silicon with n-type dopants, such as phosphorus (P), arsenic (As), etc., for n-type devices. In some embodiments, the semiconductor channel layer 208b may be a Ge including p-type dopants, such as boron etc., for p-type devices.

The semiconductor spacing layers 206 and the semiconductor channel layers 208 may be formed by a molecular beam epitaxy (MBE) process, a metalorganic chemical vapor deposition (MOCVD) process, and/or other suitable epitaxial growth processes.

The fin structures 210 are then formed from etching the semiconductor stacks 204 and a portion of the substrate 202 underneath respectively by one or more patterning and etching processes. In FIG. 3, four fin structures 210a, 210b, 210c, 210d are shown and collectively referred to as the fin structures 210. The fin structures 210 a, 210b, 210c, 210d may be formed over different type of wells and/or may include different dopant for forming different types of devices. Each fin structure 210 may include a stack portion 204f and a well portion 202f.

Even though 4 fin structures 210 for nanosheet FET devices are shown in the semiconductor device 200, embodiments of the present disclosure are also applicable to planar FETs, Fin-FETs, Horizontal Gate All Around (HGAA) FETs, Vertical Gate All Around (VGAA) FETs, and other suitable devices.

Figure 4:
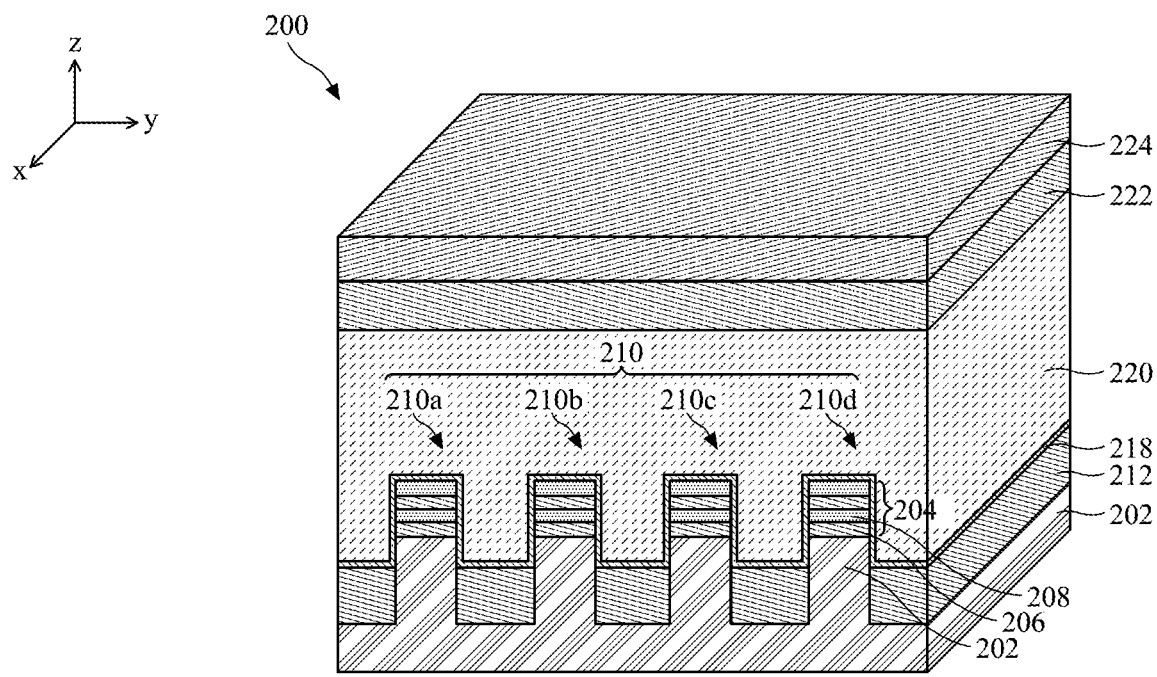
Figure 5:
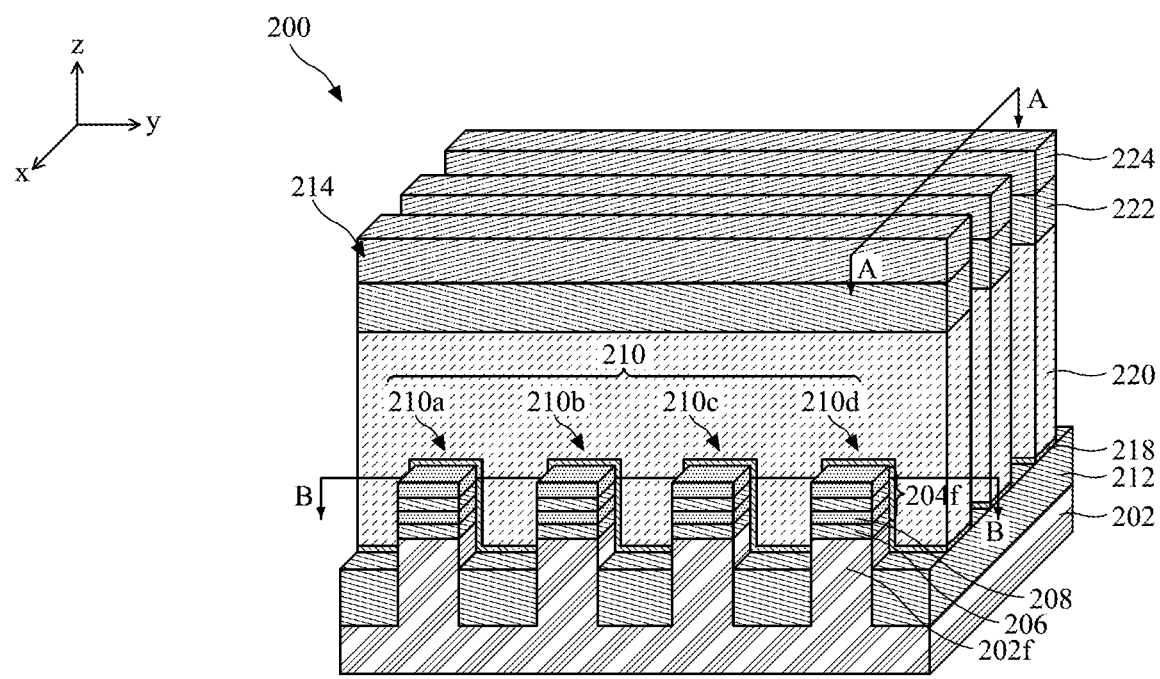

At operation 104, an isolation layer 212, sacrificial gate structures 214, and sidewall spacer layers 216 are subsequently formed as shown in FIGS. 4 and 5. which are schematic views of the semiconductor device 200. The isolation layer 212 is filled in the trenches between the fin structures 210 and then etched back to below the semiconductor stacks 204 of the fin structures 210. The isolation layer 212 may be formed by a high-density plasma chemical vapor deposition (HDP-CVD), a flowable CVD (FCVD), or other suitable deposition process. In some embodiments, the isolation layer 212 may include silicon oxide, silicon nitride, silicon oxynitride, fluorine-doped silicate glass (FSG), a low-k dielectric, combinations thereof. In some embodiments, the isolation layer 212 is formed to cover the fin structures 210 by a suitable deposition process to fill the trenches between the fin structures 210, and then recess etched using a suitable anisotropic etching process to expose the semiconductor stacks 204 of the fin structures 210.

The sacrificial gate structures 214 are formed over the isolation layer 212 and over portions of the fin structures 210. The sacrificial gate structures 214 are formed over portions of the fin structures 210 which are to be channel regions. The sacrificial gate structures 214 may include a sacrificial gate dielectric layer 218, a sacrificial gate electrode layer 220, a pad layer 222, and a mask layer 224.

The sacrificial gate dielectric layer 218 may be formed conformally over the fin structures 210 and the isolation layer 212. In some embodiments, the sacrificial gate dielectric layer 218 may be deposited by a CVD process, a sub-atmospheric CVD (SACVD) process, a FCVD process, an ALD process, a PVD process, or other suitable process. The sacrificial gate dielectric layer 218 may include one or more layers of dielectric material, such as $SiO_2$, SiN, a high-k dielectric material, and/or other suitable dielectric material.

The sacrificial gate electrode layer 220 may be blanket deposited on the over the sacrificial gate dielectric layer 218. The sacrificial gate electrode layer 220 includes silicon such as polycrystalline silicon or amorphous silicon. The thickness of the sacrificial gate electrode layer is in a range between about 42 nm and about 200 nm. In some embodiments, the sacrificial gate electrode layer 220 is subjected to a planarization operation. The sacrificial gate electrode layer 220 may be deposited using CVD, including LPCVD and PECVD, PVD, ALD, or other suitable process.

Subsequently, the pad layer 222 and the mask layer 224 are formed over the sacrificial gate electrode layer 220. The pad layer 222 may include silicon nitride. The mask layer 224 may include silicon oxide. Next, a patterning operation is performed on the mask layer 224, the pad layer 222, the sacrificial gate electrode layer 220 and the sacrificial gate dielectric layer 218 to form the sacrificial gate structures 214.

Figure 6A:
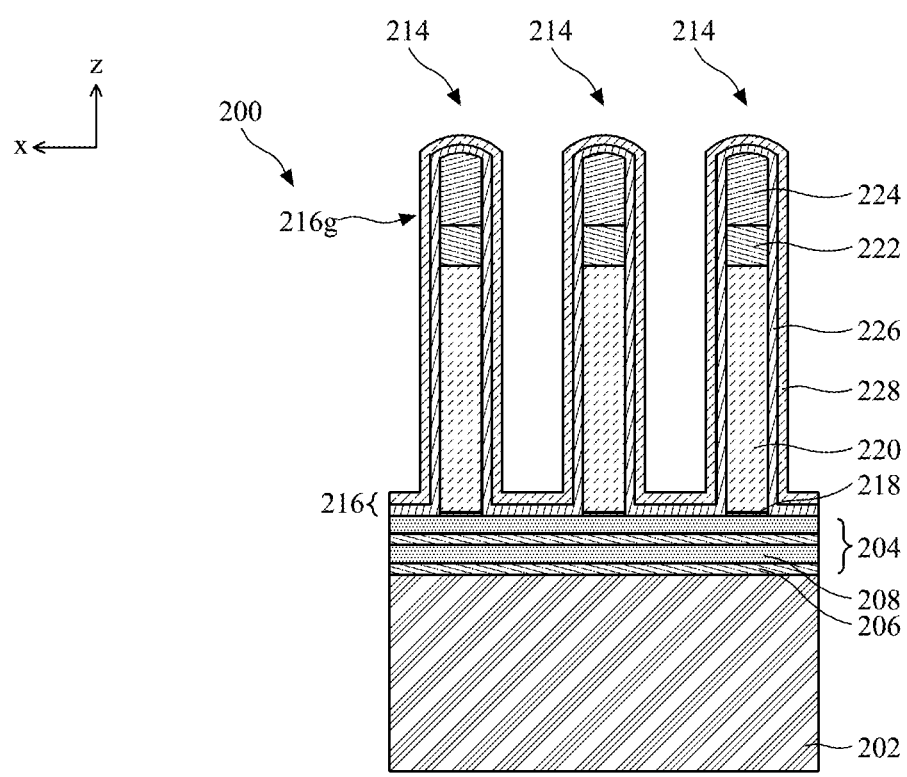
Figure 6B:
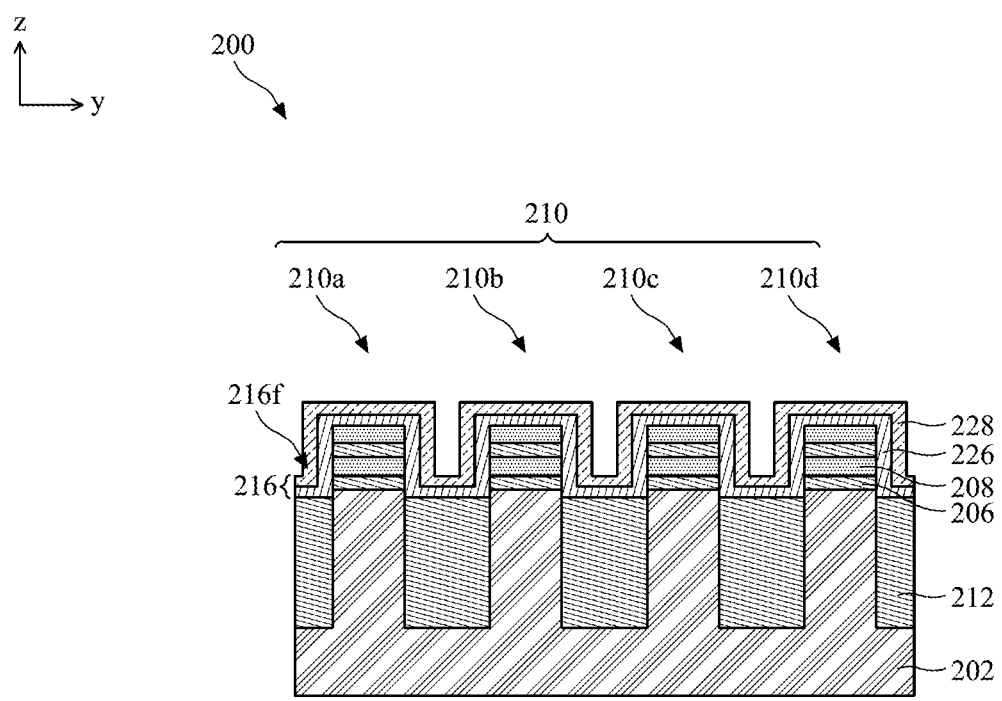

At operation 105, one or more sidewall spacer layers 216 are deposited on the semiconductor device 200, as shown in FIGS. 6A and 6B. FIG. 6A is a sectional view of the semiconductor device 200 along the A-A line in FIG. 5. FIG. 6B is a sectional view of the semiconductor device 200 along the B-B line in FIG. 5A. After the sacrificial gate structures 214 are formed, the one or more sidewall spacer layers 216 are formed by a blanket deposition of one or more insulating material. In some embodiments, the insulating material of the sidewall spacer layers 216 may include a silicon nitride-based material, such as SiN, SiON, SiOCN or SiCN and combinations thereof.

In FIGS. 6A-6B, the one or more spacer layers 216 include a spacer liner 226 and a spacer layer 228. The spacer liner 226 and the spacer layer 228 may be formed over exposed surfaces of the semiconductor device 200. The spacer liner 226 and the spacer layer 228 may be formed by ALD or CVD, or any other suitable method. The spacer liner 226 may include an oxide material, such as silicon oxide, and the spacer layer 228 may include a nitride material, such as silicon nitride. Alternatively, the spacer layer 228 includes another suitable dielectric material, such as silicon oxide, silicon oxynitride, or combinations thereof. The spacer liner 226 may also comprise another suitable dielectric material.

The spacer liner 226 and spacer layer 228 are formed by a suitable process. For example, the spacer liner 226 and spacer layer 228 are formed by blanket deposition sequentially. In some embodiments, an anisotropic etching may be performed to remove the spacer liner 226 and spacer layer 228 from horizontal surfaces, such that the spacer liner 226 and spacer layer 228 are positioned on sidewalls of the sacrificial gate structures 214 and the fin structures 210. In other embodiments, the spacer liner 226 and spacer layer 228 may remain on exposed surfaces of the fin structures 210 and the sacrificial gate structures 214 until the fin structures 210 are etched back. As shown in FIG. 6A, gate sidewall spacers 216g are formed sidewalls of the sacrificial gate structures 214. As shown in FIG. 6B, fin sidewall spacers 216f are formed on sidewalls of the fin structures 210.

Figure 7A:
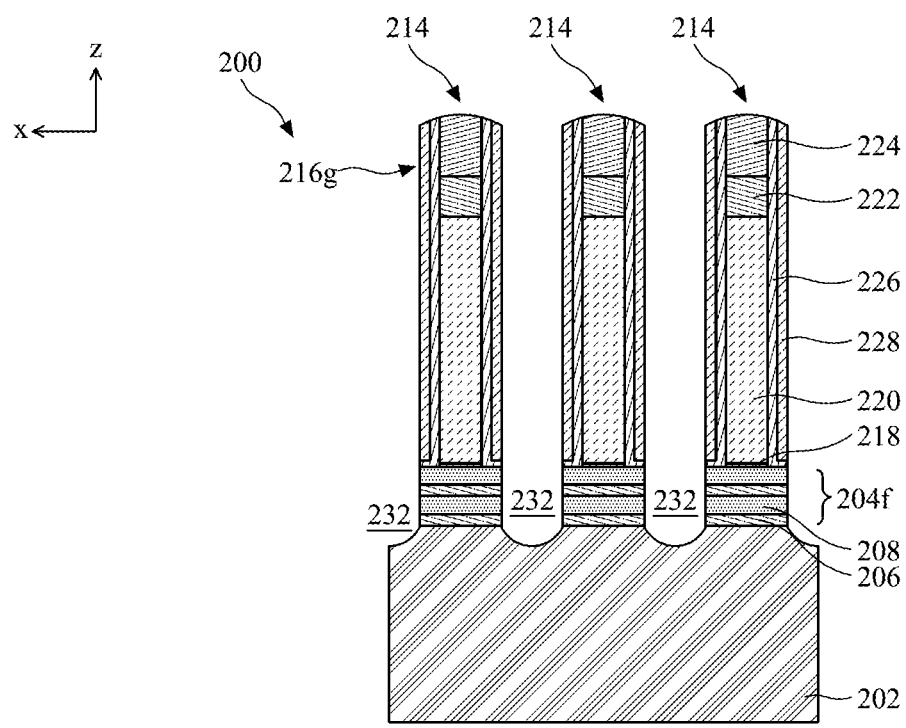
Figure 7B:
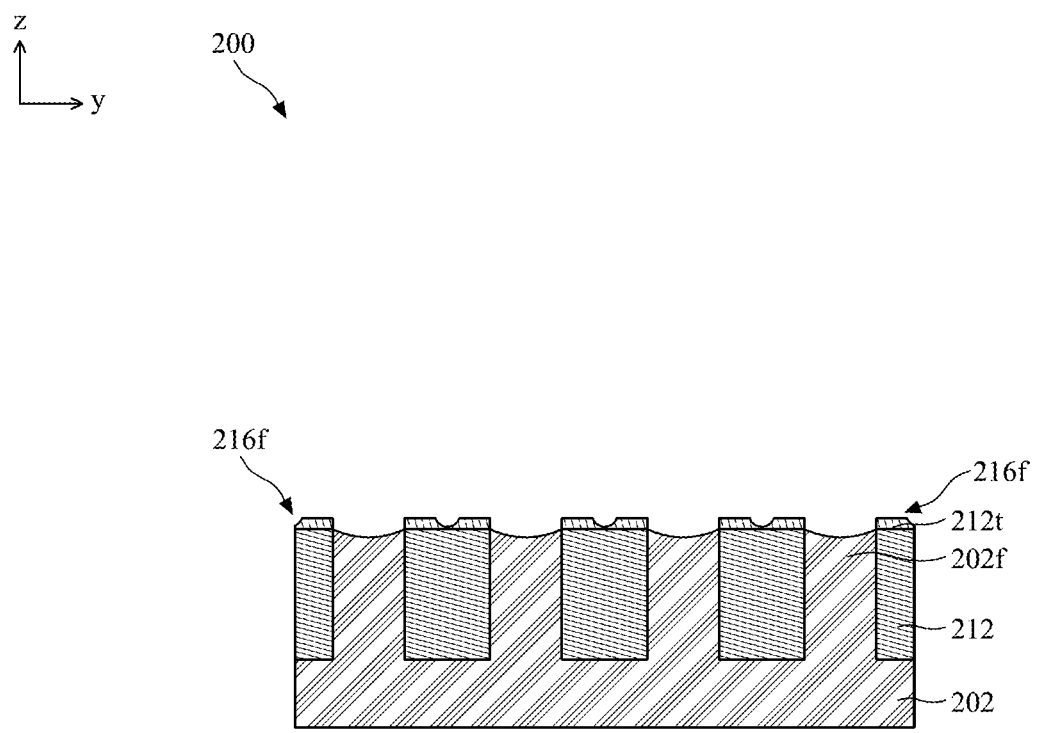

At operation 106, the fin structures 210 in source/drain region, or regions not covered by the sacrificial gate structures 214, are recess etched, as shown in FIGS. 7A-7B. FIG. 7A is a sectional view of the semiconductor device 200 along the line A-A in FIG. 5. FIG. 7B is a sectional view of the semiconductor device 200 along the line B-B in FIG. 5. In some embodiments, suitable dry etching and/or wet etching may be used to remove the semiconductor channel layers 208 and the semiconductor spacing layers 206, together or separately. In some embodiments, the stack portion 204f of each fin structure 210 between the sacrificial gate structures 214 is completely removed exposing the well portion 202f of the fin structures 210. In some embodiments, the well portion 202f is also partially recessed during operation 106. As shown in FIG. 7A, source/drain recesses 232 are formed on both sides of the sacrificial gate structures 214.

As shown in FIG. 7B, the fin sidewall spacers 216f are also at least partially recessed. In some embodiments, the fin sidewall spacers 216f may be recessed during recess etch of the fin structures 210. In other embodiments, the fin sidewall spacers 216f may be removed using a separate process. In some embodiments, heights of the fin sidewall spacers 216f may be controlled to achieve desired shape of the source/drain features to be formed from the fin structures 210. For example, the heights of the fin sidewall spacers 216f, along the z-direction, from a top surface 212t of the isolation layer 212 may be controlled to define critical dimension and/or shape of the source/drain features to be formed. In some embodiments, the heights of the fin sidewall spacers 216f may be set to control location of the merge point the two source/drain features formed from the neighboring fin structures 210.

Figure 8A:
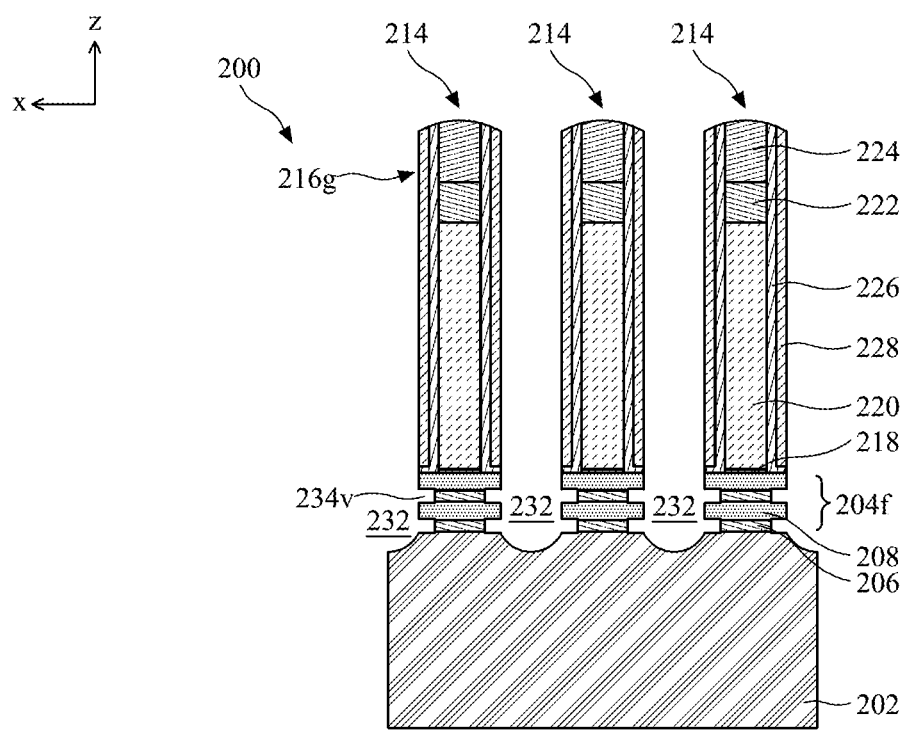
Figure 8B:
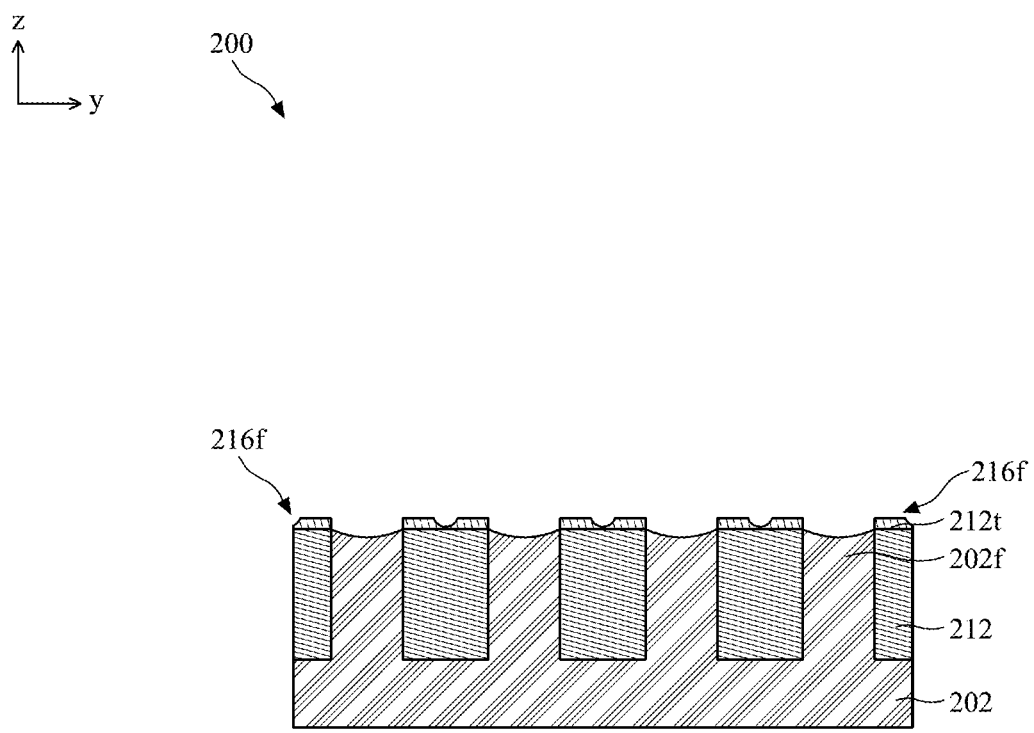
Figure 9A:
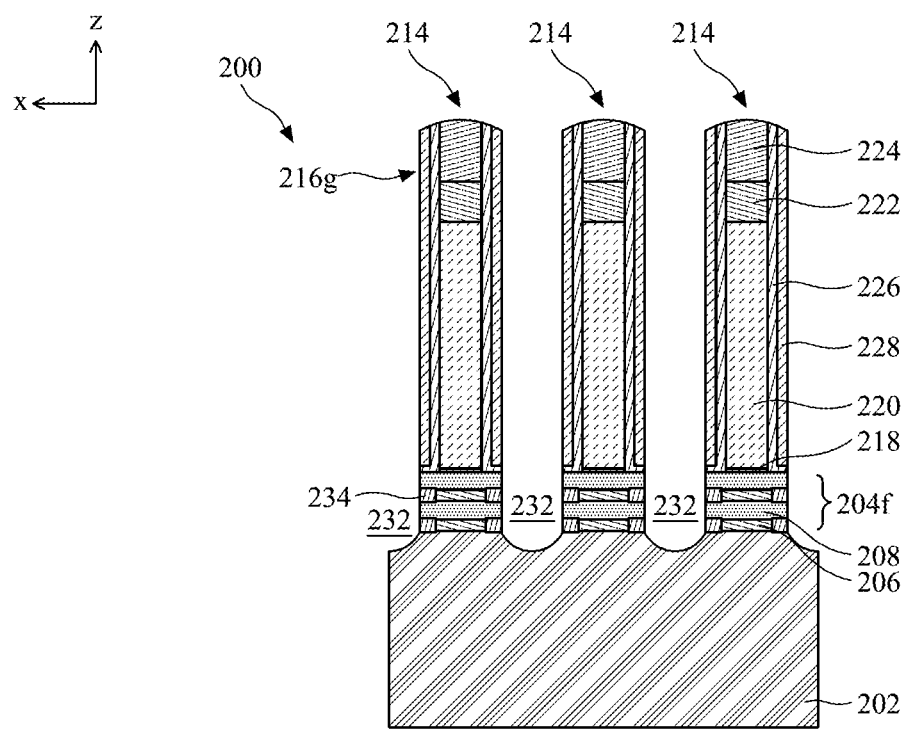
Figure 9B:
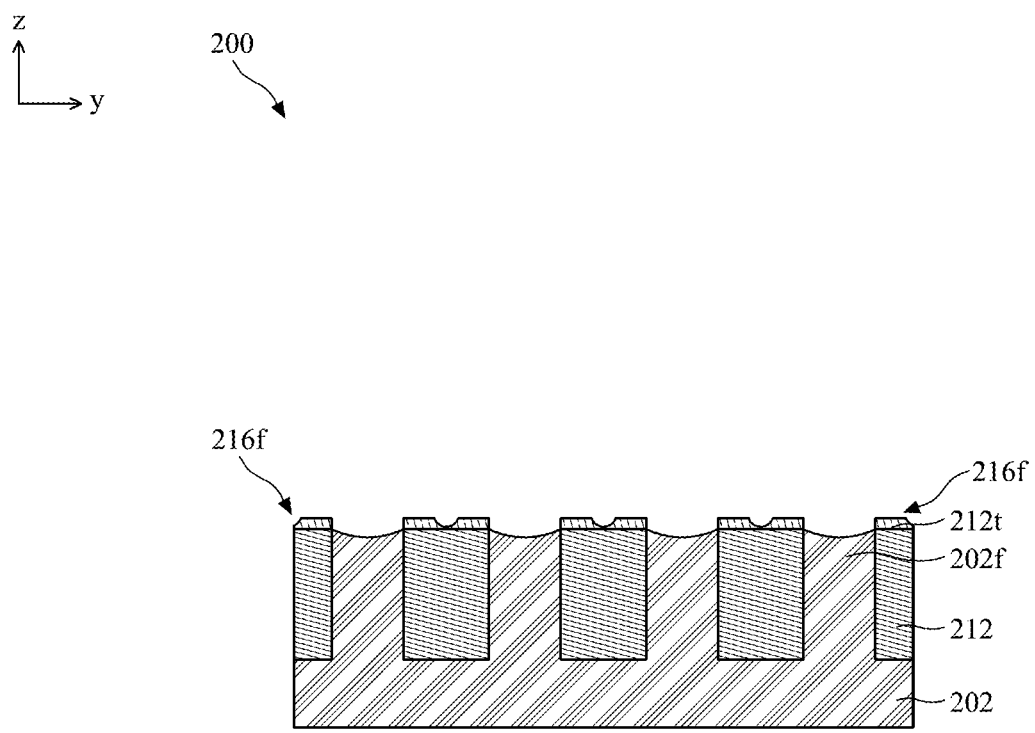

At operation 108, inner spacers 234 are formed, as shown in FIGS. 8A-8B and 9A-9B. FIGS. 8A and 9A are sectional views of the semiconductor device 200 along the line A-A in FIG. 5. FIGS. 8B and 9B are sectional views of the semiconductor device 200 along the line B-B in FIG. 5. To form the inner spacers 234, the semiconductor spacing layers 206 under the gate sidewall spacers 216g are selectively etched from the semiconductor channel layers 208 along the horizontal direction, or x-direction, to form spacer cavities 234v. In some embodiments, the semiconductor spacing layers 206 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After forming the spacer cavities 234v, the inner spacers 234 are formed in the spacer cavities 234v by conformally deposit and then partially remove an insulating layer. The insulating layer can be formed by ALD or any other suitable method. The subsequent etch process removes most of the insulating layer except inside the cavities, resulting in the inner spacers 234.

Figure 10A:
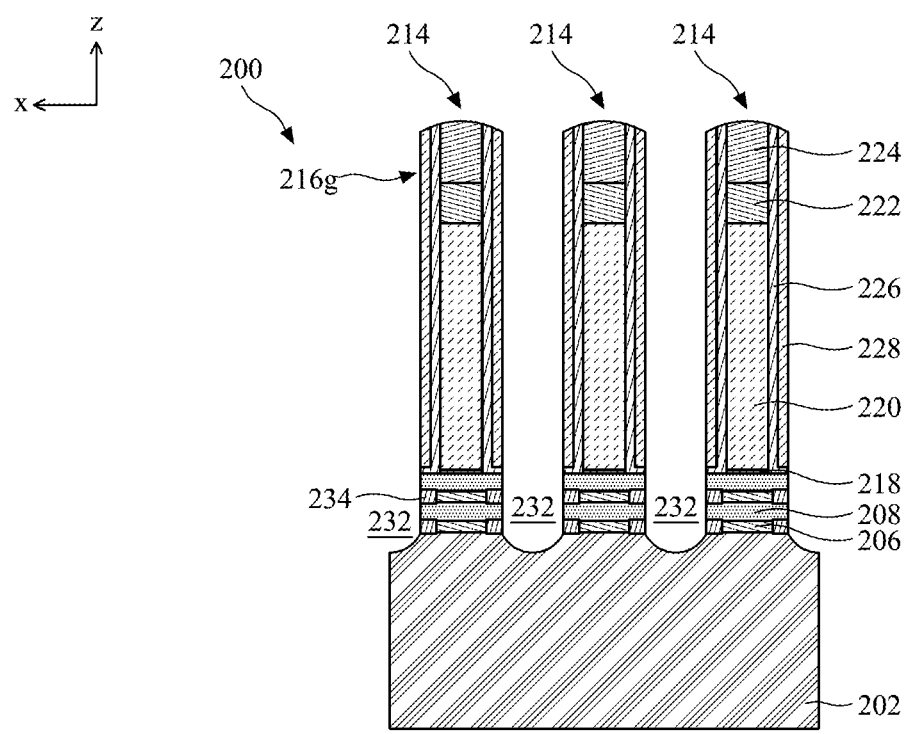
Figure 10B:
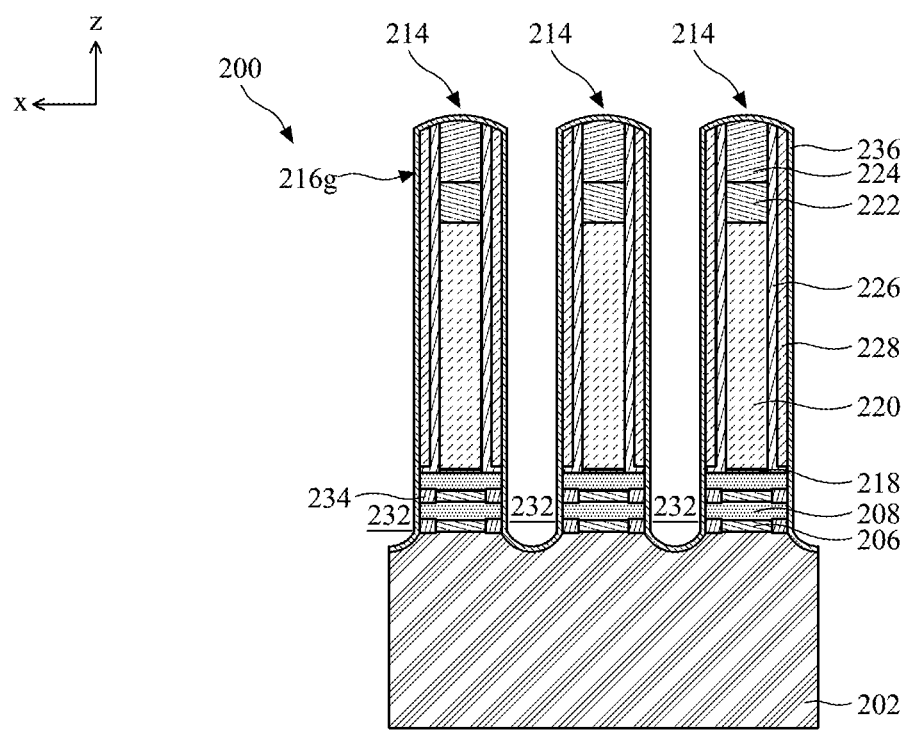
Figure 10C:
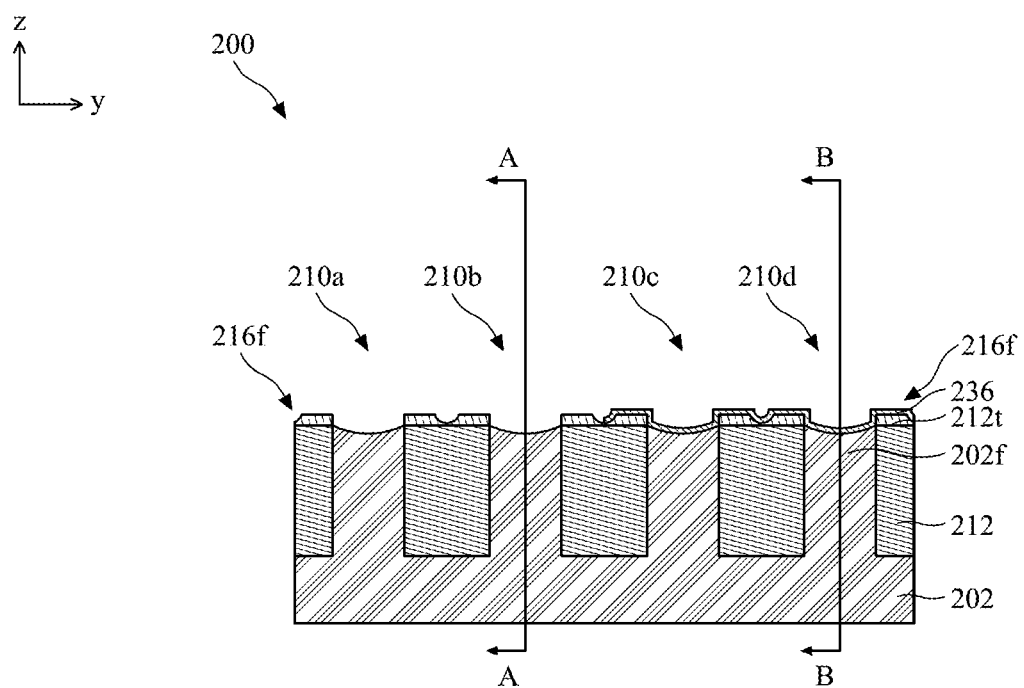

At operation 110, a hard mask layer 236 is deposited and patterned to cover areas for one type of devices, such as N-type device areas or P-type device areas, as shown in FIGS. 10A-10C. FIG. 10O is a sectional view of the semiconductor device 200 along the line B-B in FIG. 5. FIG. 10A is a sectional view of the semiconductor device 200 along the line A-A in FIG. 10C. FIG. 10B is a sectional view of the semiconductor device 200 along the line B-B in FIG. 10O. The hard mask layer 236 is first deposited over exposed surfaces on the substrate 202, and a photoresist layer (not shown) is coated over the hard mask layer 236. In some embodiments, the hard mask layer 236 may include an aluminum oxide ($AlO_x$) layer. Other suitable materials capable of withstanding the processing conditions of epitaxial source/drain formation and with an etch selectivity with a subsequently formed self-aligned mask may be used in the hard mask layer 236.

A photolithography process is performed to pattern the hard mask layer 236 to exposes processing areas for one type of devices, such as N-type device areas or P-type device areas. In the example shown in FIG. 10C, the hard mask layer 236 is patterned to expose areas where N-type devices are to be formed. Alternatively, the hard mask layer 236 may be patterned to expose areas where P-type devices are to be formed. After the photolithography process, an etch process is performed to remove the portion of the hard mask layer 236. In some embodiments, the etch process to remove the portion of the hard mask layer 236 includes a wet etch process, a dry etch process, or a combination thereof. The photoresist layer 230 may be removed by a suitable process, such as a wet strip process, prior to forming epitaxial source/drain features.

Figure 11A:
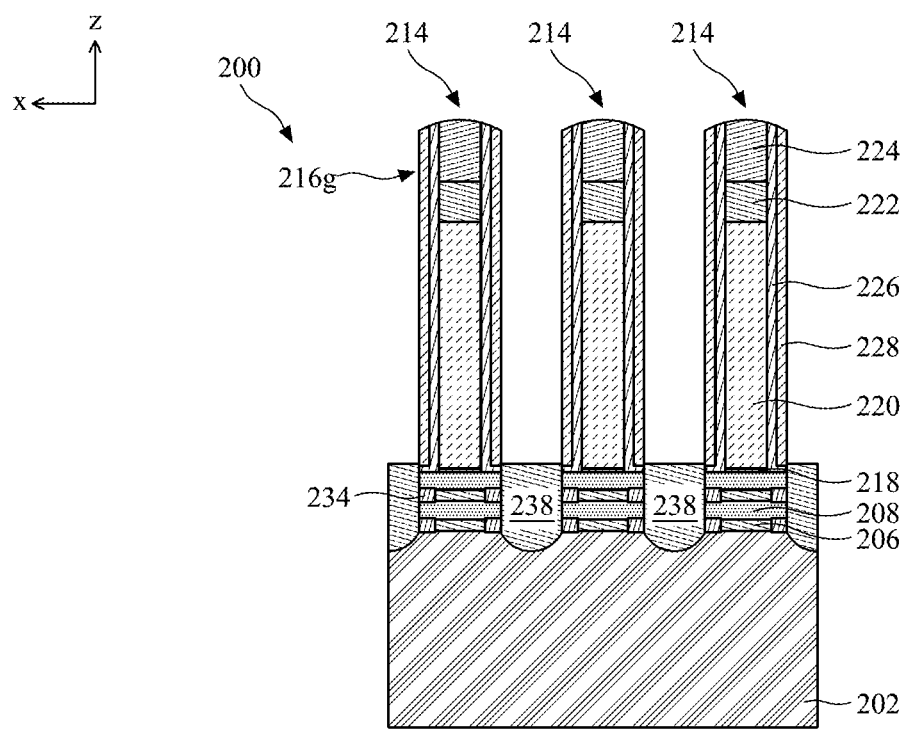
Figure 11B:
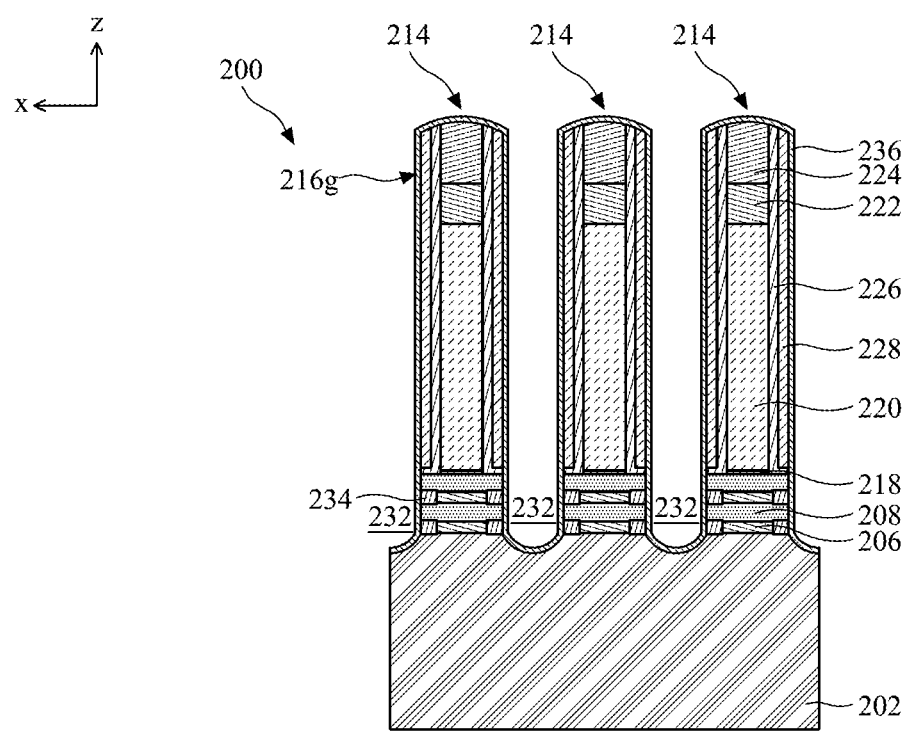
Figure 11C:
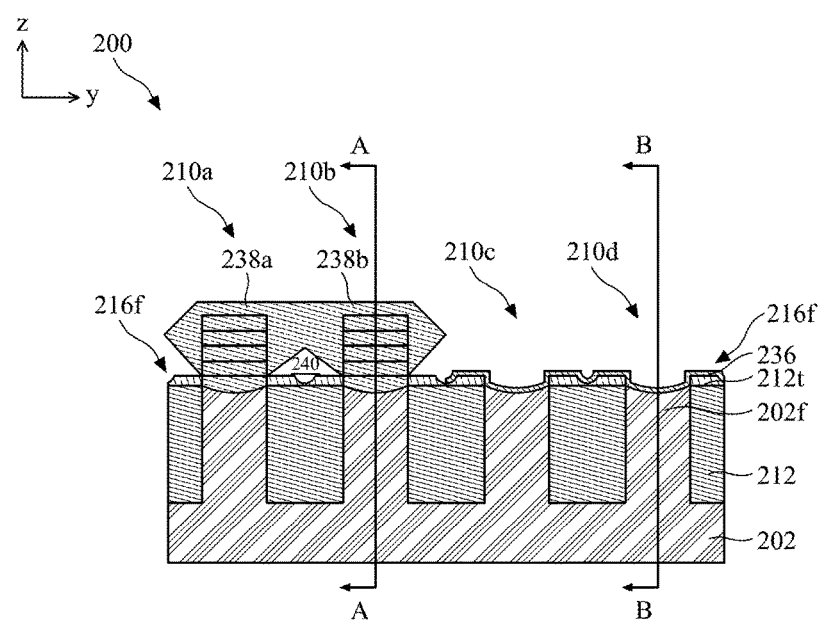
Figure 11D:
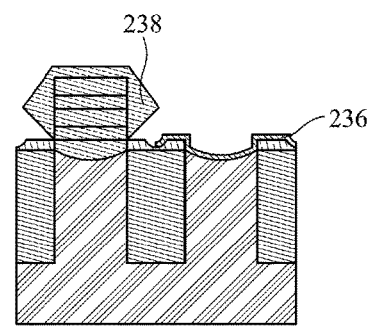

At operation 112, epitaxial source/drain features for a first type of devices are formed, as shown in FIGS. 11A-11D. FIG. 11O is a sectional view of the semiconductor device 200 along the line B-B in FIG. 5. FIG. 11A is a sectional view of the semiconductor device 200 along the line A-A in FIG. 11O. FIG. 11B is a sectional view of the semiconductor device 200 along the line B-B in FIG. 11O. FIG. 11D is a partial sectional view of FIG. 11O in an alternative embodiment. The first type of devices may be N-type devices or P-type devices. In the embodiment shown in FIGS. 11A-11D, the first type of devices may be N-type devices or P-type devices.

The epitaxial source/drain features 238 for n-type devices may include one or more layers of Si, SiP, SiC and SiCP. The epitaxial source/drain features 238 also include N-type dopants, such as phosphorus (P), arsenic (As), etc. In some embodiments, the epitaxial source/drain features 238 may be a Si layer includes phosphorus (P) dopants. The epitaxial source/drain features 238 shown in FIG. 11O has a hexagon shape. However, the epitaxial source/drain features 238 may be other shapes according to the design, such as an oval shape, a bar shape. The epitaxial source/drain features 238 may be formed by any suitable method, such as by CVD, CVD epitaxy, molecular beam epitaxy (MBE), or any suitable deposition technique.

In some embodiments, the epitaxial source/drain features 238 formed from neighboring fin structures 210 may be joined or connected at certain portions, as shown in FIG. 11O. Epitaxial source/drain features 238a, 238b are epitaxially grown from the neighboring fin structures 210a, 210b. The epitaxial source/drain features 238a, 238b are connected at upper portion. An air gap 240 is formed between lower facets of the epitaxial source/drain features 238a, 238b and the fin sidewall spacers 216f. In some embodiments, a portion of the isolation layer 212 may be also exposed to the air gap 240.

The joining or connection of neighboring epitaxial source/drain features is sometimes referred to as bridging. In some embodiments, bridging of the neighboring epitaxial source/drain features 238 may be designed to achieve increased the volume of the epitaxial feature or to increase contact areas of source/drain contact features. In other embodiments, bridging the neighboring epitaxial source/drain features 238 may be undesirable result of reduced pitch of the fin structures 210. In some embodiments, a subsequent backside etching process may be performed to separate neighboring epitaxial source/drain features 238 that are connected.

In other embodiments, the epitaxial source/drain features 238 may be formed without bridging or connection with neighboring epitaxial source/drain features 238, as shown in the example of FIG. 11D.

Figure 12A:
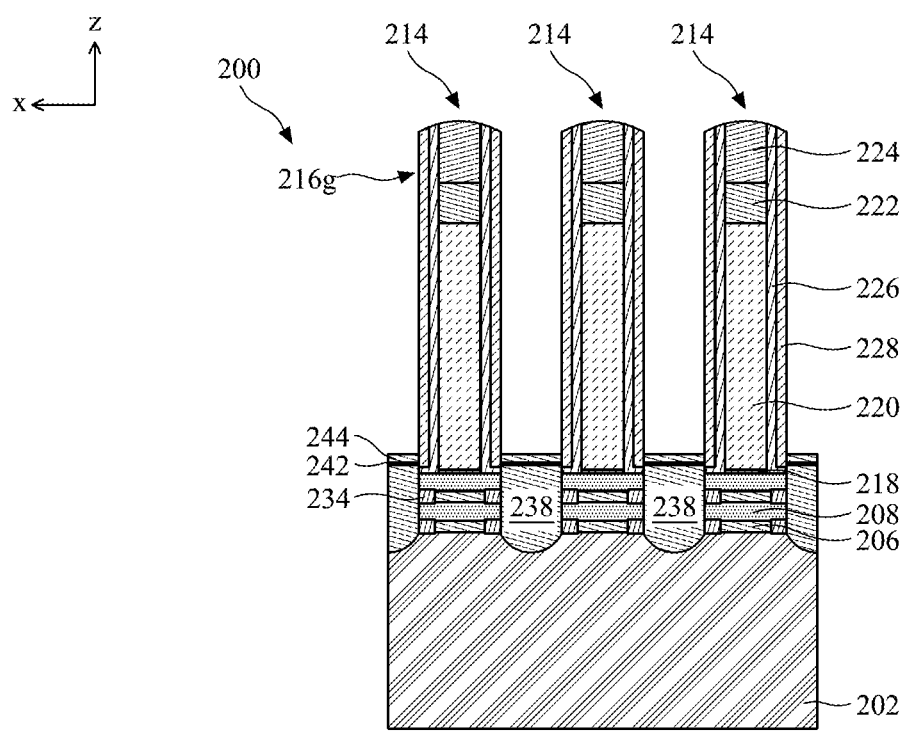
Figure 12B:
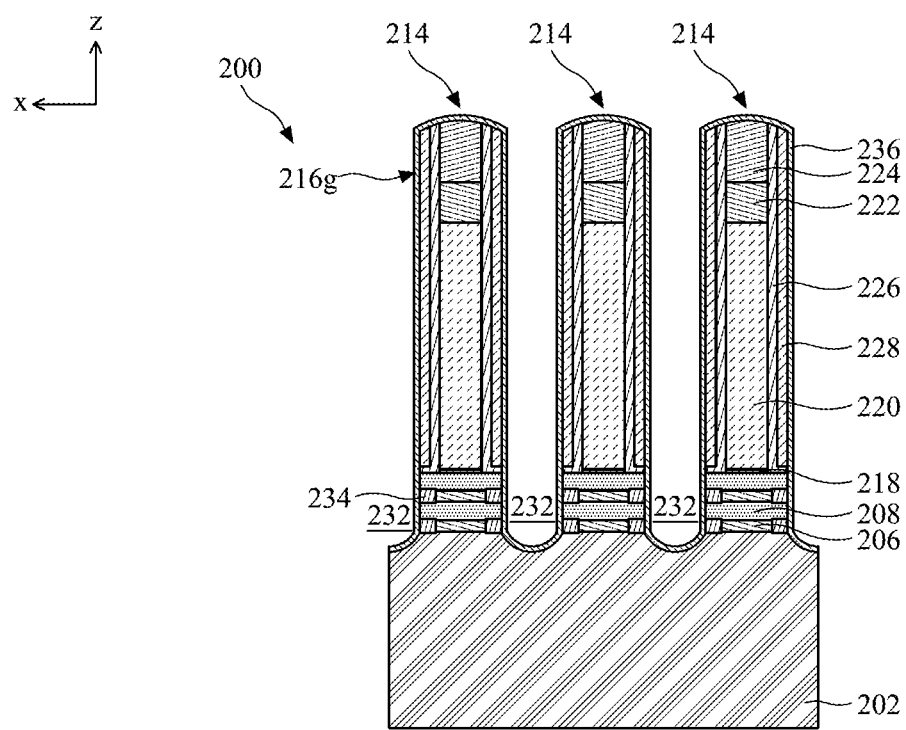
Figure 12D:
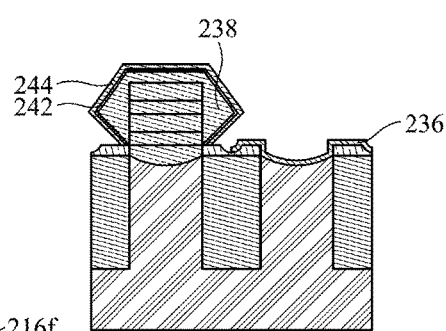
Figure 12C:
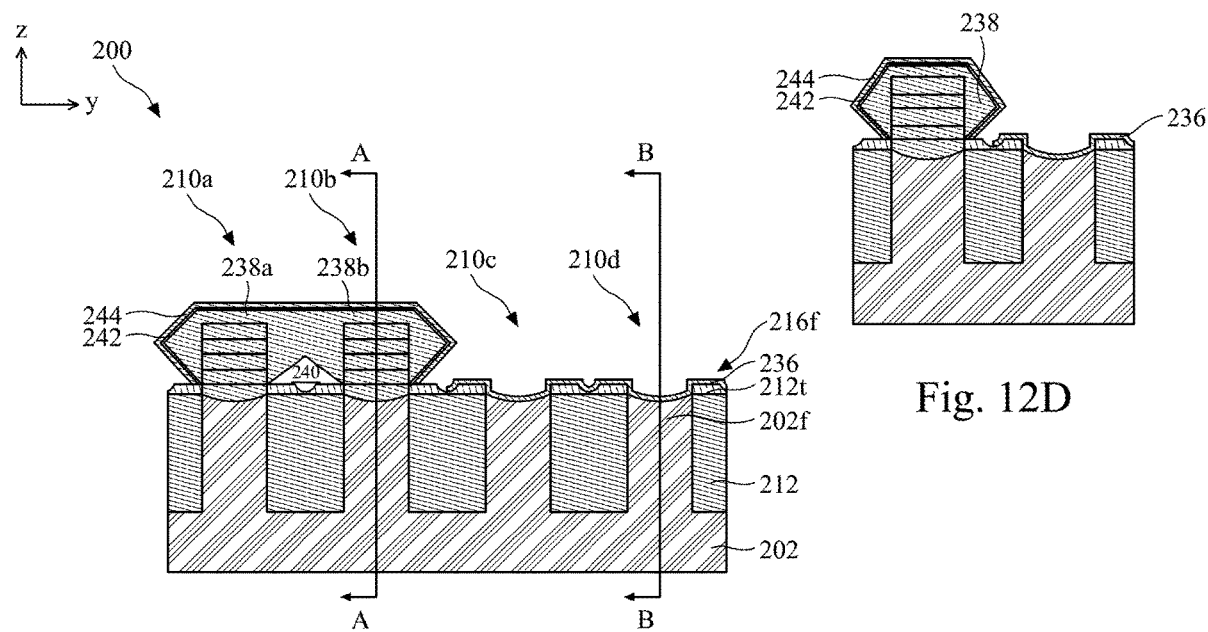

At operation 114, an epitaxial liner 242 and an epitaxial cap layer 244 are sequentially formed over the epitaxial source/drain features 238 as shown in FIGS. 12A-12D. FIG. 12C is a sectional view of the semiconductor device 200 along the line B-B in FIG. 5. FIG. 12A is a sectional view of the semiconductor device 200 along the line A-A in FIG. 12C. FIG. 12B is a sectional view of the semiconductor device 200 along the line B-B in FIG. 12C. FIG. 12D is a partial sectional view of FIG. 12C in an alternative embodiment.

In some embodiments, the epitaxial liner 242 and the epitaxial cap layer 244 may be formed in-situ with the epitaxial source/drain features 238. In other embodiments, the epitaxial liner 242 and the epitaxial cap layer 244 may be formed in different chambers.

The epitaxial liner 242 is selectively formed on the exposed surfaces of the epitaxial source/drain features 238 by an epitaxial process. The epitaxial liner 242 is substantially conformal over exposed surfaces of the epitaxial source/drain features 238. The epitaxial liner 242 may be formed by any suitable method, such as by CVD, CVD epitaxy, molecular beam epitaxy (MBE), or any suitable deposition technique. According to some embodiments of the present disclosure, the epitaxial liner 242 is formed in-situ in the same chamber where the epitaxial source/drain features 238 are formed.

In some embodiments, the epitaxial liner 242 is a semiconductor layer of a single crystalline material. The epitaxial liner 242 functions to provide a crystal structural transition between the epitaxial source/drain features 238 and the epitaxial cap layer 244. The epitaxial liner 242 may also function as a barrier layer to prevent diffusion of dopants in the epitaxial source/drain features 238.

In some embodiments, the epitaxial liner 242 is a dopant free epitaxial semiconductor layer. The epitaxial liner 242 may be formed from other materials that is capable of providing structural transition and/or diffusion barrier, for example, the epitaxial liner 242 may include one or more layers of Si, Ge, SiGe, GaAs, InSb, GaP, GaSb, InAlAs, InGaAs, GaSbP, GaAsSb, and InP, depending on the material selection in the epitaxial source/drain features 238 and the subsequent layer. In one embodiment, the epitaxial liner 242 is a dopant free epitaxial silicon layer.

In some embodiments, a thickness of the epitaxial liner 242 is in a range between 1 nm and 5 nm. A thickness less than 1 nm may not provide enough transitional and/or barrier benefit. A thickness greater than 5 nm would not provide additional benefit.

The epitaxial cap layer 244 is selectively formed on the exposed surfaces of the epitaxial liner 242 by an epitaxial process. The epitaxial cap layer 244 may be substantially conformal. The epitaxial cap layer 244 may be formed by any suitable method, such as by CVD, CVD epitaxy, molecular beam epitaxy (MBE), or any suitable deposition technique. In some embodiments, the epitaxial cap layer 244 includes semiconductor materials having different oxidation rates and/or different etch selectivity with the epitaxial source/drain features 238. The epitaxial cap layer 244 are formed from material that can be epitaxially grown from the epitaxial liner 242 and may be selectively oxidized from the epitaxial source/drain features 238 and the epitaxial liner 242.

The epitaxial cap layer 244 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP. In some embodiments, the epitaxial cap layer 244 may include silicon germanium (SiGe). For example, the epitaxial cap layer 244 may be a SiGe layer including Ge in a molar ratio in a range between 20% and 50%.

As shown in FIG. 12C, the epitaxial liner 242 and epitaxial cap layer 244 are formed on exposed surfaces of the bridging epitaxial source/drain features 238a, 238b. The facets exposed to the air gap 240 is unaffected at the operation 114. In FIG. 12D, the epitaxial liner 242 and epitaxial cap layer 244 are formed on all exposed surfaces of the unbridged epitaxial source/drain feature 238.

The epitaxial cap layer 244 may have a thickness in a range between 2 nm and 10 nm. A thickness less than 2 nm cannot form a hard mask thick enough to protect the epitaxial source/drain features 238 during subsequent processes. A thickness greater than 10 nm would not provide additional benefit. In some embodiments, a ratio of the thickness of the epitaxial cap layer 244 over the thickness of the epitaxial liner 242 may be in a range between 0.4 and 10. A thickness ratio lower than 0.4 may not be enough to form a hard mask sufficient enough to protect the epitaxial source/drain features 238 during subsequent processes. A thickness ratio greater than 10 would increase operation cost without additional benefit.

In the example discussed herein, epitaxial source/drain features for n-type devices are formed before epitaxial source/drain features for p-type devices. Alternatively, epitaxial source/drain features for p-type devices are formed before epitaxial source/drain features for n-type devices, and epitaxial liner and epitaxial cap layer of different materials may be deposited to form a self-aligned mask over p-type epitaxial source/drain features. In some embodiments, an epitaxial liner including one or more layers of Si, Ge, SiGe, GaAs, InSb, GaP, GaSb, InAlAs, InGaAs, GaSbP, GaAsSb, and InP, and an epitaxial cap layer including one or more layers of Si, SiP, SiC and SiCP may be used to form a self-aligned mask layer on p-type epitaxial source/drain features.

Figure 13A:
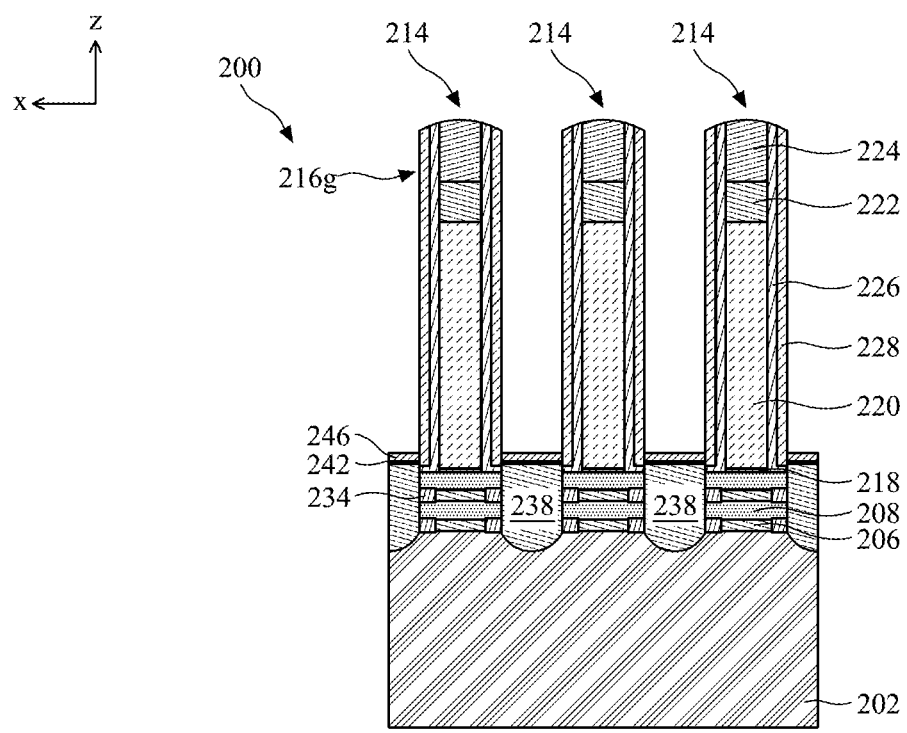
Figure 13B:
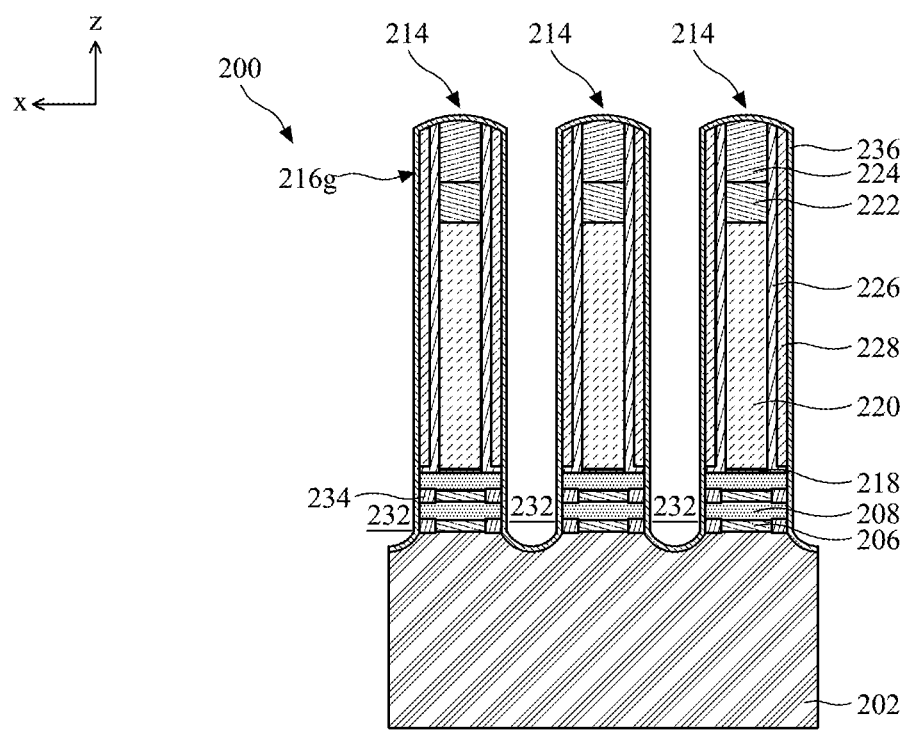
Figure 13C:
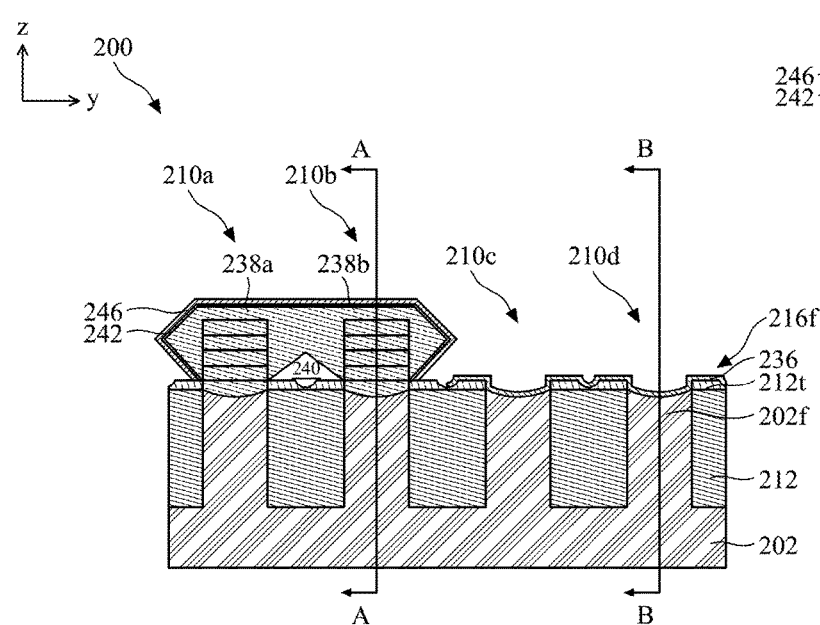
Figure 13D:
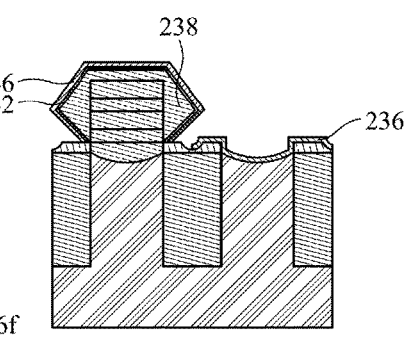

At operation 116, a self-aligned mask layer 246 is formed by performing an oxidation treatment to selectively oxidize the epitaxial cap layer 244 and a scavenging annealing process, as shown in FIGS. 13A-13D. FIG. 13C is a sectional view of the semiconductor device 200 along the line B-B in FIG. 5. FIG. 13A is a sectional view of the semiconductor device 200 along the line A-A in FIG. 13C. FIG. 13B is a sectional view of the semiconductor device 200 along the line B-B in FIG. 13C. FIG. 13D is a partial sectional view of FIG. 13C in an alternative embodiment.

In some embodiments, the self-aligned mask layer 246 is formed by oxidizing and annealing treatments of the epitaxial cap layer 244 while the epitaxial liner 242 is substantially unaffected.

As described above, the epitaxial cap layer 244 and the epitaxial liner 242 have different oxidation rates. In this case, the epitaxial cap layer 244 may include a material having a first oxidation rate, and the epitaxial liner 242 may include a material having a second oxidation rate less than the first oxidation rate. By way of example, in embodiments where the epitaxial cap layer 244 includes SiGe, and where the epitaxial liner 242 include Si, the faster SiGe oxidation rate as compared to Si ensures that the SiGe layer becomes fully oxidized while minimizing or eliminating the oxidization of the epitaxial liner 242.

The oxidation process may be performed using wet oxidation, dry oxidation, plasma oxidation, for example, decoupled plasma oxidation (DPO), or a combination thereof. In some embodiments, a low thermal budget and/or reduced diffusion of oxygen are performed in the oxidation process to prevent re-crystalizing of the epitaxial source/drain features 238.

In some embodiments, a wet steam oxidation process is performed to form the oxide layer. For example, a wet steam oxidation process may be performed using water vapor or steam as an oxidant. In one exemplary process, the wet steam oxidation process may be performed at atmosphere pressure (AP), within a temperature range of about 400-800° C., and for a time from about 1 hour and 4 hours. The temperature and reaction time may be adjusted to achieve desired oxidizing percentage. To achieve the same amount of oxidizing percentage, reacting at a higher temperature will need a shorter time, and reacting at a lower temperature will need a longer time. The wet steam oxidation process is performed at a temperature lower than about 800° C. A temperature higher than 800° C. may alter crystalline structure of the epitaxial source/drain features 238. A temperature lower than 400° C. may take too long to achieve the desired oxidation thus increasing manufacturing cost.

In other embodiments, a dry oxidation process is performed to form the oxide layer. The dry oxidation process may be performed using oxygen as an oxidant. In one exemplary process, the dry oxidation process may be performed at atmosphere pressure (AP), within a temperature range of about 400-800° C. The dry oxidation process is performed at a temperature lower than about 800° C. A temperature higher than 800° C. may alter crystalline structure of the epitaxial source/drain features 238. A temperature lower than 400° C. may take too long to achieve the desired oxidation thus increasing manufacturing cost.

In some embodiments, the oxidation treatment process may be performed in a plasma containing environment, such as decoupled plasma oxidation using inductively coupled plasma processing. The oxidation treatment may be performed by using an oxygen containing gas mixture in a processing environment to react the epitaxial cap layer 244. In some embodiments, the oxygen containing gas mixture includes at least one of an oxygen containing gas with or without an inert gas. Suitable examples of the oxygen containing gas include $O_2$, $N_2$, $NH_3$, and the like. Suitable examples of the inert gas supplied with the gas mixture include at least one of Ar, He, Kr, and the like.

After the oxidation process, the epitaxial cap layer 244 may include oxides of semiconductor materials, such as SiGeOx. An anneal process is then performed to remove one or more elements from at least a topmost portion of the oxide layer, resulting in the self-aligned mask layer 246. In some embodiments, the anneal process at operation removes Ge from the SiGeOx material resulting in the self-aligned mask layer 246 including SiOx. In some embodiments, the anneal process substantially removes at least a portion of the SiGeOx.

In one exemplary process, the anneal process may be performed using $N_2$ as reactant, at atmosphere pressure (AP), within a temperature range of about 600-800° C., and for a time from about 0.5 hour and 2 hours. The temperature and reaction time may be adjusted to achieve desired material removal rate. The anneal process is performed at a temperature lower than about 800° C. A temperature higher than 800° C. may alter crystalline structure of the epitaxial source/drain features 238. A temperature lower than 600° C. may take too long to achieve the desired removal percentage thus increasing manufacturing.

Figure 14A:
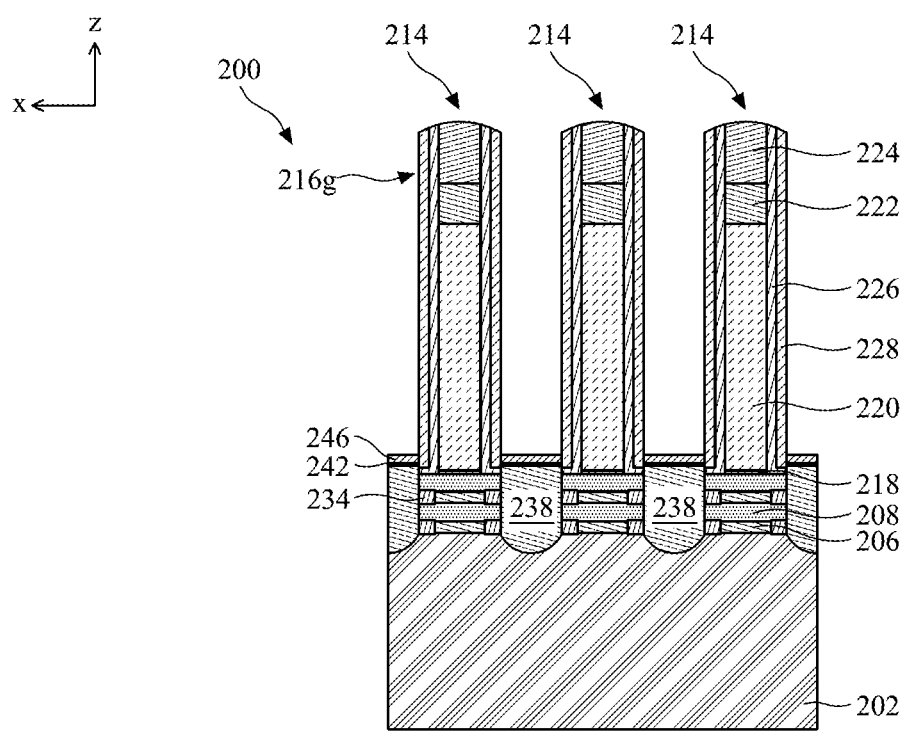
Figure 14B:
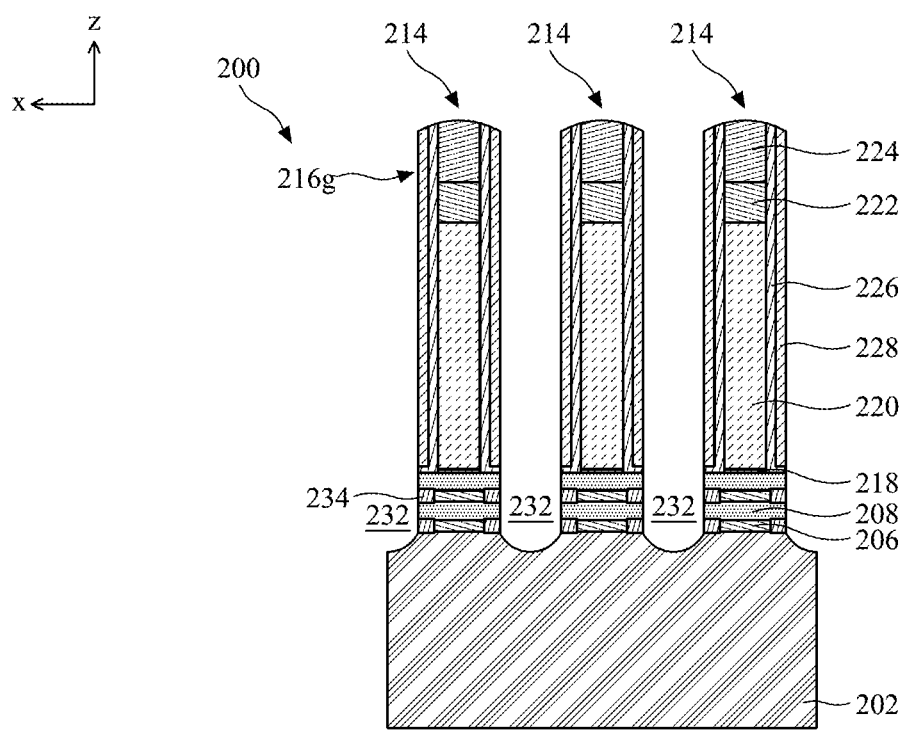

At operation 118, the hard mask layer 236 covering areas other than the first type of devices is removed, as shown in FIGS. 14A-14D. FIG. 14C is a sectional view of the semiconductor device 200 along the line B-B in FIG. 5. FIG. 14A is a sectional view of the semiconductor device 200 along the line A-A in FIG. 14C. FIG. 14B is a sectional view of the semiconductor device 200 along the line B-B in FIG. 14C. FIG. 14D is a partial sectional view of FIG. 14C in an alternative embodiment.

In some embodiments, the etch process to remove the portion of the hard mask layer 236 includes a wet etch process, a dry etch process, or a combination thereof. During the etch process, the self-aligned mask layer 246 protects the epitaxial source/drain features 238. In some embodiments, the self-aligned mask layer 246 may incur some thickness loss during the etch process to remove the hard mask layer 236.

Figure 15A:
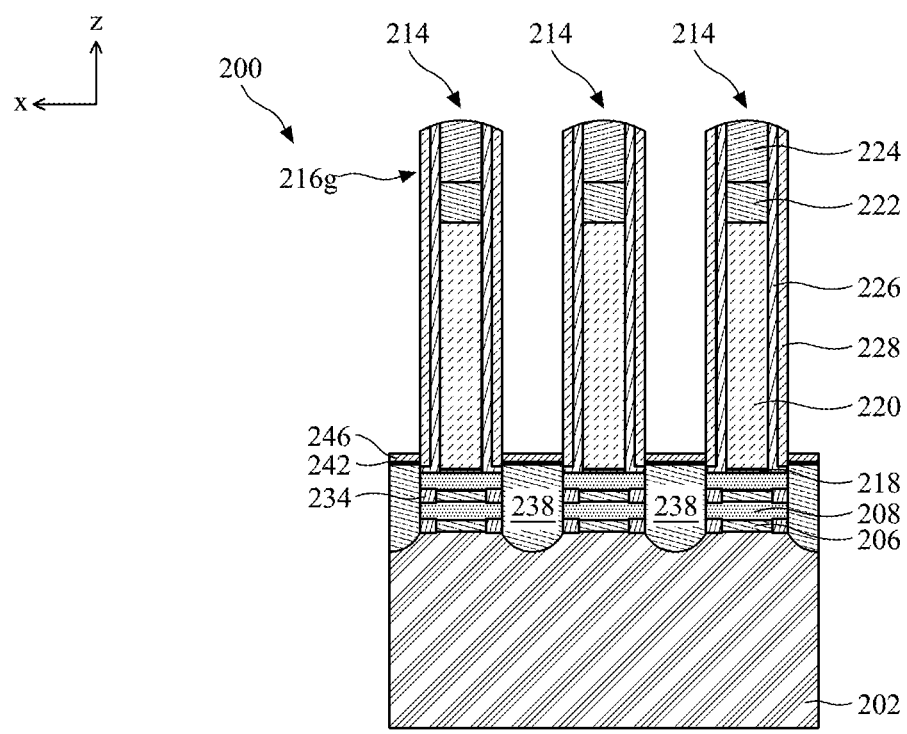
Figure 15B:
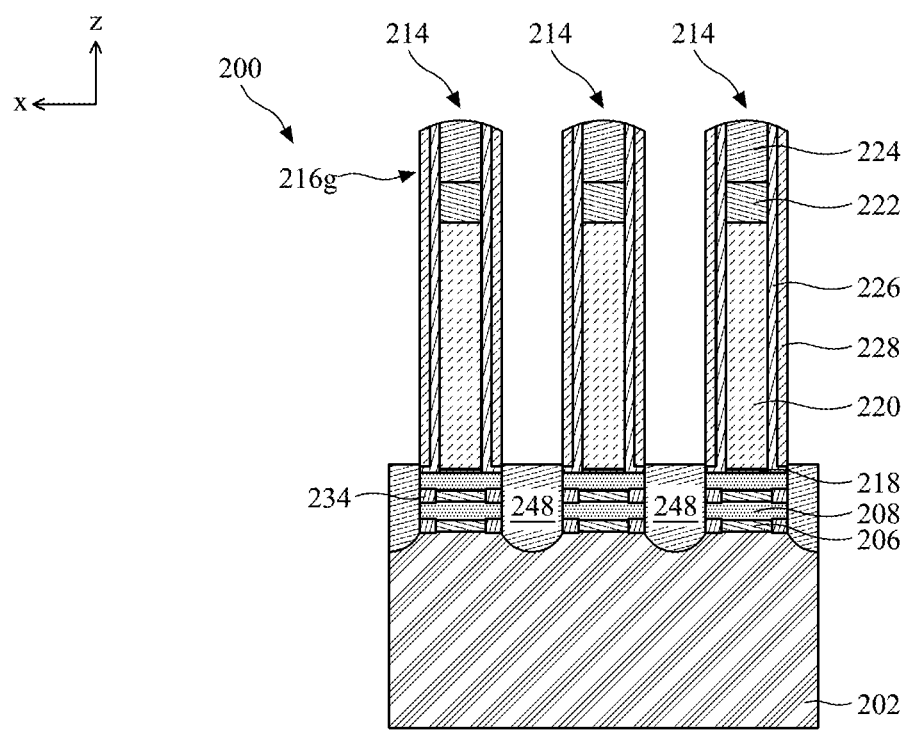
Figures 15C, 15D:
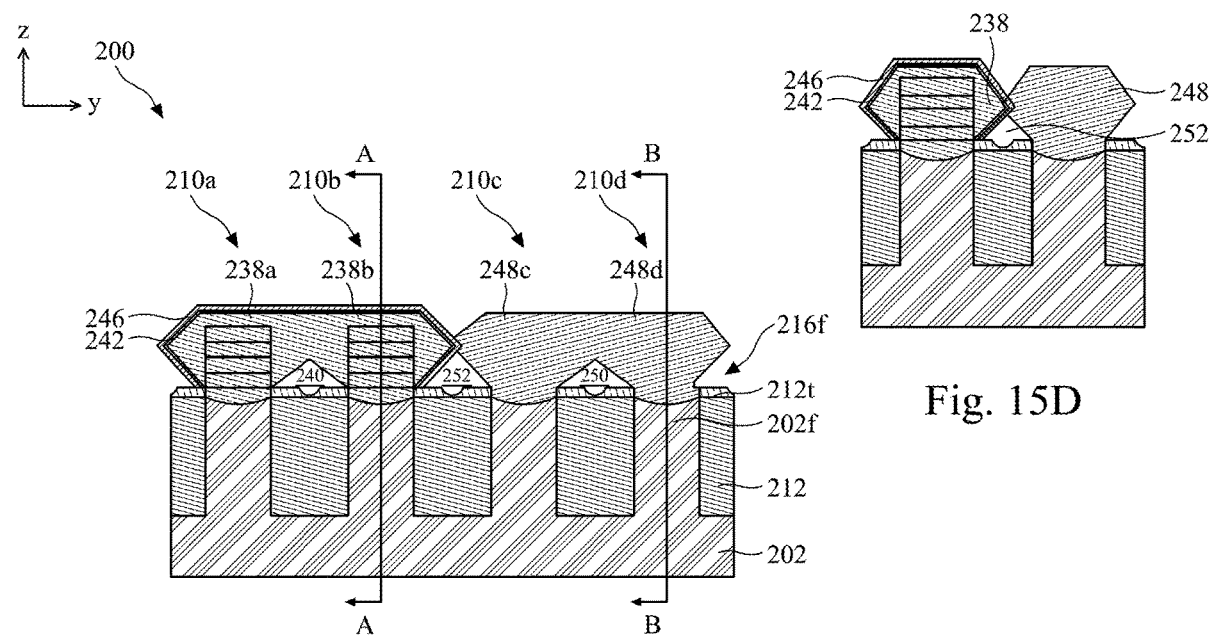

At operation 120, the epitaxial source/drain features 248 for the second type of devices are formed while the self-aligned mask layer 246 covering the epitaxial source/drain features 238 for the first type of devices, as shown in FIGS. 15A-15O. FIG. 15C is a sectional view of the semiconductor device 200 along the line B-B in FIG. 5. FIG. 15A is a sectional view of the semiconductor device 200 along the line A-A in FIG. 15C. FIG. 15B is a sectional view of the semiconductor device 200 along the line B-B in FIG. 15C. FIG. 15D is a partial sectional view of FIG. 15C in an alternative embodiment.

As shown in FIG. 13C, epitaxial source/drain features 248c, 248d for p-type devices are formed by epitaxial growth from exposed surfaces of the fin structures 210c, 210d. In some embodiments, a cleaning process is performed to the semiconductor device 200 prior to epitaxially growing the epitaxial source/drain features 248, for example to remove native oxide formed on the surfaces of the fin structures 210c, 210d. The cleaning process includes applying diluted hydrofluoric acid (HF) to the surfaces of the semiconductor device 200 for about several tens of seconds. In some embodiments, the cleaning process also includes plasma cleaning using a SiCoNi:$NF_3$/$NH_3$ plasma with an Ar/He/$H_2$ as carrier gas. The SiCoNi plasma cleaning may be performed in-situ in the chamber where the epitaxial deposition is performed.

After the cleaning process, the epitaxial source/drain features 248 may be formed by any suitable method, such as by CVD, CVD epitaxy, molecular beam epitaxy (MBE), or any suitable deposition technique. In some embodiments, the epitaxial source/drain features 248. The epitaxial source/drain features 248 for the p-type devices may include one or more layers of Si, SiGe, Ge with p-type dopants, such as boron (B), for a p-type device, such as pFET. In some embodiments, the epitaxial source/drain features 248 may be SiGe material including boron as dopant.

The self-aligned mask layer 246 acts as a protection layer for the epitaxial source/drain features 238 during cleaning process and epitaxial deposition at operation 120. The oxide material in the self-aligned mask layer 246 covers the epitaxial source/drain features 238 so that no additional epitaxy layer is grown on the epitaxial source/drain features 238. The self-aligned mask layer 246 also withstands the cleaning process prior to forming the epitaxial source/drain features 248. In some embodiments, the self-aligned mask layer 246 may incur some thickness loss during processes at operation 120.

In some embodiments, the epitaxial source/drain features 248 formed from neighboring fin structures 210 may be joined or connected at certain portions, as shown in FIG. 15C. Epitaxial source/drain features 248c, 248d, epitaxially grown from the neighboring fin structures 210c, 210d, are connected at upper portion. An air gap 250 is formed between lower facets of the epitaxial source/drain features 248c, 248d and the fin sidewall spacers 216f. In some embodiments, a portion of the isolation layer 212 may be also exposed to the air gap 250. In other embodiments, the epitaxial source/drain features 248 may be formed without bridging or connection with neighboring epitaxial source/drain features 248, as shown in the example of FIG. 15D.

In some embodiments, the epitaxial source/drain feature 248 for the p-type devices and the epitaxial source/drain feature 238 for the n-type devices formed from neighboring fin structure 210 may also bridge with each other with the self-aligned mask layer 246 and the epitaxial liner 242 disposed in between, as shown in FIGS. 15C and 15D. In some embodiments, an air gap 252 may form between the bridging epitaxial source/drain feature 248 and the epitaxial source/drain feature 238. The air gap 252 may be defined by the self-aligned mask layer 246, a lower facet of the epitaxial source/drain features 248, and the fin sidewall spacers 216f. In some embodiments, a portion of the isolation layer 212 may be also exposed to the air gap 252.

Figure 16A:
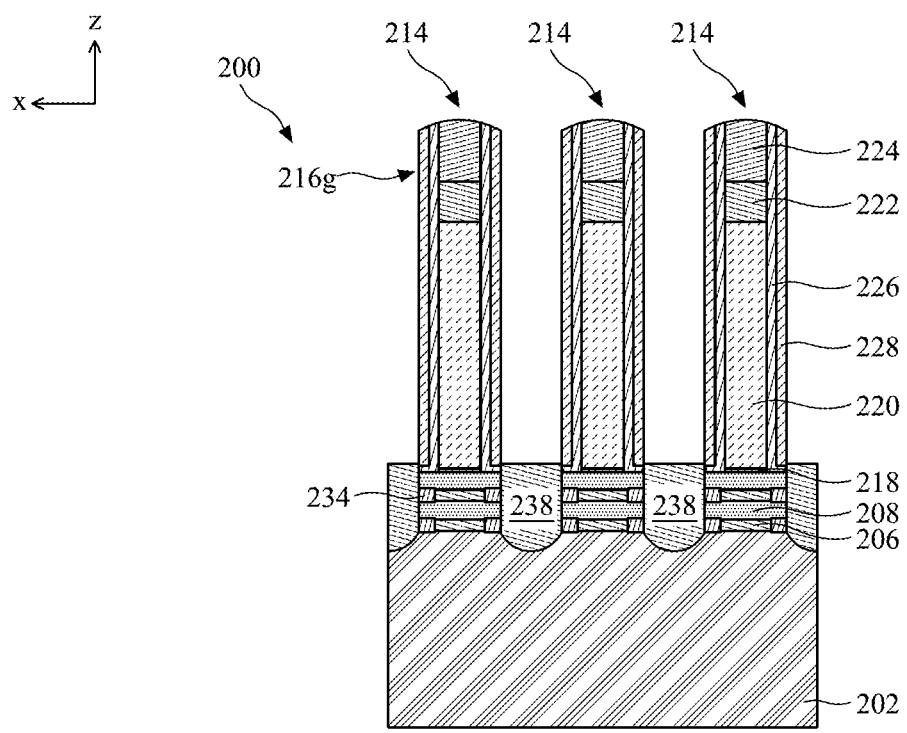
Figure 16B:
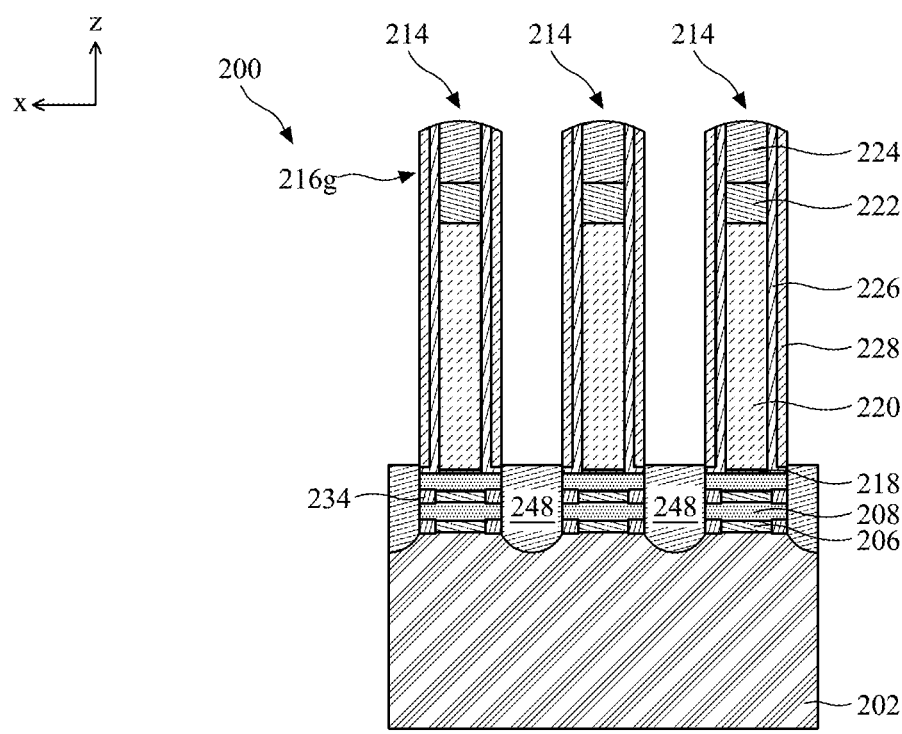
Figure 16C:
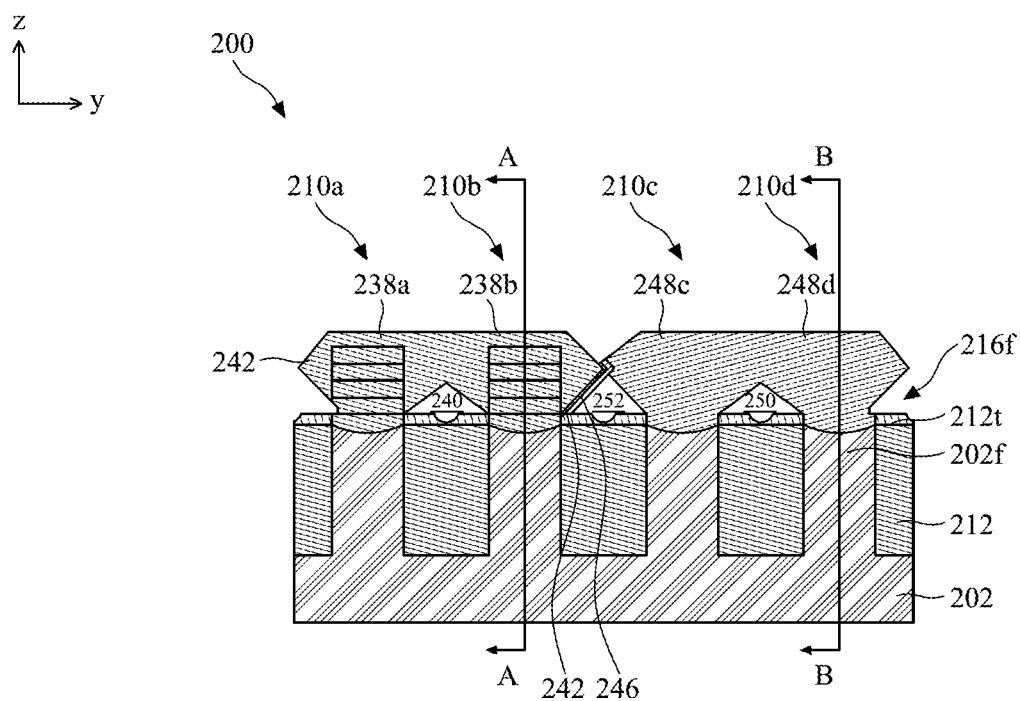
Figure 16D:
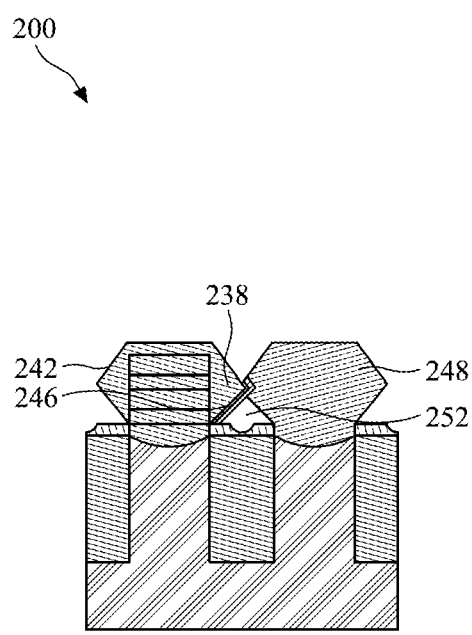
Figure 16E:
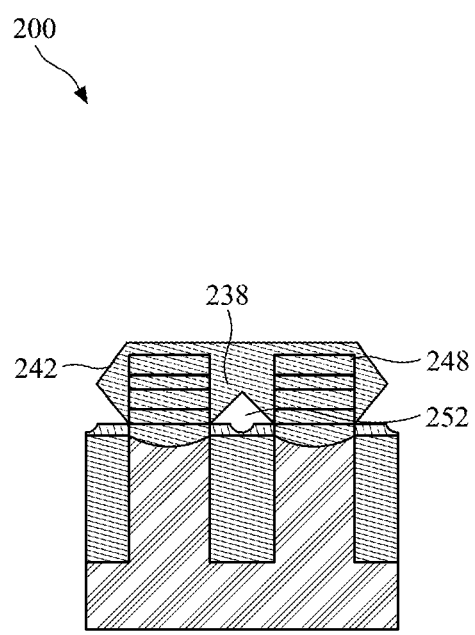

At operation 122, the self-aligned mask layer 246 is partially removed from the semiconductor device 200a, as shown in FIGS. 16A-E. FIG. 16C is a sectional view of the semiconductor device 200 along the line B-B in FIG. 5. FIG. 16A is a sectional view of the semiconductor device 200 along the line A-A in FIG. 16C. FIG. 16B is a sectional view of the semiconductor device 200 along the line B-B in FIG. 16C. FIG. 16D is a partial sectional view of FIG. 16C in an alternative embodiment. FIG. 16E is a partial sectional view of FIG. 16C in an alternative embodiment.

Remainder of the self-aligned mask layer 246 is removed exposing the epitaxial liner 242. In some embodiments, the self-aligned mask layer 246 may be removed using a halogen containing etchant. For example, a dry etching process using halogen etching gases, such as chlorine ($Cl_2$), sulfur hexafluoride ($SF_6$), or a combination. After removal of the self-aligned mask layer 246, a portion of the epitaxial liner 242 may remain on the epitaxial source/drain features 238 and is exposed. The epitaxial liner 242 is omitted in subsequent figures for simplicity.

As shown in FIGS. 16C and 16D, a portion of the self-aligned mask layer 246 may remain on the epitaxial source/drain features 238 after operation 122 within the air gap 252 which is formed between bridging epitaxial source/drain feature 238 and epitaxial source/drain feature 248. FIG. 16E illustrates that the self-aligned mask layer 246 is removed from the epitaxial source/drain features 238 that are not bridging the epitaxial source/drain feature 248.

Figure 17A:
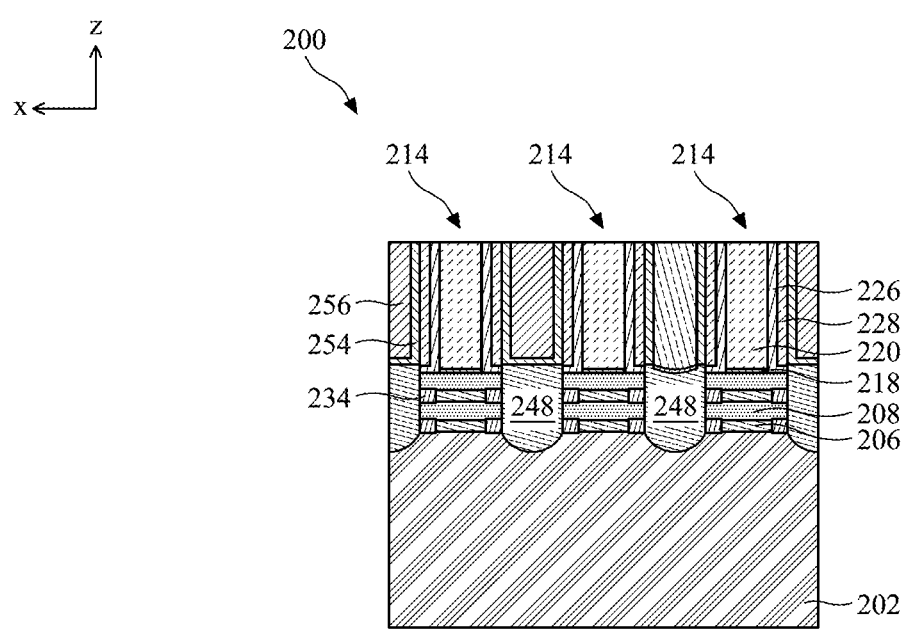
Figure 17B:
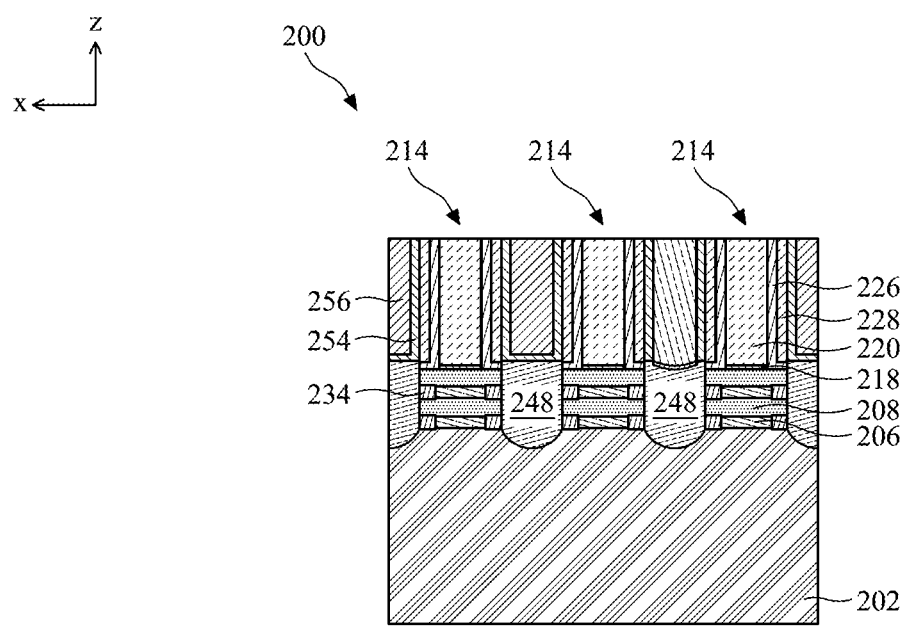
Figure 17C:
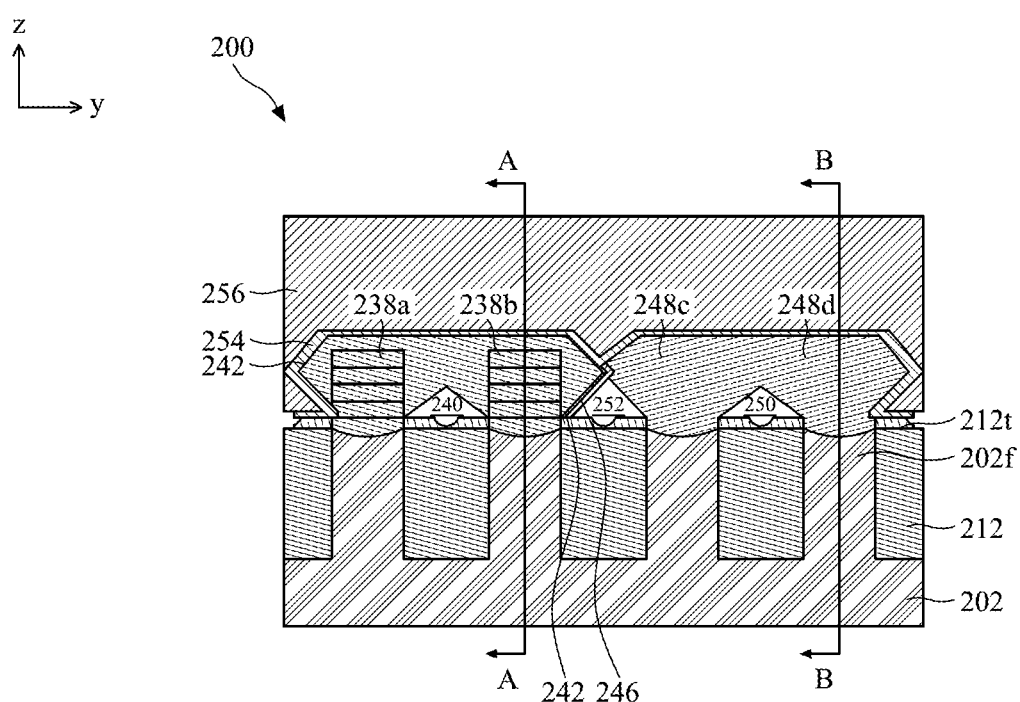

At operation 124, a contact etch stop layer (CESL) 254 and an interlayer dielectric (ILD) layer 256 are formed over the semiconductor device 200, as shown in FIGS. 17A-C. FIG. 17C is a sectional view of the semiconductor device 200 along the line B-B in FIG. 5. FIG. 17A is a sectional view of the semiconductor device 200 along the line A-A in FIG. 17C. FIG. 17B is a sectional view of the semiconductor device 200 along the line B-B in FIG. 17C. The CESL 254 is formed conformally over exposed surfaces of the semiconductor device 200. The CESL 254 is formed on the epitaxial source/drain features 248, the epitaxial liner 242, the gate sidewall spacers 216g, and the fin sidewall spacers 216f and the isolation layer 212 if exposed. The CESL 254 may include $Si_3N_4$, SiON, SiCN or any other suitable material, and may be formed by CVD, PVD, or ALD. As shown in FIG. 17C, the epitaxial liner 242 is between the CESL 254 and the epitaxial source/drain features 238.

The ILD layer 256 is formed over the CESL 254. The materials for the ILD layer 256 include compounds comprising Si, O, C, and/or H, such as silicon oxide, SiCOH and SiOC. Organic materials, such as polymers, may be used for the ILD layer 256. In some embodiments, the ILD layer 256 may be formed by flowable CVD (FCV). The CESL 254 and the ILD layer 256 protect the epitaxial source/drain features 238, 248 during the removal of the sacrificial gate structures 214. After deposition of the ILD layer 256, a planarization process, such as a CMP process, may be performed to expose the sacrificial gate structures 214 for the replacement gate process.

Figure 18A:
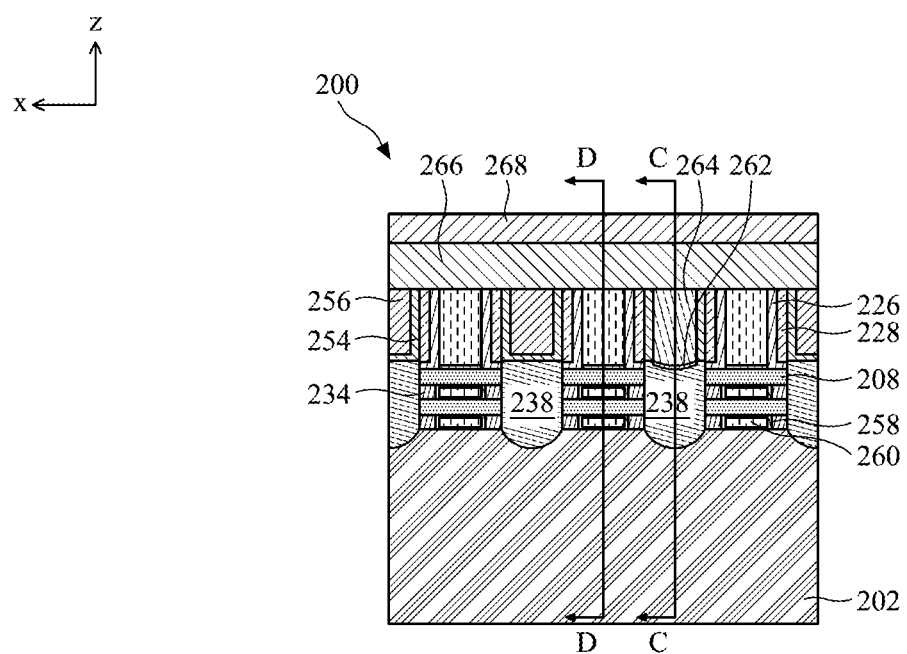
Figure 18B:
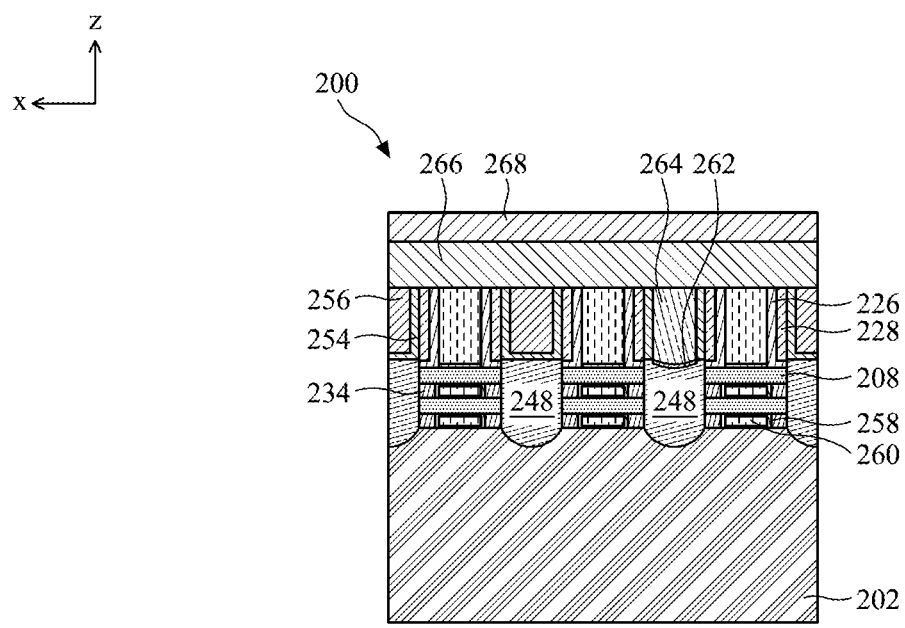
Figure 18C:
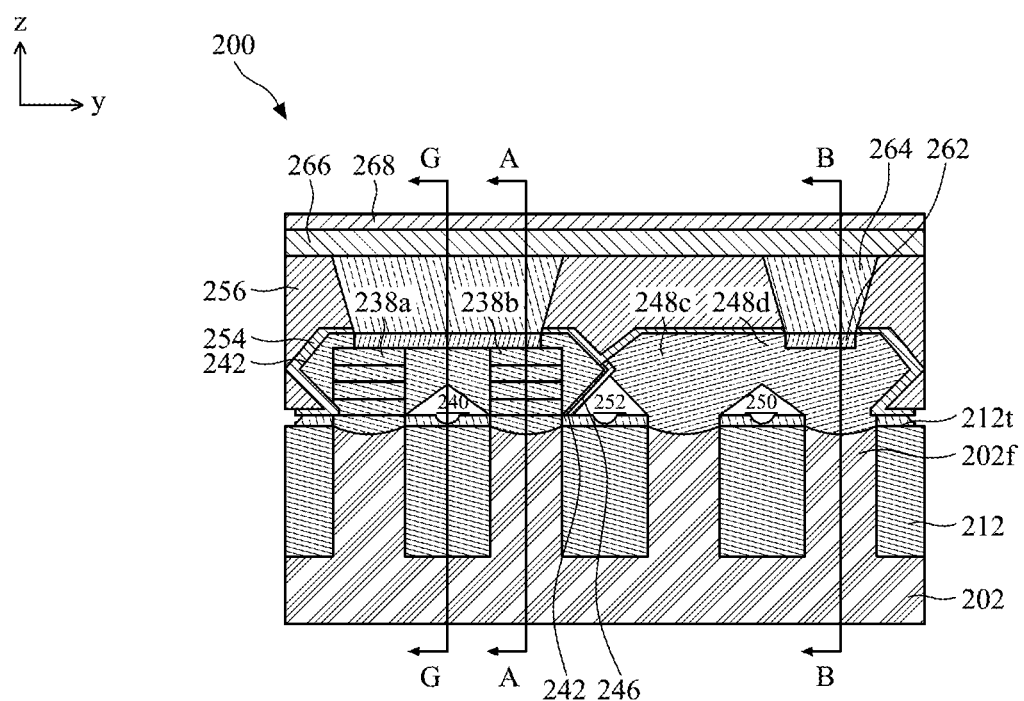
Figure 18E:
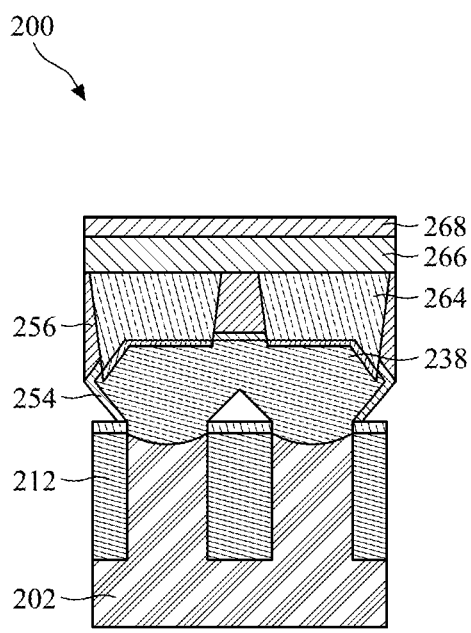
Figure 18F:
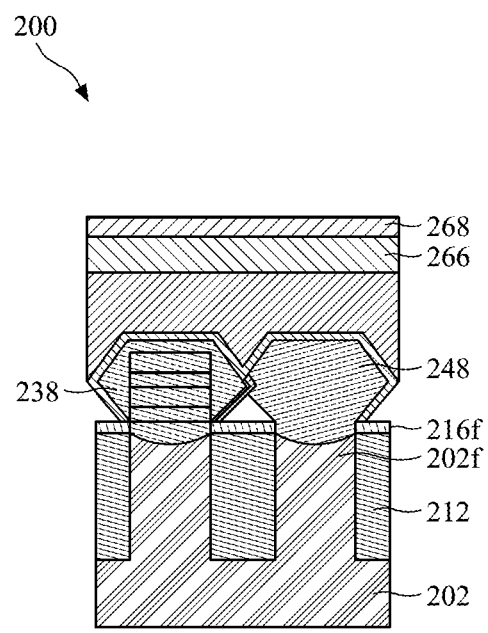
Figure 18D:
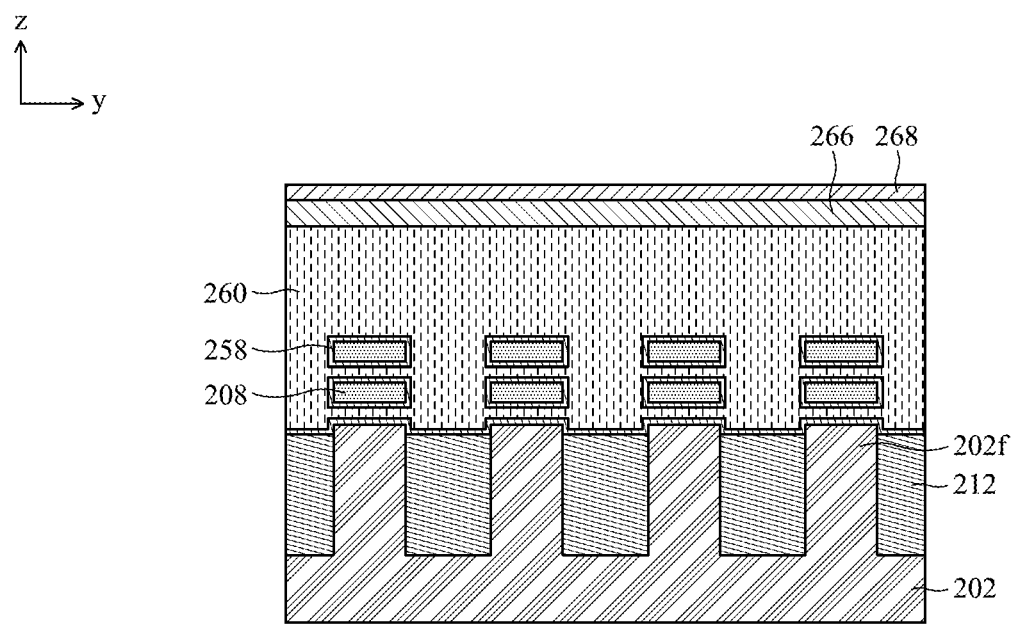
Figure 18G:
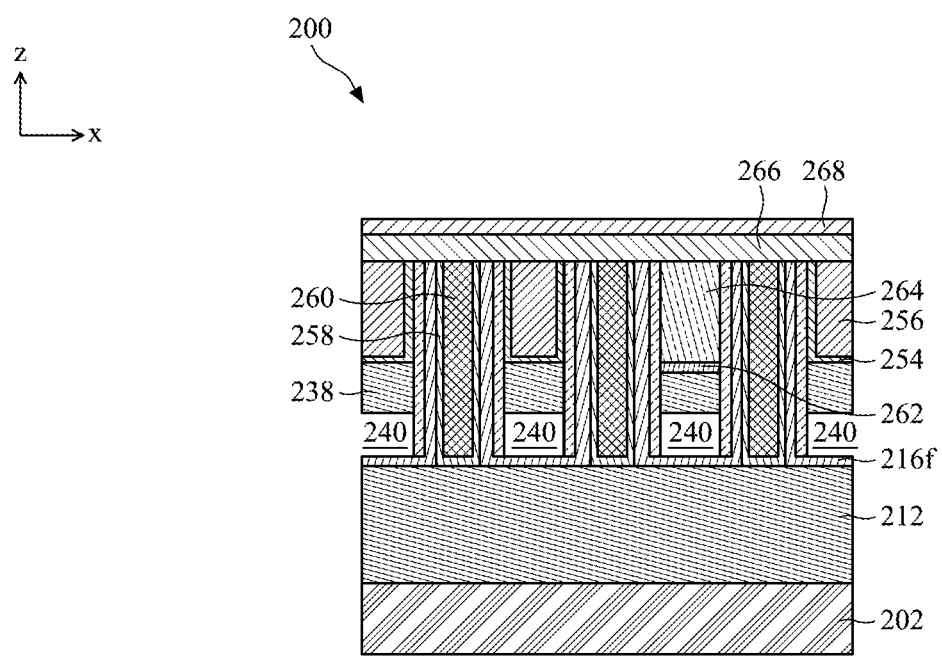

At operation 126, the sacrificial gate structures 214 are removed, a gate dielectric layer 258, a gate electrode layer 260, and source/drain contact features 264 are formed, as shown in FIGS. 18A-18G. FIG. 18A is a sectional view of the semiconductor device 200 along the line A-A in FIG. 18C. FIG. 18B is a sectional view of the semiconductor device 200 along the line B-B in FIG. 18C. FIG. 18C is a sectional view of the semiconductor device 200 along line C-C in FIG. 18A. FIG. 18D is a sectional view of the semiconductor device 200 along the line D-D in FIG. 18A. FIGS. 18E and 18F are partial views of the sectional view of FIG. 18C in alternative arrangements. FIG. 18G is a sectional view of the semiconductor device 200 along the line G-G in FIG. 18C.

The sacrificial gate dielectric layer 218 and the sacrificial gate electrode layer 220 are removed using dry etching, wet etching, or a combination. The semiconductor spacing layers 206 are exposed and subsequently removed resulting in gate cavities surrounding nanosheets of the semiconductor channel layers 208. Replacement gate structures, which may include the gate dielectric layer 258 and a gate electrode layer 260, are then filled in the gate cavities.

The gate dielectric layer 258 is formed on exposed surfaces in the gate cavities. The gate dielectric layer 258 may have different composition and dimensions for N-type devices and P-type devices and are formed separately using patterned mask layers and different deposition recipes. The gate dielectric layer 258 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 258 may be formed by CVD, ALD or any suitable method.

The gate electrode layer 260 is formed on the gate dielectric layer 258 to fill the gate cavities. The gate electrode layer 260 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 260 may be formed by CVD, ALD, electro-plating, or other suitable method.

After the formation of the gate electrode layer 260, a planarization process, such as a CMP process, is performed to remove excess deposition of the gate electrode material and expose the top surface of the ILD layer 256. The source/drain contact features 264 are formed in the ILD layer 256.

Contact holes may be formed through the ILD layer 256, the CESL 254, and the epitaxial liner 242 if present, to expose the epitaxial source/drain features 238, 248, and subsequently filled with a conductive material. Suitable photolithographic and etching techniques are used to form the contact holes through various layers. After the formation of the contact holes, a silicide layer 262 is selectively formed over surfaces of the epitaxial source/drain features 238, 248 exposed by the contact holes. The silicide layer 262 may be formed by depositing a metal source layer to cover exposed surfaces including the exposed surfaces of the epitaxial source/drain features 238, 248 and the epitaxial liner 242 (if present) and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed. During the rapid anneal process, the portion of the metal source layer over the epitaxial source/drain features 238, 248 and the epitaxial liner 242 (if present), reacts with silicon in the epitaxial source/drain features 238, 248 and the epitaxial liner 242 (if present) to form the silicide layer 262. Unreacted portion of the metal source layer is then removed. In some embodiments, the silicide layer 264 includes one or more of WSi, CoSi, NiSi, TiSi, MoSi, and TaSi.

After formation of the silicide layer 262, a conductive material is deposited to fill contact holes and form the source/drain contact features 264. Optionally, a barrier layer, not shown, may be formed in the contact holes prior to forming the source/drain contact features 264. In some embodiments, the conductive material layer for the gate contact may be formed by CVD, PVD, plating, ALD, or other suitable technique. In some embodiments, the conductive material for the source/drain contact features 264 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 256.

The source/drain contact features 264 may have various configurations. For example, two or more bridging epitaxial source/drain features 238 may share one source/drain contact features 264, as shown in FIG. 18C. Similarly, two or more bridging epitaxial source/drain features 248 may also share one source/drain contact features 264. One source/drain contact feature 264 may be aligned with one epitaxial source/drain features 238 or 248, as shown in FIG. 18C and FIG. 18E. In some embodiments, the epitaxial source/drain features 238, 248 may be "floating", i.e., not connected to any source/drain contact features, as shown in FIG. 18F.

At operation 128, a front side interconnect structure 266 is formed over on the ILD layer 256 as shown in FIGS. 18A-18F. The front side interconnect structure 266 may include multiple dielectric layers having metal lines and vias (not shown) formed therein. The conductive lines and vias in the front side interconnect structure 266 may be formed of metals, such as copper, and may be formed using one or more damascene processes. The front side interconnect structure 266 may include multiple sets of inter-layer dielectric (ILD) layers and inter-metal dielectrics (IMDs) layers.

After the formation of the front side interconnect structure 266, a carrier wafer 268 is temporarily bonded to a top side of the front side interconnect structure 266. The carrier wafer 268 serves to provide mechanical support for the front side interconnect structure 266 and devices formed on the substrate 202.

After the carrier wafer 268 is bond to the substrate 202, the carrier wafer 268 along with the substrate 202 is flipped over so that the backside of the substrate 202 is facing up for backside processing.

Figure 19A:
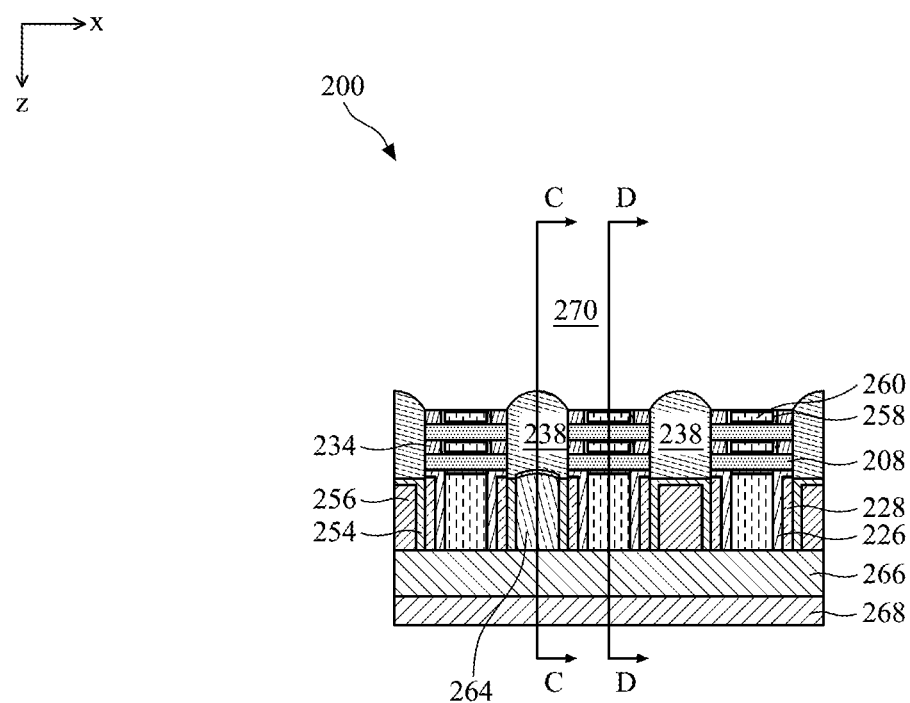
Figure 19B:
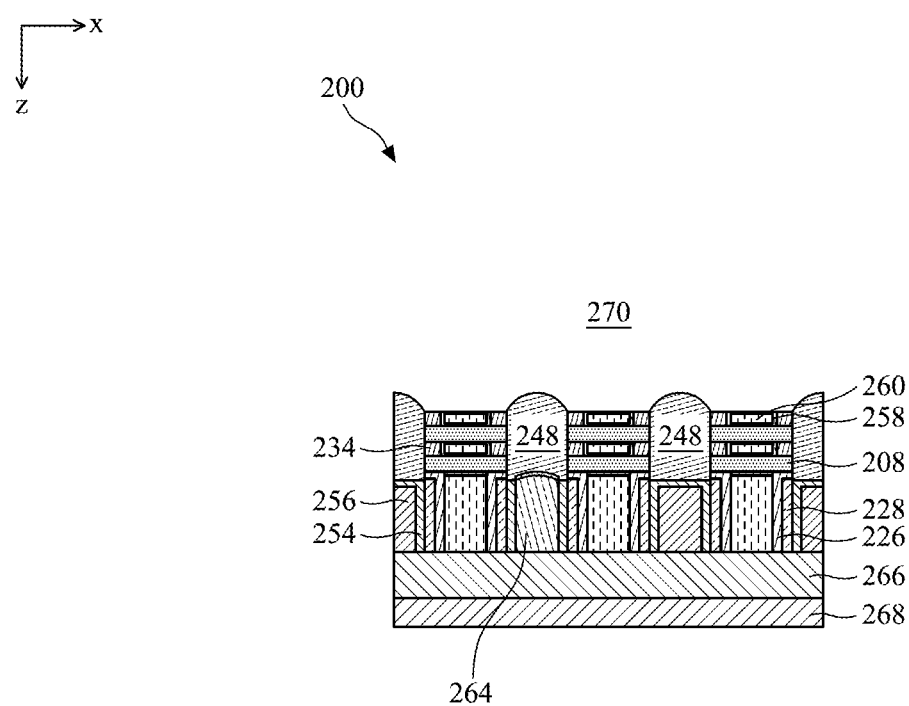
Figure 19C:
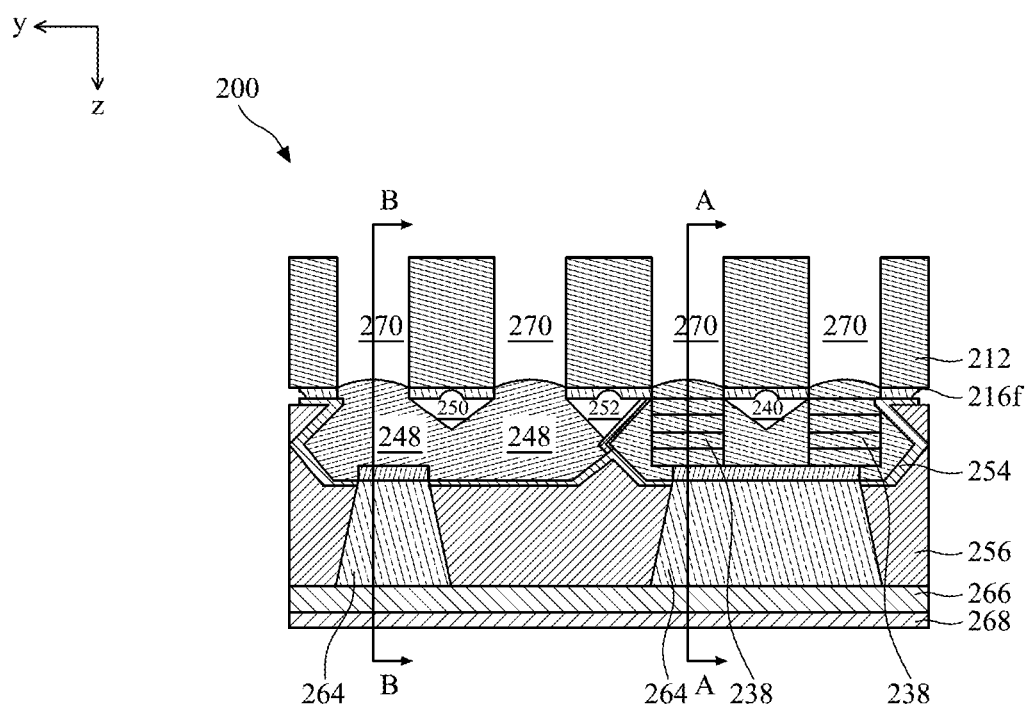
Figure 19D:
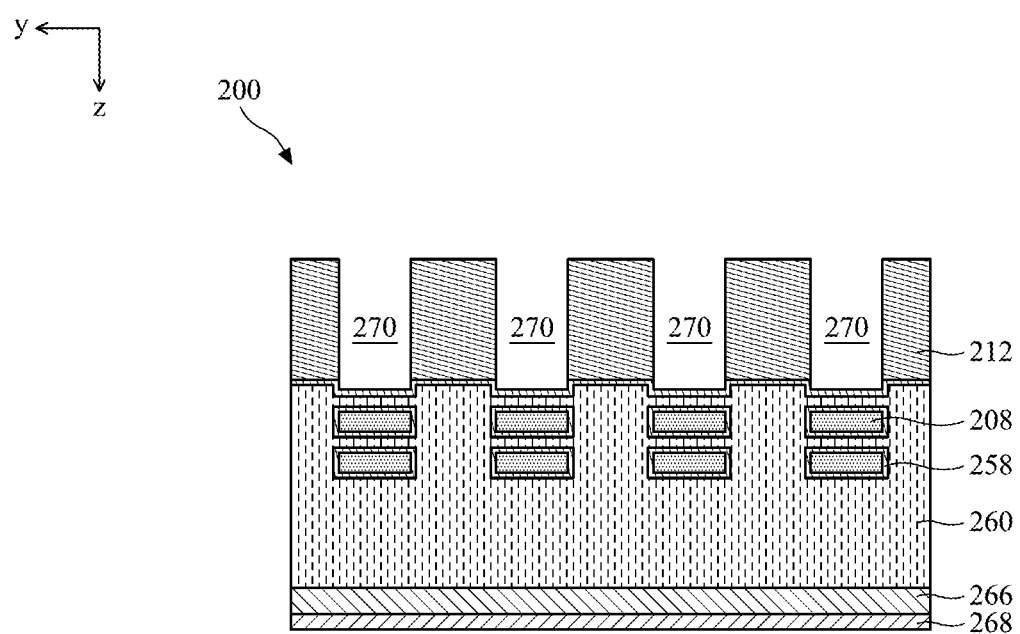
Figure 19E:
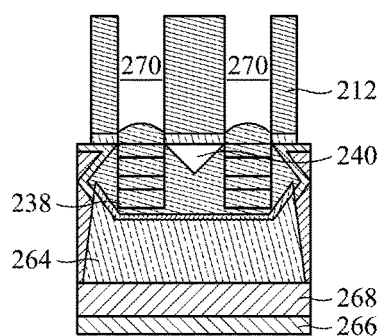
Figure 19F:
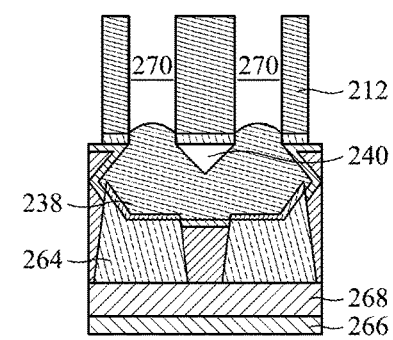
Figure 19G:
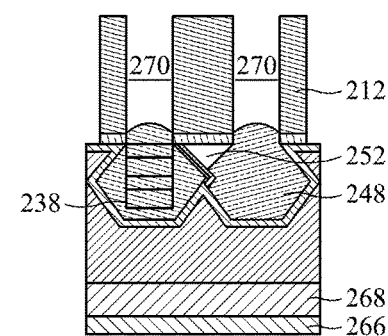

At operation 130, after flipping over, semiconductor material of the substrate 202 is removed, as shown in FIGS. 19A-19G. FIG. 19A is a sectional view of the semiconductor device 200 along the line A-A in FIG. 19C. FIG. 19B is a sectional view of the semiconductor device 200 along the line B-B in FIG. 19C. FIG. 19C is a sectional view of the semiconductor device 200 along the line C-C in FIG. 19A. FIG. 19D is a sectional view of the semiconductor device 200 along the line D-D in FIG. 19A. FIGS. 19E-19G are partial views of the sectional view of FIG. 19C in alternative arrangements.

A backside grinding may be performed on the substrate 202 to expose the isolation layer 212. A suitable etch process is then performed to selectively remove the well portions 202f of the fin structures 210. In some embodiments, the well portions 202f may be selectively etched using a dry etching method or a wet etching using tetramethylammonium hydroxide (TMAH) or a wet etching using an etchant including ammonium hydroxide ($NH_4OH$).

After the etching process, the epitaxial source/drain features 238, 248, the gate dielectric layer 258, and the inner spacers 234 are exposed, as shown in FIGS. 19A-19D. After removal of the well portions 202f, fin cavities 270 are formed between the isolation layers 212. The epitaxial source/drain features 238, 248 are exposed at a bottom of each fin cavity 270. The epitaxial source/drain features 238 or 248, the inner spacers 234, and the gate dielectric layer 258 define a bottom surface of the fin cavity 270, as shown in FIGS. 19A and 19B. The isolation layer 212 defines sidewalls of each fin cavity 270 as shown in FIG. 19C. The gate dielectric layer 258 may define a portion of the fin cavities 270, as shown in FIG. 19D. FIGS. 19E-19G schematically demonstrate portions of the semiconductor device 200 with the epitaxial source/drain features 238, 248 and source/drain contact features 264 in various configurations.

Figure 20A:
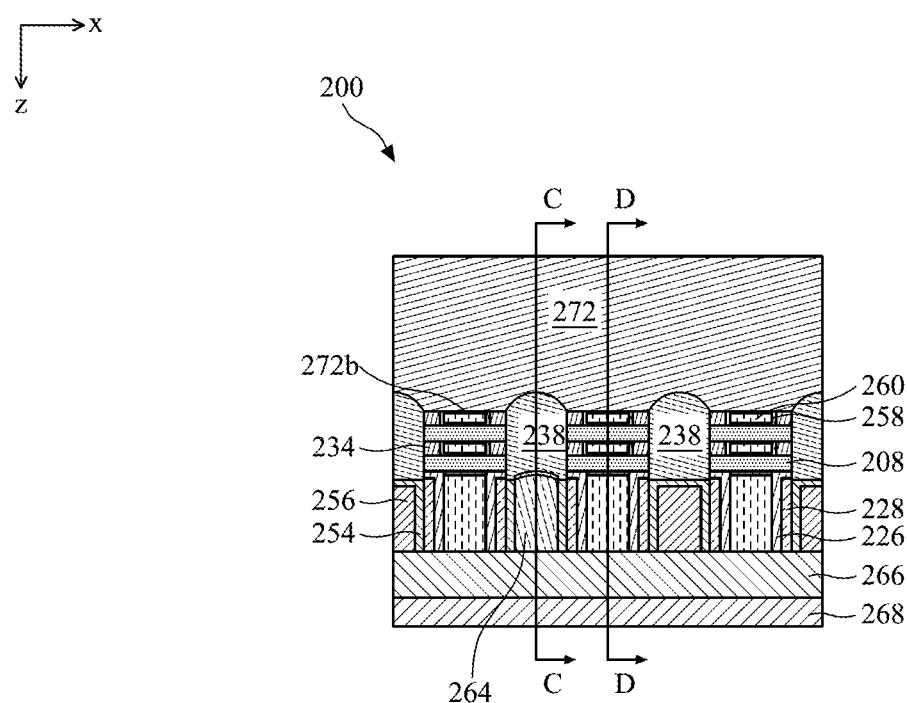
Figure 20B:
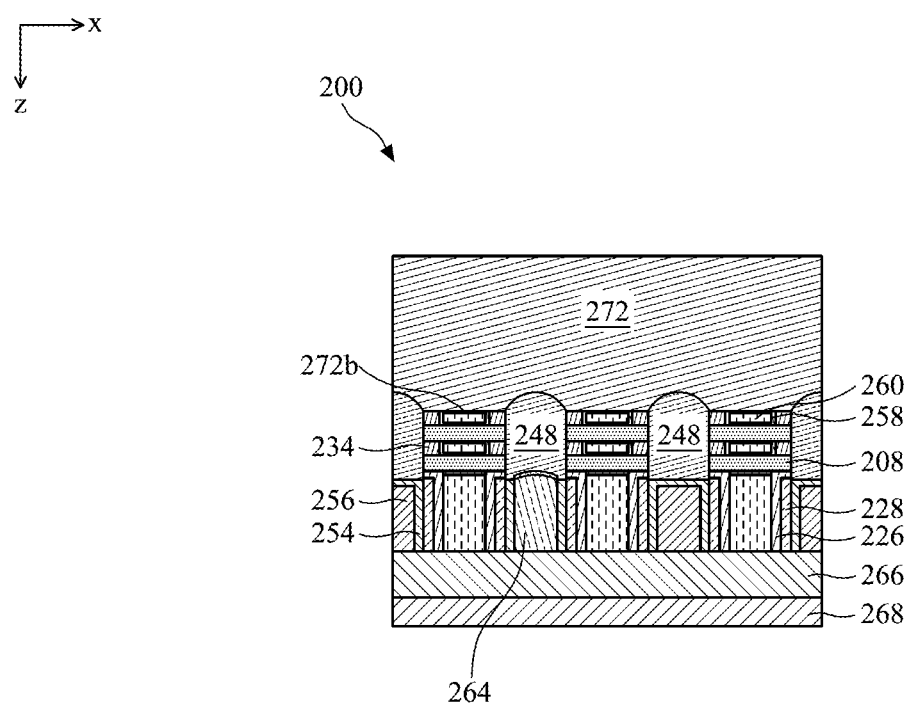
Figure 20C:
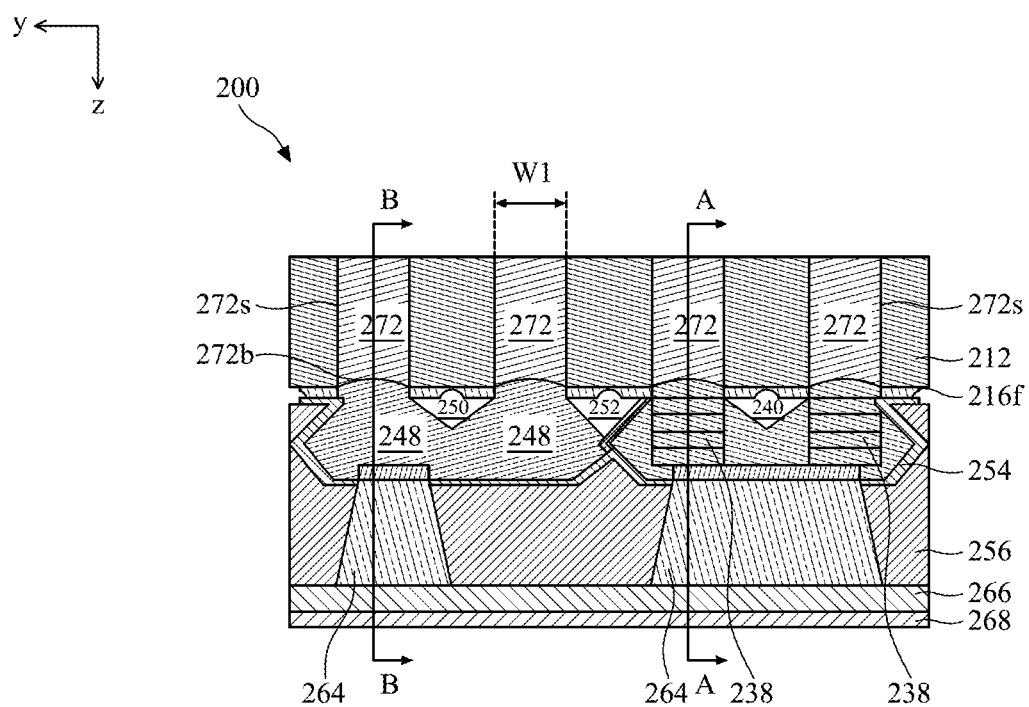
Figure 20D:
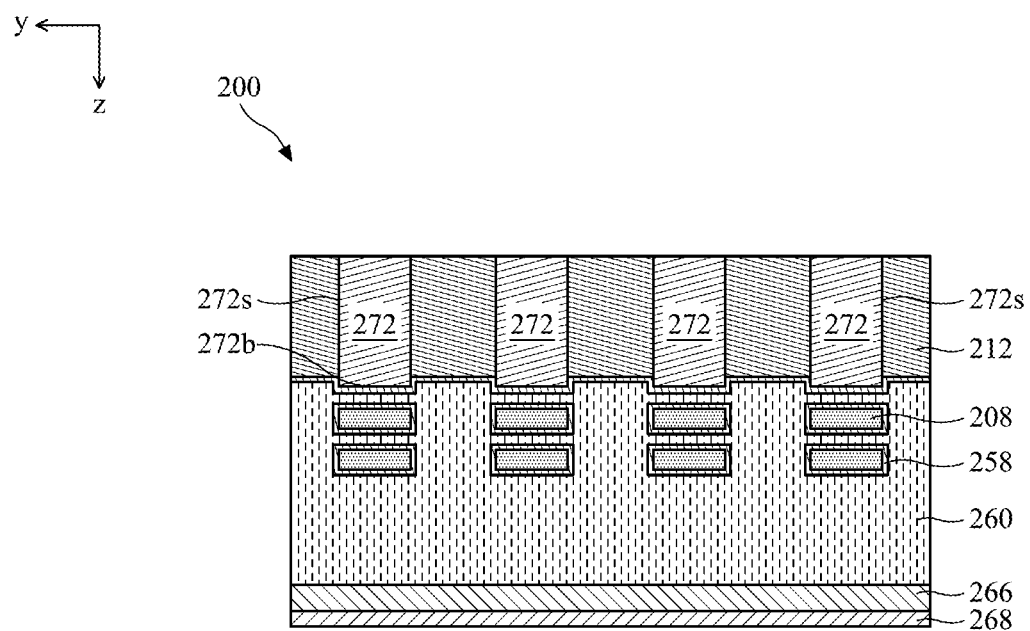
Figure 20E:
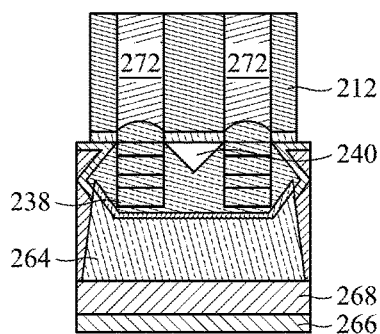
Figure 20F:
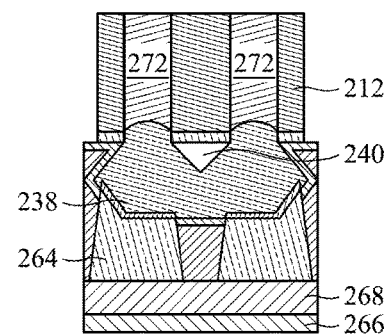
Figure 20G:
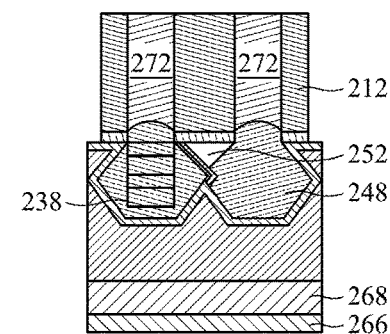

At operation 132, dielectric fins 272 are formed in the fin cavities 270, as shown in FIGS. 20A-20G. FIG. 20A is a sectional view of the semiconductor device 200 along the line A-A in FIG. 20C. FIG. 20B is a sectional view of the semiconductor device 200 along the line B-B in FIG. 20C. FIG. 20C is a sectional view of the semiconductor device 200 along the line C-C in FIG. 20A. FIG. 20D is a sectional view of the semiconductor device 200 along the line D-D in FIG. 20A. FIGS. 20E-20G are partial views of the sectional view of FIG. 20C in alternative arrangements.

The dielectric fins 272 are formed by filling a dielectric material in the fin cavities 270. Width W1 of the dielectric fins 272 along the Y-axis is substantially the same to width of the fin structure 210. In some embodiments, the dielectric fins 272 may be formed from a dielectric material having an etch selectivity relative to the isolation layer 212. In some embodiments, the dielectric fins 272 include silicon and nitrogen containing material, such as SiN, SiONC, SiCN, and other dielectric materials. After the formation of the dielectric fins 272, a planarization process, such as CMP, is performed to expose the isolation layer 212.

The dielectric fins 272 are formed on each of the epitaxial source/drain features 238, 248. The epitaxial source/drain features 238 or 248, the inner dielectric fins 272 234, and the gate dielectric layer 258 are in contact with a bottom surface 272b of the dielectric fins 272, as shown in FIGS. 20A and 20B. The isolation layer 212 contacts sidewalls 272s of each dielectric fin 272, as shown in FIG. 20C. The gate dielectric layer 258 may also contact a portion of the sidewall 272s of the dielectric fins 272, as shown in FIG. 20D.

Figure 21A:
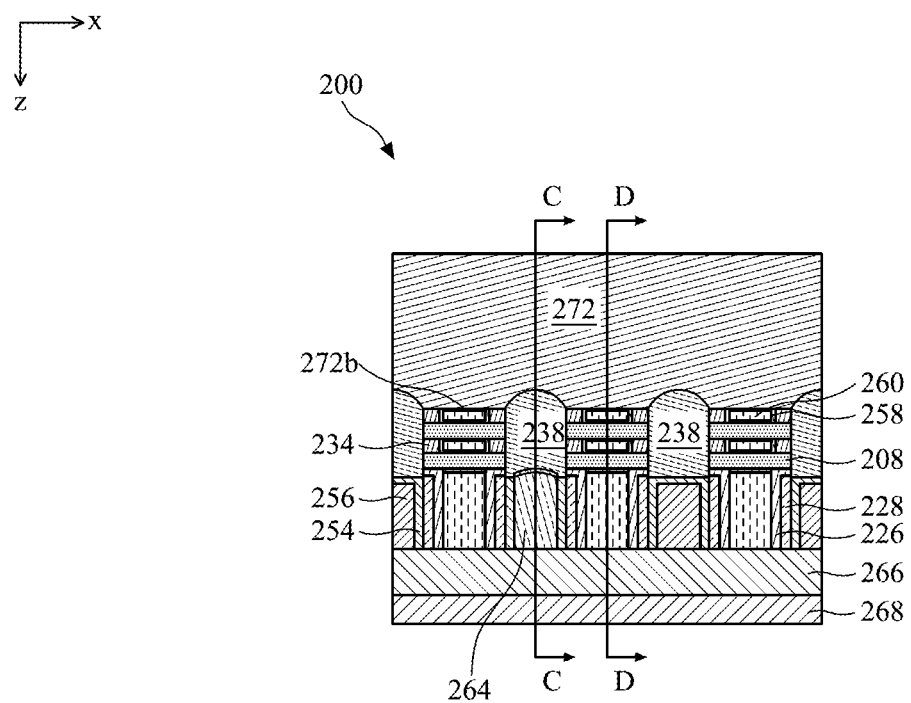
Figure 21B:
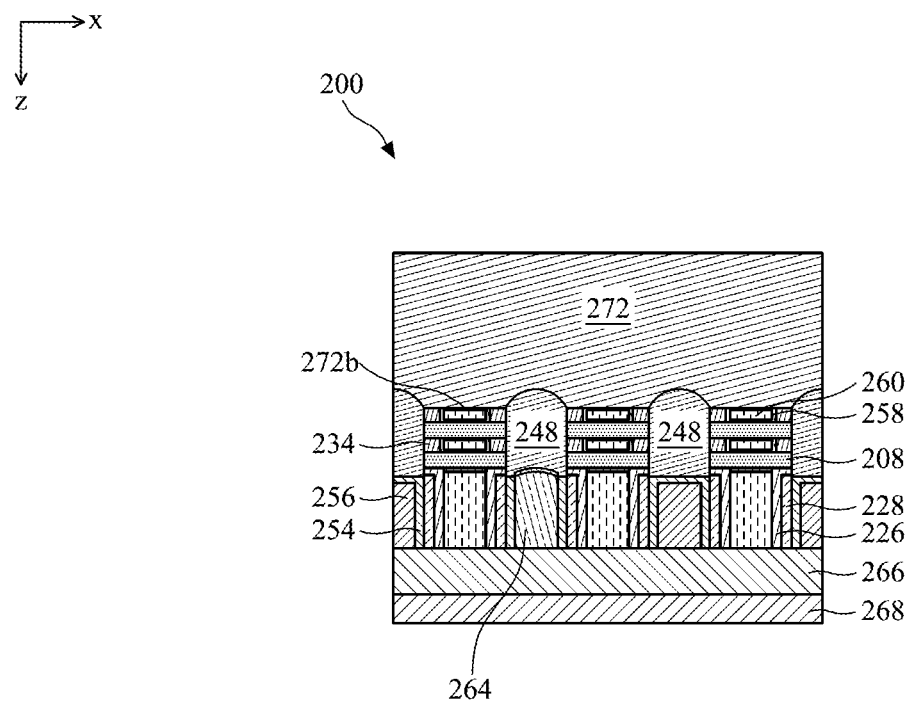
Figure 21C:
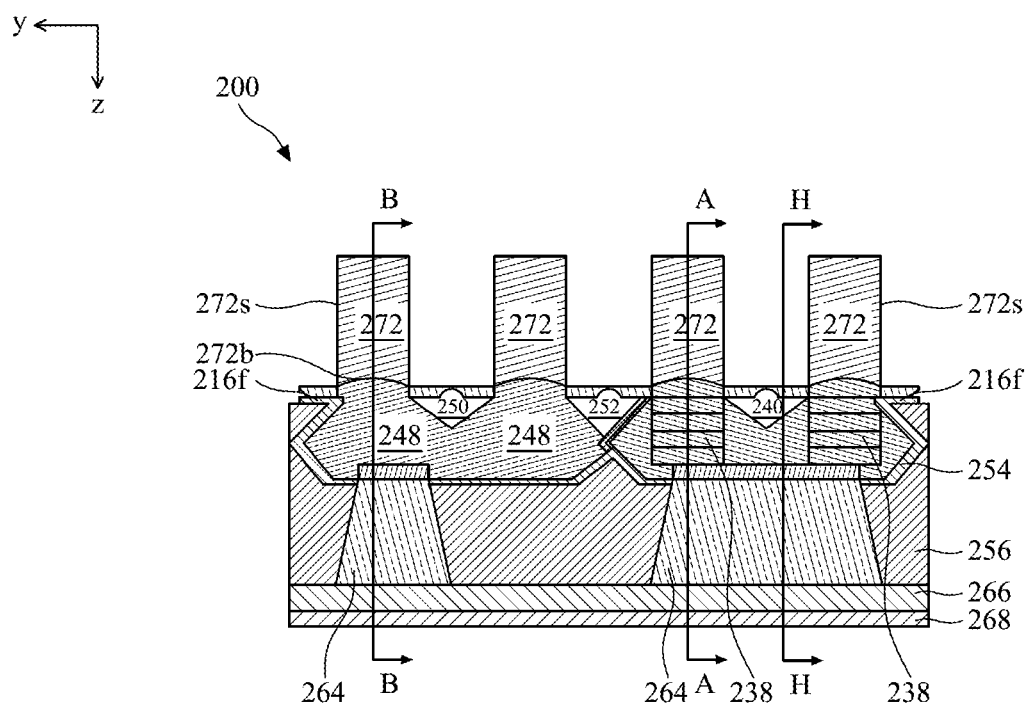
Figure 21D:
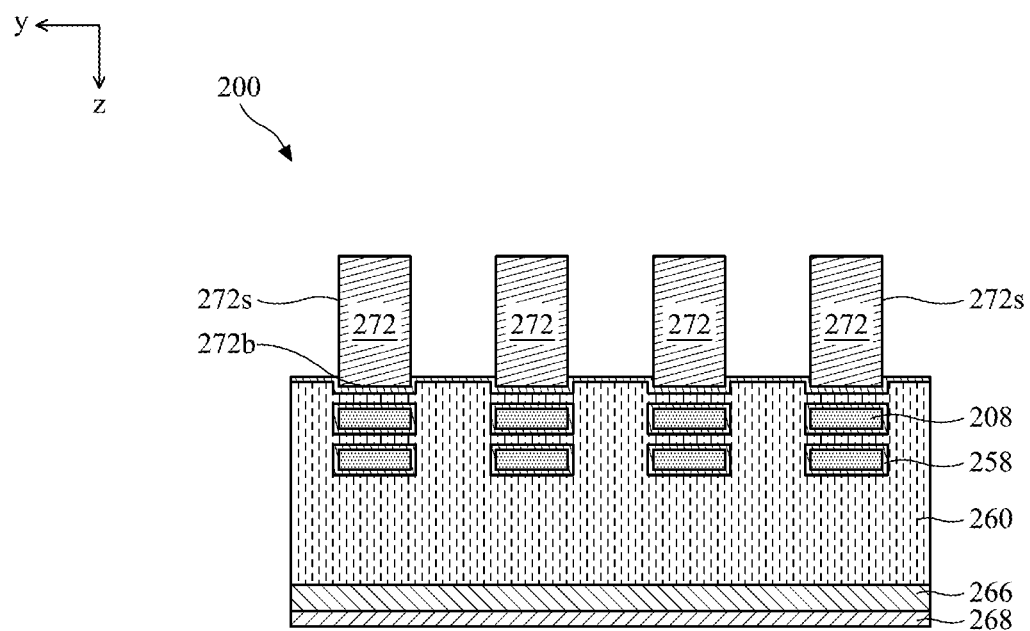
Figure 21E:
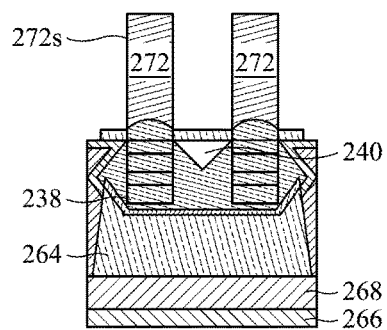
Figure 21F:
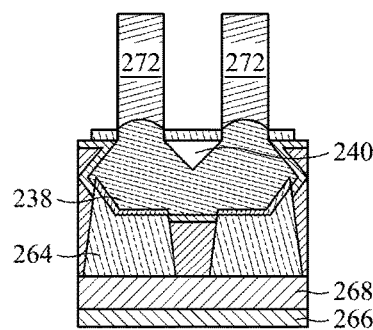
Figure 21G:
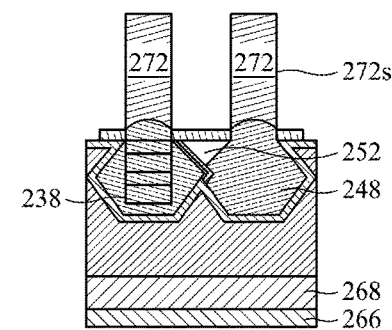
Figure 21H:
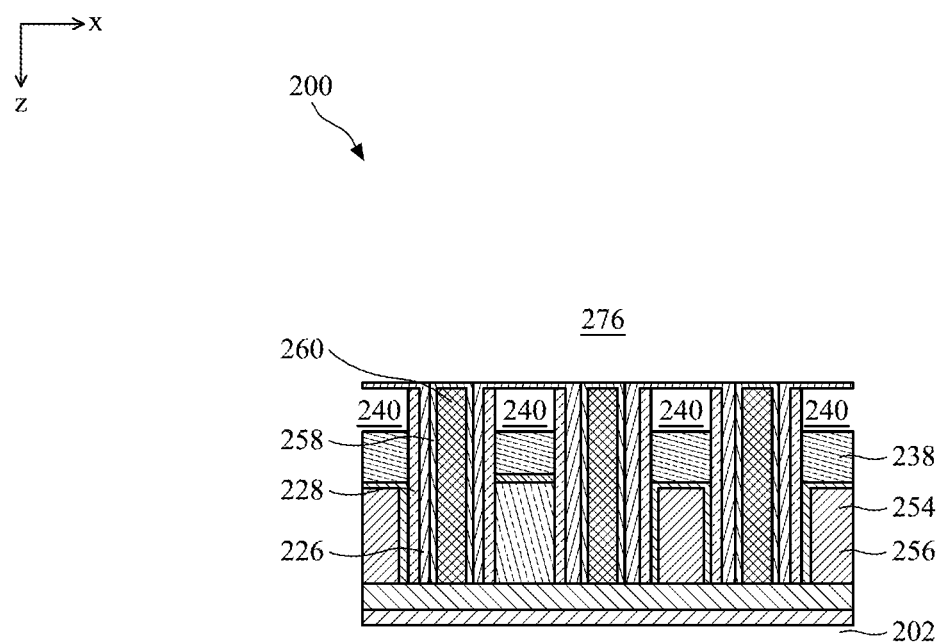

At operation 134, the isolation layer 212 is selectively removed, as shown in FIGS. 21A-21H. FIG. 21A is a sectional view of the semiconductor device 200 along the line A-A in FIG. 21C. FIG. 21B is a sectional view of the semiconductor device 200 along the line B-B in FIG. 21C. FIG. 21C is a sectional view of the semiconductor device 200 along the line C-C in FIG. 21A. FIG. 21D is a sectional view of the semiconductor device 200 along the line D-D in FIG. 21A. FIGS. 21E-21G are partial views of the sectional view of FIG. 21C in alternative arrangements. FIG. 21H is a sectional view of the semiconductor device 200 along the line H-H in FIG. 21C.

The isolation layer 212 may be selectively removed from by a suitable etching process. After removal of the isolation layer 212, the sidewalls 272s of the dielectric fins 272 are exposed. As shown in FIG. 21C, the fin sidewall spacers 216f are also exposed after removal of the isolation layer 212. In some embodiments, the air gaps 250, 252, 240 may also be exposed in situations where neighboring fin sidewall spacers 216f are not connected. The gate dielectric layer 258 is also exposed after removal of the isolation layer 212, as shown in FIG. 21D.

Figure 22A:
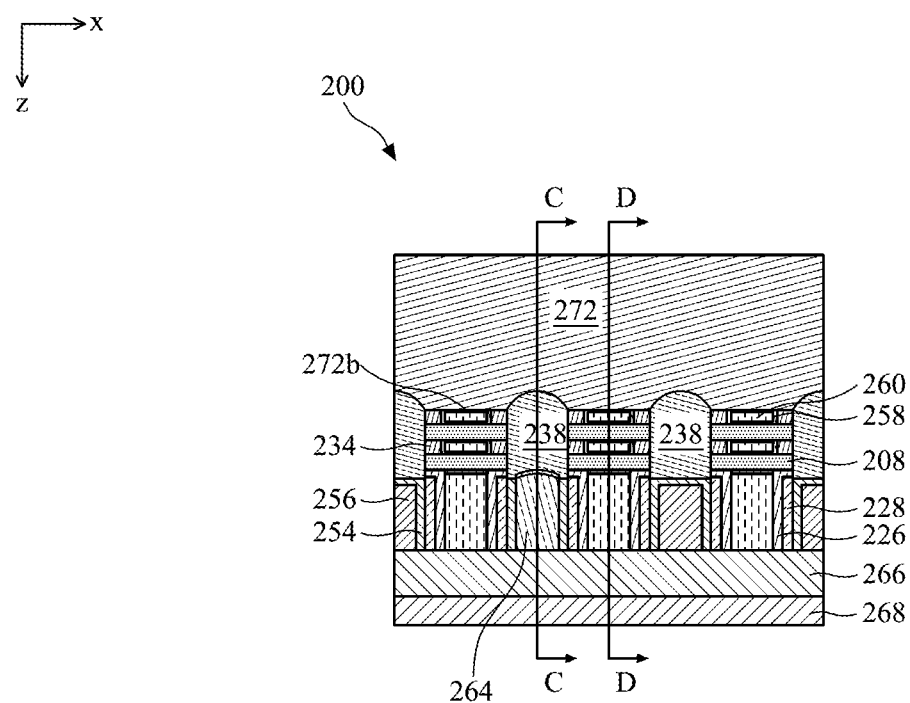
Figure 22B:
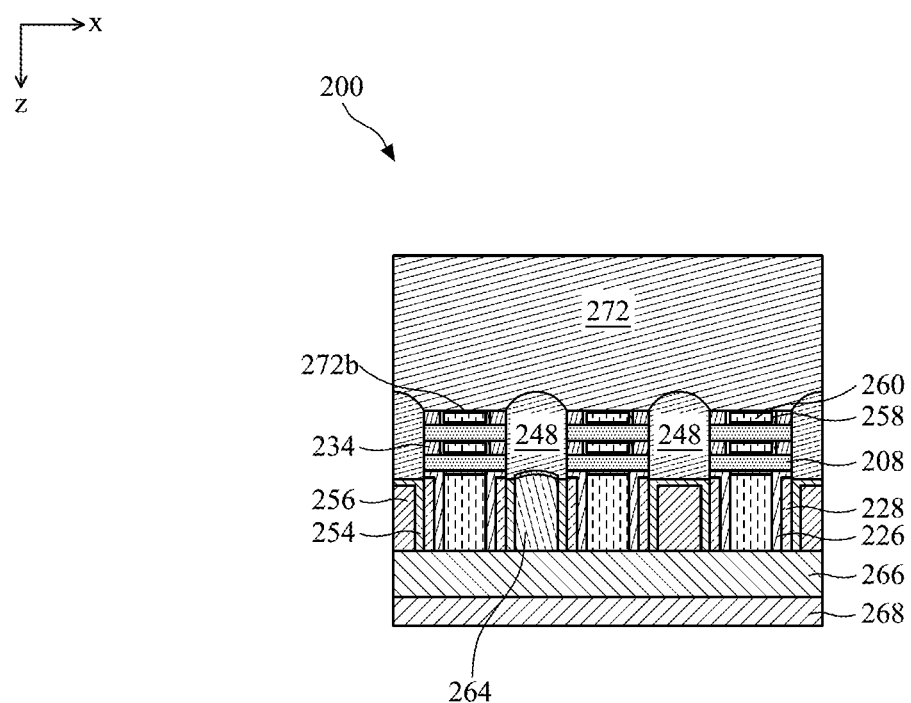
Figure 22C:
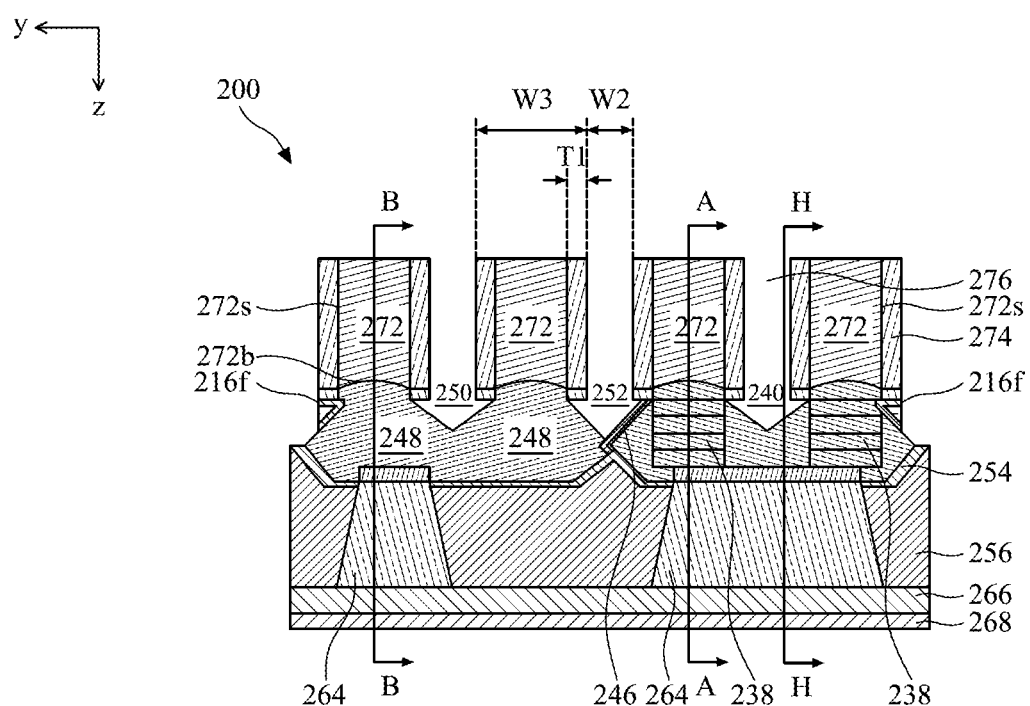
Figure 22D:
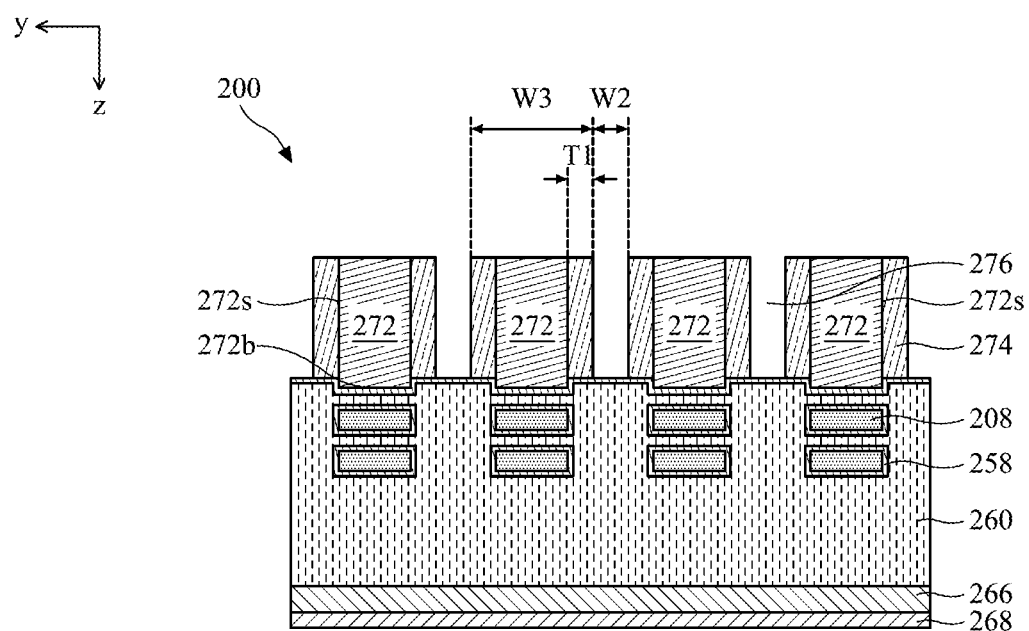
Figure 22E:
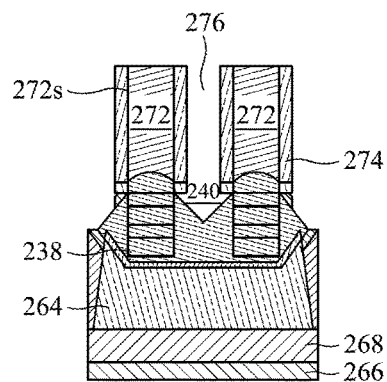
Figure 22F:
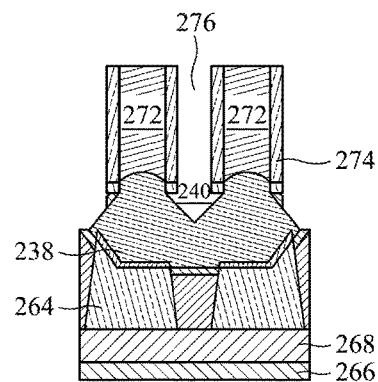
Figure 22G:
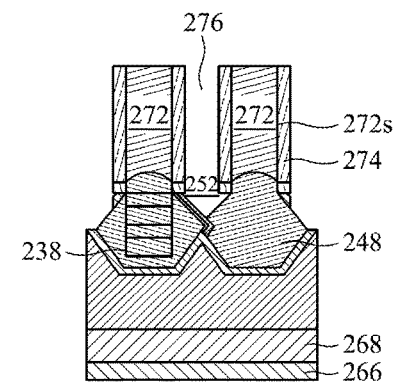
Figure 22H:
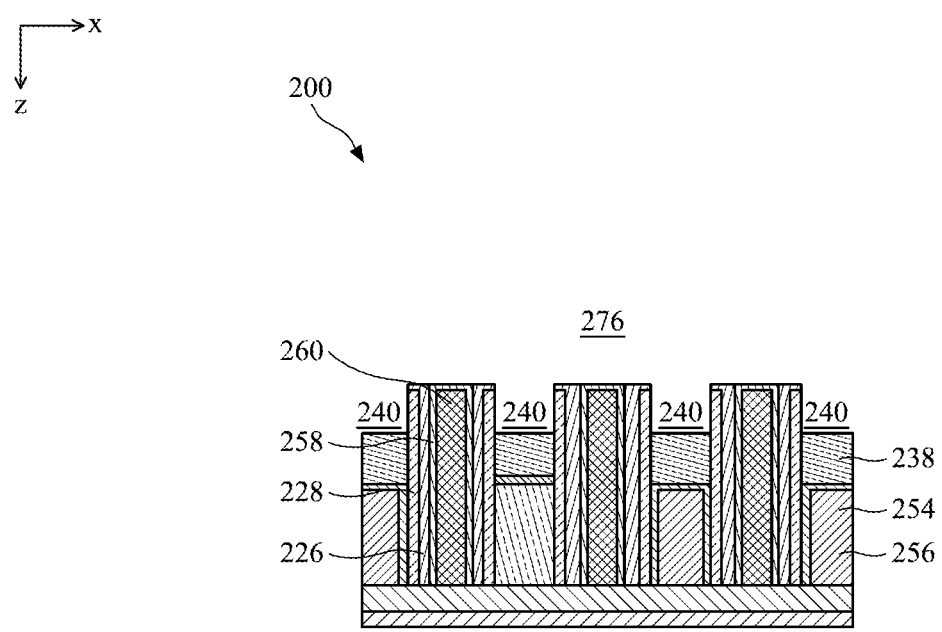

At operation 136, backside fin sidewall spacers 274 are formed on the sidewalls 272s of the dielectric fins 272, as shown in FIGS. 22A-22H. FIG. 22A is a sectional view of the semiconductor device 200 along the line A-A in FIG. 22C. FIG. 22B is a sectional view of the semiconductor device 200 along the line B-B in FIG. 22C. FIG. 22C is a sectional view of the semiconductor device 200 along the line C-C in FIG. 22A. FIG. 22D is a sectional view of the semiconductor device 200 along the line D-D in FIG. 22A. FIGS. 22E-22G are partial views of the sectional view of FIG. 22C in alternative arrangements. FIG. 22H is a sectional view of the semiconductor device 200 along the line H-H in FIG. 22C.

The backside fin sidewall spacers 274 may be formed by conformally depositing a dielectric layer and then anisotropically etching the dielectric layer. The dielectric material may be any suitable dielectric material with etch selectivity relative to the gate dielectric layer 258. In some embodiments, the backside fin sidewall spacers 274 may be formed from a silicon and nitrogen containing material, such as SiN, SiONC, SiCN, and other dielectric materials. In some embodiments, the backside fin sidewall spacers 274 and the dielectric fins 272 may be formed from same material. Alternatively, different dielectric materials may be used for the backside fin sidewall spacers 274 and the dielectric fins 272.

Referring to FIG. 22C, each of the backside fin sidewall spacers 274 has a thickness T1 along the y-axis. After formation of the backside fin sidewall spacers 274, a trench 276 having a width W2 remains between neighboring dielectric fins 272. A pair of backside fin sidewall spacers 274 and the semiconductor fin 272 therebetween create a combined fin structure having a width W3 along the y-axis. The combined fin structures serve as a self-aligned mask at subsequent etching to cut and separate the epitaxial source/drain features 238, 248, in which a trench of a width about W2 is formed between neighboring epitaxial source/drain features 238, 248. The summation of the width W2 and the width W3 is substantially similar to the pitch of the semiconductor fin structures 210, or the pitch of the epitaxial source/drain features 238, 248. In some embodiments, the width W2 is in a range between about 10 nm and 30 nm. A width W2 less than 2 nm may not provide enough isolation between the neighboring epitaxial source/drain features 248, 238. A width W2 greater than 10 nm may cause volume loss of the epitaxial source/drain features 248, 238 without additional improvement of isolation therebetween.

In some embodiments, portions of the fin sidewall spacers 216f, the CESL 254, the ILD layer 256 exposed to the trench 276 may be removed by an anisotropic etch process so that the epitaxial source/drain features 248, 238, and the self-aligned mask layer 246 on the epitaxial source/drain features 238 (if present) are exposed to the trenches 276, as shown in FIGS. 22C, 22E, 22F, and 22G. In some embodiments, anisotropic etch of the fin sidewall spacers 216f, the CESL 254, the ILD layer 256 may be completed in the same anisotropic etch of the backside fin sidewall spacers 274. In other embodiments, the fin sidewall spacers 216f, the CESL 254, the ILD layer 256 may be etched in one or more separate etch processes.

Figure 23A:
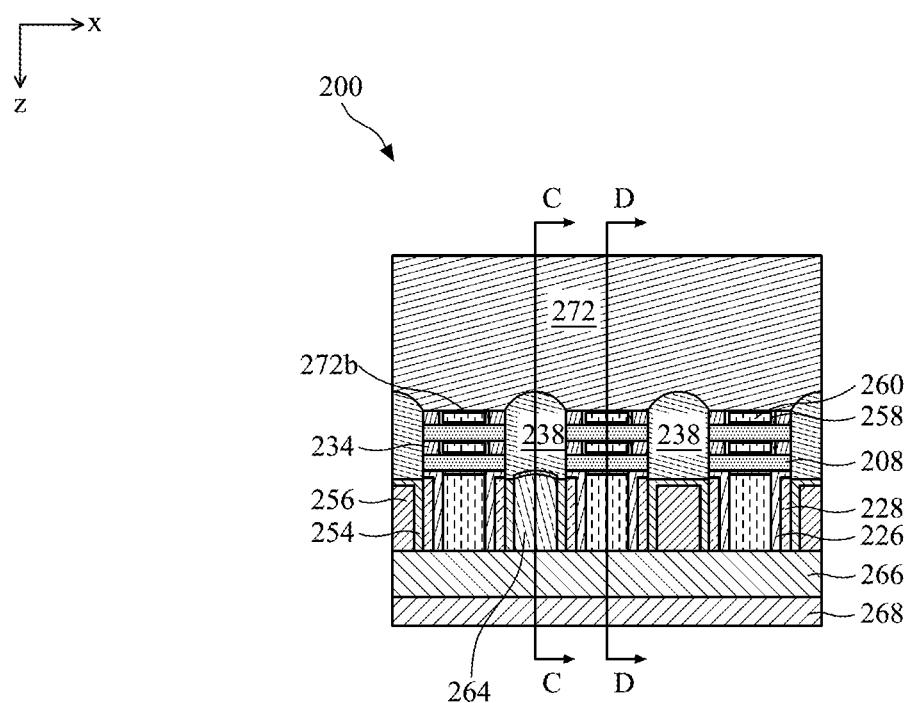
Figure 23B:
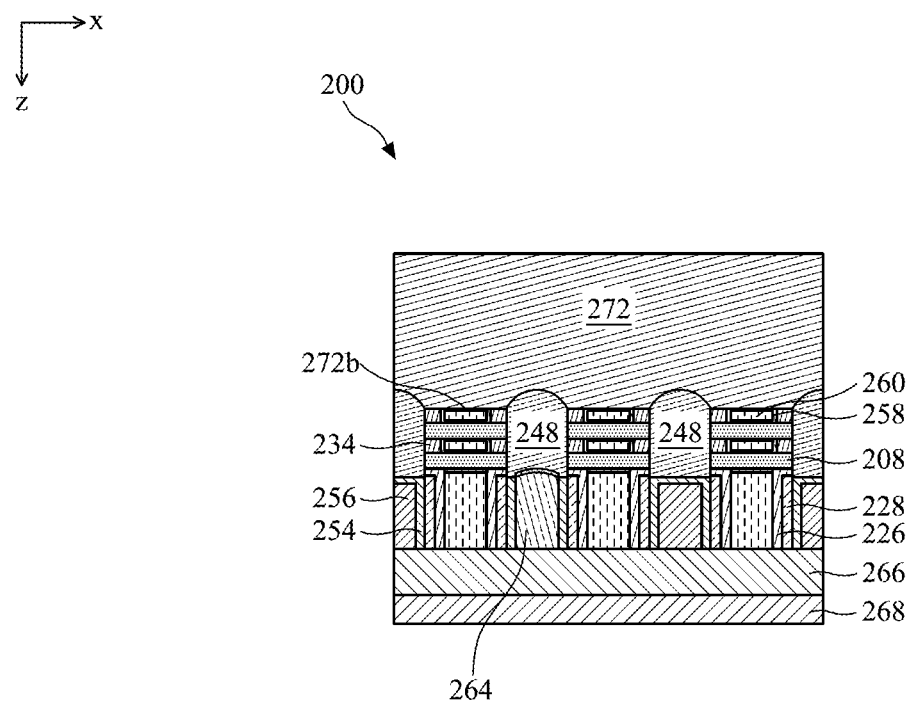
Figure 23C:
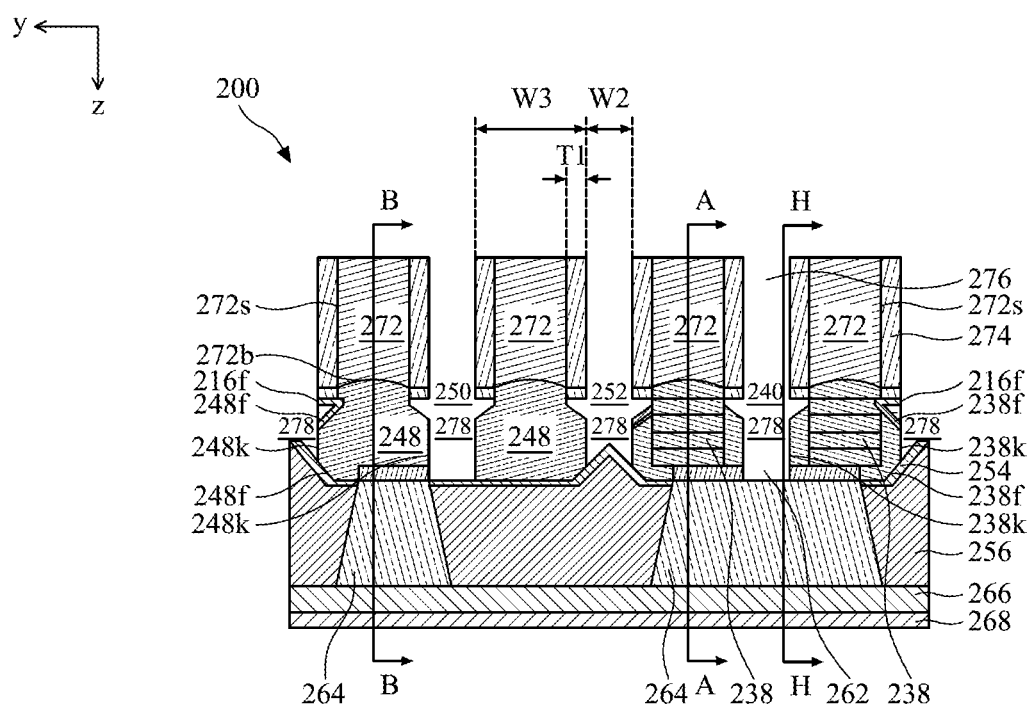
Figure 23D:
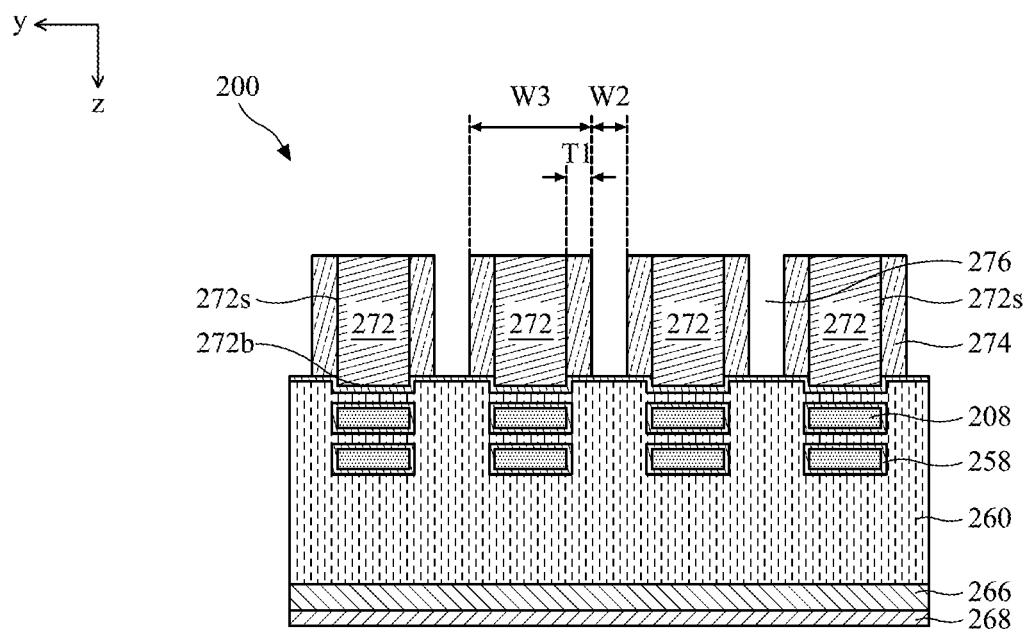
Figure 23E:
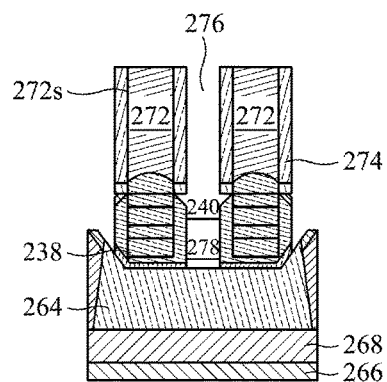
Figure 23F:
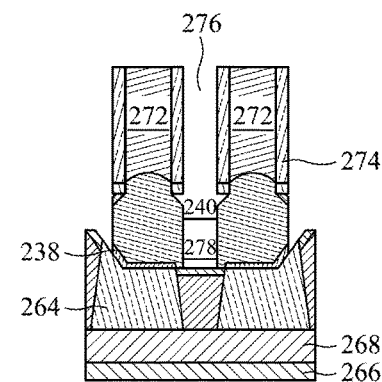
Figure 23G:
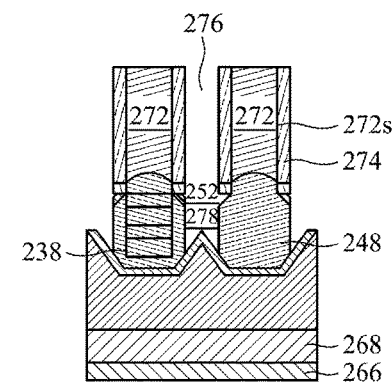
Figure 23H:
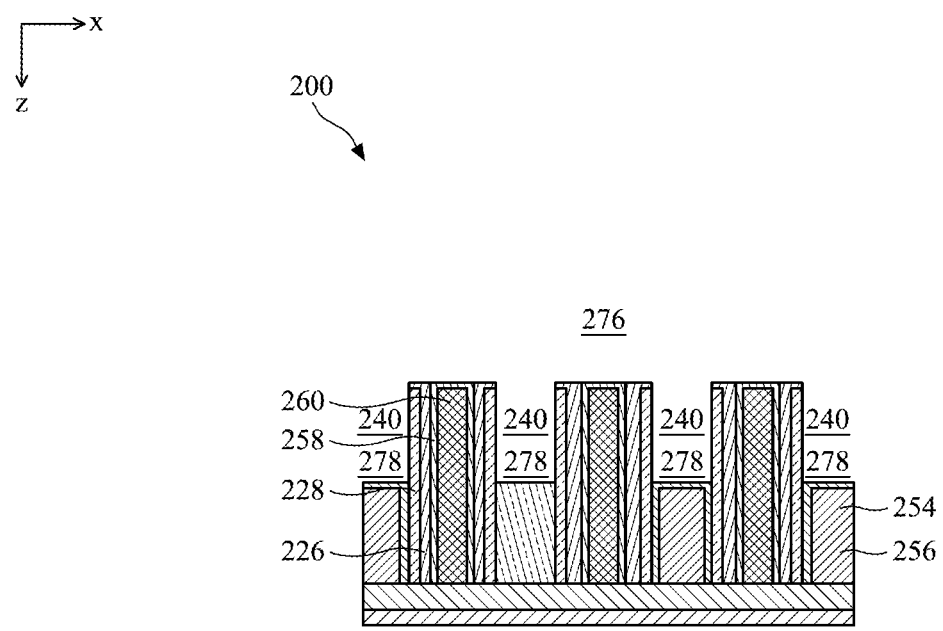

At operation 138, an anisotropic etch is performed to form cut openings 278 between the neighboring epitaxial source/drain features 238, 248, as shown in FIGS. 23A-23H. FIG. 23A is a sectional view of the semiconductor device 200 along the line A-A in FIG. 23C. FIG. 23B is a sectional view of the semiconductor device 200 along the line B-B in FIG. 23C. FIG. 23C is a sectional view of the semiconductor device 200 along the line C-C in FIG. 23A. FIG. 23D is a sectional view of the semiconductor device 200 along the line D-D in FIG. 23A. FIGS. 23E-23G are partial views of the sectional view of FIG. 23C in alternative arrangements. FIG. 23H is a sectional view of the semiconductor device 200 along the line H-H in FIG. 23C.

A suitable etching process may be performed to etch the epitaxial source/drain features 238, 248 through the trenches 276 forming the cut openings 278 between neighboring epitaxial source/drain features 238, 248. In some embodiments, the cut openings 278 are formed by an anisotropic etching which substantially transfers the width of the trenches 276 to the corresponding cut openings 278.

In some embodiments, the CESL 254 may function as the etch stop layer, as shown in FIGS. 23C, 23F, and 23G. The source/drain contact features 264 may also function as an etch stop, as shown in FIG. 23E. The etch process may also remove portions of the self-aligned mask layer 246 and the epitaxial liner 242 if present, as shown in FIGS. 23C and 23G. The etch process may also remove portions of the self-aligned mask layer 246 and the epitaxial liner 242 if present, as shown in FIGS. 23C and 23G. The cut openings 278 may be trenches along the x-axis with two epitaxial source/drain features 238/248 as sidewalls and the CESL 254 or the source/drain contact features 264 and the gate dielectric layer 258 as a bottom surface. Each cut opening 278 may be a substantially rectangular opening in the x-y plane, defined by the gate sidewall spacer layers 228 (as shown in FIG. 23H) and cut surfaces 238k/248k of neighboring epitaxial source/drain features 238/248 (as shown in FIG. 23C). The epitaxial source/drain features 238/248 may include various facet surfaces 238f/248f, resulting from epitaxial growth. The cut surfaces 238k/238k refer to the surfaces of the epitaxial source/drain features resulted in etching process after epitaxial growth. After operation 138, two cut surfaces 238k/248k may be formed on each of the epitaxial source/drain features 238/248. The cut surfaces 238k/248 are on opposing side of each of the epitaxial source/drain features 238/248. Each cut surface 238k/248k may be connected to or intersect with one or two facet surfaces 238f/248f.

Figure 24A:
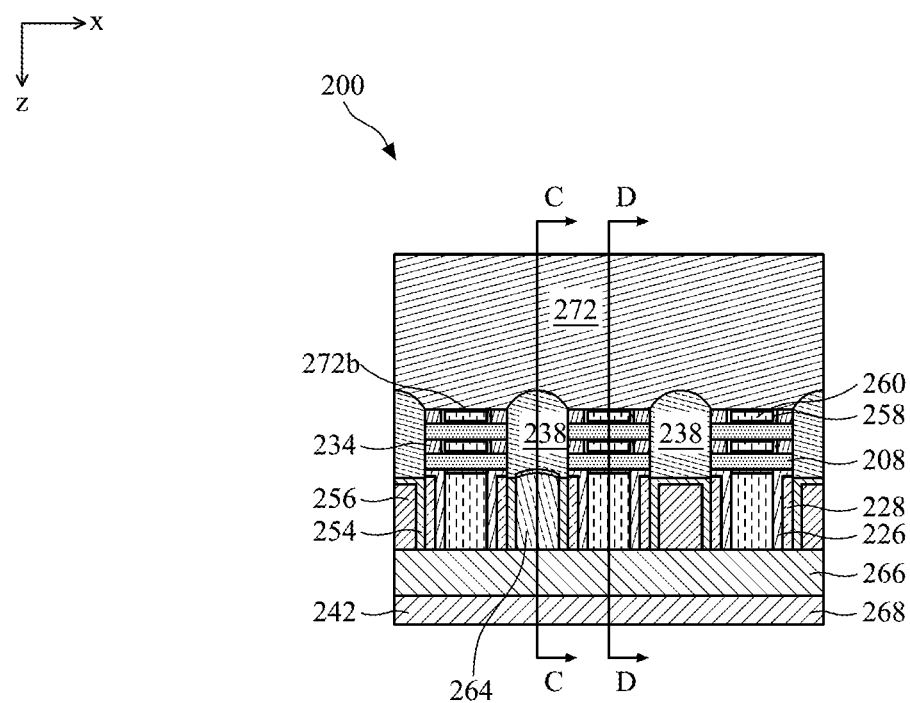
Figure 24B:
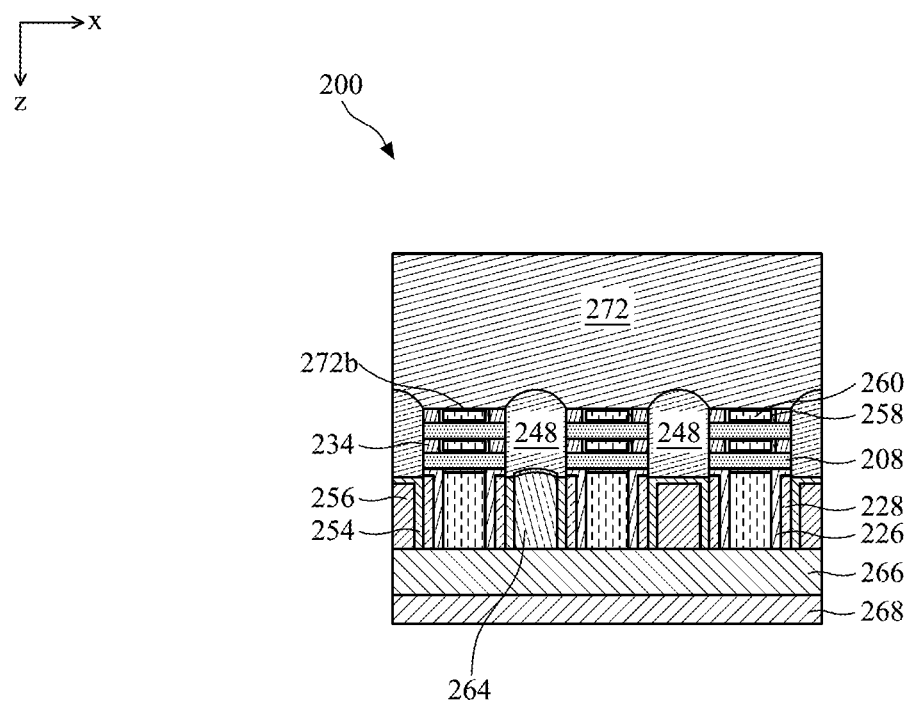
Figure 24C:
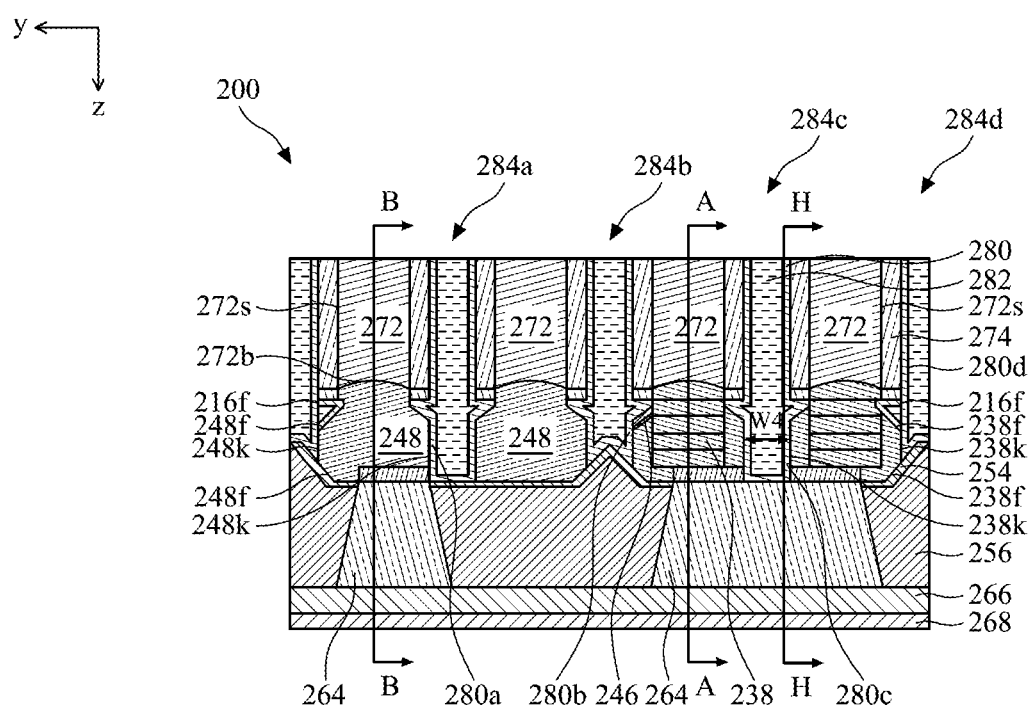
Figure 24D:
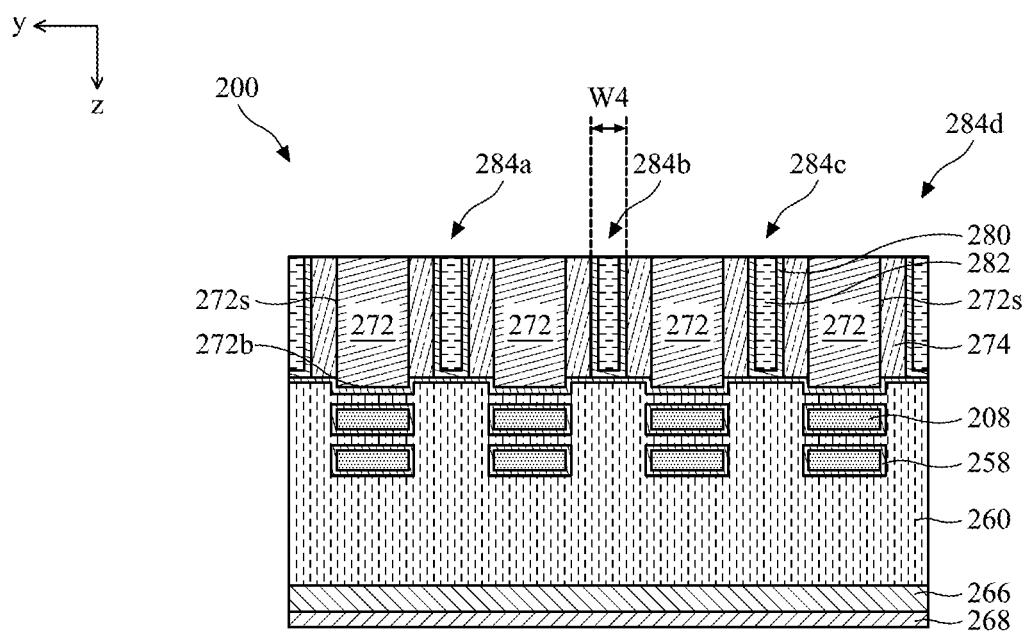
Figure 24E:
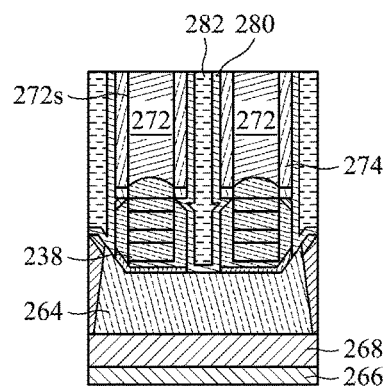
Figure 24F:
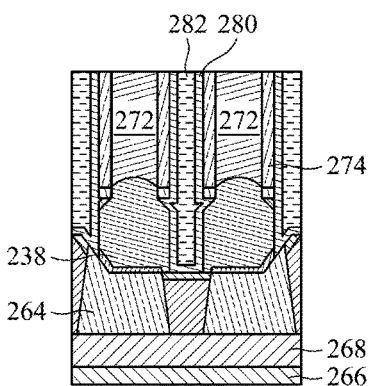
Figure 24G:
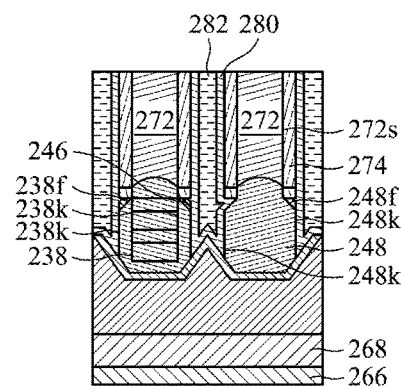
Figure 24H:
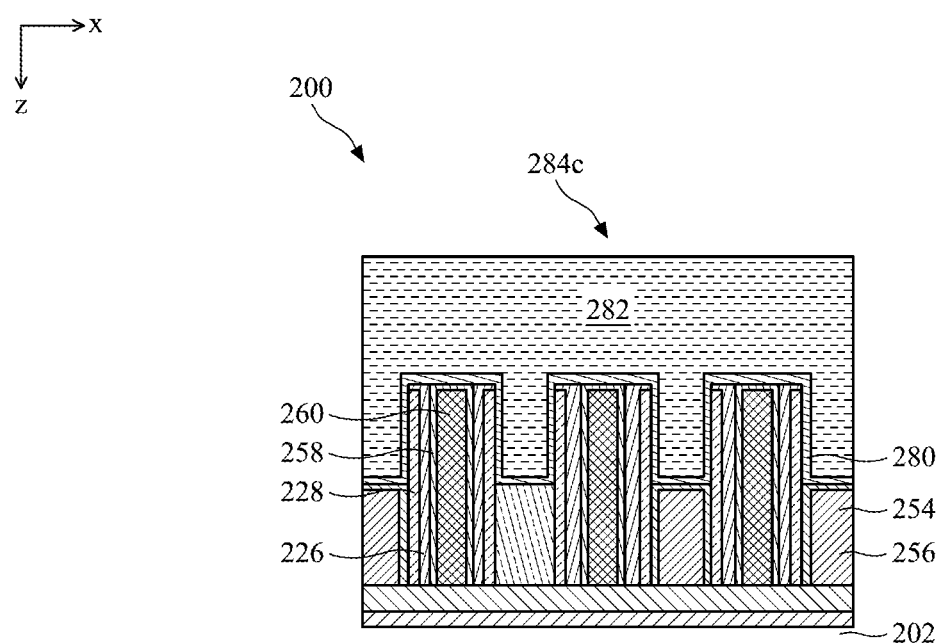

At operation 140, the cut openings 278 are lined with a dielectric liner 280 and filled with a dielectric filling layer 282, as shown in FIGS. 24A-24H. FIG. 24A is a sectional view of the semiconductor device 200 along the line A-A in FIG. 24C. FIG. 24B is a sectional view of the semiconductor device 200 along the line B-B in FIG. 24C. FIG. 24C is a sectional view of the semiconductor device 200 along the line C-C in FIG. 24A. FIG. 24D is a sectional view of the semiconductor device 200 along the line D-D in FIG. 24A. FIGS. 24E-24G are partial views of the sectional view of FIG. 24C in alternative arrangements. FIG. 24H is a sectional view of the semiconductor device 200 along the line H-H in FIG. 24C.

The dielectric liner 280 may be conformally deposited over exposed surfaces on the semiconductor devices 200. The dielectric liner may be formed from by ALD, CVD, or any other suitable method. In some embodiments, the dielectric liner 280 may be a silicon and nitrogen containing material, such as SiN, SiONC, SiCN, and other dielectric materials.

After formation of the dielectric liner 280, the dielectric filling layer 282 is deposited to fill the cut opening 278. In some embodiments, the dielectric filling layer 282 may be a silicon and oxygen containing material, such as silicon oxide. In some embodiments, the dielectric filling layer 282 may be a material convertible to a silicon oxide, a silicate glass (USG), an alkoxysilane compound (e.g., tetraethoxysilane (TEOS), tetramethoxysilane (TMOS)), thermal oxide, or any suitable dielectric material, or any combination thereof, and can be formed by ALD, CVD, FCVD, a spin-on coating process, or any suitable deposition technique. In some embodiments, the cut openings 278 may be partially filled with the dielectric filling layer 282 with air gaps within the dielectric filling layer 282, between the dielectric liner 280 and the dielectric filling layer 282, or between portions of the dielectric liner 280.

As shown in FIGS. 24A-24D, and 24H, the dielectric liner 280 and the dielectric filling layer 282 form backside hybrid fins 284a, 284b, 284c, 284d (collectively 284) between the neighboring epitaxial source/drain features 238/248, isolating the epitaxial source/drain features 238/248 from one another. The backside hybrid fins 284 may have a width W4 along the y-axis. The width W4 is may be in a range between 10 nm and 30 nm. A width W4 less than 2 nm may not provide enough isolation between the neighboring epitaxial source/drain features 248, 238. A width W4 greater than 10 nm may cause volume loss of the epitaxial source/drain features 248, 238 without additional improvement of isolation therebetween.

As shown in FIG. 24H, each backside hybrid fin 284 may traverse two or more gate structures (the gate dielectric layer 258 and gate electrode layer 260). The dielectric liner 280 is in contact with the gate sidewall spacers (the spacer liner 226 and the spacer layer 228), and the gate dielectric layer 258. Depending on the configuration of the epitaxial source/drain features, the backside hybrid fins 284 may have different shapes and be in contact with different layers, as shown in FIGS. 24C, 24E, 24F and 24G.

When a backside hybrid fin 284 is formed between two epitaxial source/drain features of the same type, such as the backside hybrid fins 284a, 284c in FIG. 24C, the dielectric liner 280 is in contact with a facet surface and a cut surface of the epitaxial surface. For example, the dielectric liner 280a contacts one of the facet surface 248f and one of the cut surface 248k of the epitaxial source/drain feature 248. For example, the dielectric liner 280c contacts one of the facet surface 238f and one of the cut surface 238k of the epitaxial source/drain feature 238. The dielectric liner 280 may contact the CESL 254. When a backside hybrid fin 284 is formed between two epitaxial source/strains of different types, such as the back side hybrid fin 284b in FIG. 24C, the dielectric liner 280 may be in contact with the self-aligned mask layer 246 on the epitaxial source/drain feature 238. When a backside hybrid fin 284 is formed between two epitaxial source/drain features sharing the same source/drain contact, the dielectric liner 280 may contact the source/drain contact feature, such as a facet surface 248f of the epitaxial source/drain feature 248 and a cut surface of the epitaxial source/drain feature. For example, the dielectric liner 280c contacts the source/drain contact feature 264, as shown in FIG. 24C.

Various embodiments or examples described herein offer multiple advantages over the state-of-art technology. By forming cut openings between epitaxial source/drain features from the backside, embodiments of the present disclosure eliminate undesired bridging between neighboring source/drain features as fin pitch reduces. By forming a self-aligned mask layer on epitaxial source/drain features, embodiments of the present disclosure reduce a patterning and lithographic process, and avoid causing damages to epitaxial source/drain features.

Some embodiments of the present provide a semiconductor device comprising a first epitaxial source/drain feature having a first cut surface, a first facet surface connected to the first cut surface, a second cut surface opposing the first cut surface, and a second facet surface connected to the second cut surface, a first hybrid fin in contact with the first cut surface, and a second hybrid fin in contact with the second cut surface.

Some embodiments of the present disclosure provide a semiconductor device. The semiconductor device includes a first epitaxial source/drain feature having a first surface and a second surface, a second epitaxial source/drain feature having a third surface and a fourth surface, wherein the third surface faces the first surface, a contact etch stop layer form along the second surface and the fourth surface, and a dielectric liner formed between the first and second epitaxial source/drain features, wherein the dielectric liner is in contact with the first epitaxial source/drain feature on the first surface, with the second epitaxial source/drain feature on the third surface, and with contact etch stop layer.

Some embodiments of the present disclosure provide a method for forming a semiconductor device. The method includes forming first and second semiconductor fin structures, epitaxially growing a first source/drain feature from the first semiconductor fin structure and a second source/drain feature from the second semiconductor fin structure, wherein the first source/drain feature is in contact with the second source/drain feature, forming a cut opening between the first and second source/drain features, and filling the cut opening with one or more dielectric materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   a first epitaxial source/drain feature having:
      a first cut surface;
      a first facet surface connected to the first cut surface;
      a second cut surface opposing the first cut surface; and
      a second facet surface connected to the second cut surface;
   a first hybrid fin in contact with the first cut surface; and
   a second hybrid fin in contact with the second cut surface.

2. The semiconductor device of claim 1, further comprising a contact etch stop layer in contact with the first facet surface of the first epitaxial source/drain feature.

3. The semiconductor device of claim 2, further comprising:
   a dielectric fin disposed between the first and second hybrid fins and in contact with the first epitaxial feature.

4. The semiconductor device of claim 3, further comprising:
   a first backside sidewall spacer disposed between the first hybrid fin and the dielectric fin; and
   a second backside sidewall spacer disposed between the second hybrid fin and the dielectric fin.

5. The semiconductor device of claim 3, further comprising:
   a source/drain contact feature, wherein the source/drain contact feature and the dielectric fin are disposed on opposing sides of the first epitaxial source/drain feature.

6. The semiconductor device of claim 2, further comprising:
   a second epitaxial source/drain feature, wherein the first hybrid fin is disposed between the first and second epitaxial source/drain features, and the contact etch stop layer is in contact with the second epitaxial source/drain feature.

7. The semiconductor device of claim 6, further comprising a self-aligned mask layer disposed between the first epitaxial source/drain feature and the first hybrid fin along the first facet surface.

8. The semiconductor device of claim 6, further comprising a source/drain contact feature in connection with the first epitaxial source/drain feature, the second epitaxial source/drain feature and the first hybrid fin.

9. The semiconductor device of claim 1, wherein each of the first and second hybrid fins comprises:
   a dielectric liner; and
   a dielectric filling material.

10. A semiconductor device, comprising:
    a first epitaxial source/drain feature having a first surface and a second surface;
    a second epitaxial source/drain feature having a third surface and a fourth surface, wherein the third surface faces the first surface;
    a contact etch stop layer formed along the second surface and the fourth surface;
    a dielectric liner formed between the first and second epitaxial source/drain features, wherein the dielectric liner is in contact with the first epitaxial source/drain feature on the first surface, with the second epitaxial source/drain feature on the third surface, and with contact etch stop layer; and
    a dielectric filling material disposed on the dielectric liner, wherein the dielectric liner and the dielectric filling material form a hybrid fin structure between the first and second epitaxial source/drain features.

11. The semiconductor device of claim 10, further comprising a self-align mask layer disposed on a fifth surface of the first epitaxial source/drain feature, and the dielectric liner is in contact with the self-aligned mask layer.

12. The semiconductor device of claim 10, wherein the fifth surface is connected to the first surface, the second epitaxial source/drain feature has a sixth surface connected to the fourth surface, and the dielectric liner is in contact with the sixth surface.

13. A method for forming a semiconductor device, comprising:
    forming first and second semiconductor fin structures;
    epitaxially growing a first source/drain feature from the first semiconductor fin structure and a second source/drain feature from the second semiconductor fin structure, wherein the first source/drain feature is in contact with the second source/drain feature;
    forming a cut opening between the first and second source/drain features; and
    filling the cut opening with one or more dielectric materials.

14. The method of claim 13, wherein forming the first and second epitaxial source/drain features are performed from a first side of a substrate and forming the cut opening is performed from a second side of the substrate.

15. The method of claim 14, wherein forming the cut opening comprises:
    removing the first and second semiconductor fin structures to form first and second fin cavities;
    forming first and second dielectric fins in the first and second fin cavities; and
    forming the cut opening between the first and second dielectric fins.

16. The method of claim 15, wherein forming the cut opening further comprises:
    forming sidewall spacers on the first and second dielectric fins prior to forming the cut opening.

17. The method of claim 16, wherein filling the cut opening comprises:
    forming a dielectric liner in the cut opening; and
    depositing a filling dielectric layer over the dielectric liner.

18. The method of claim 13, wherein epitaxially growing the first and second source/drain features comprises:
    epitaxially growing the first source/drain feature from the first semiconductor fin structure while the second semiconductor fin structure is covered by a hard mask layer;
    forming a self-aligned mask layer on the first source/drain feature;
    removing the hard mask layer from the second semiconductor fin structure; and
    epitaxially growing the second source/drain feature from the second semiconductor fin structure.

19. The method of claim 18, wherein forming the self-aligned mask layer on the first source/drain feature comprises:
    forming an epitaxial liner on the first source/drain feature;
    forming an epitaxial cap layer on the epitaxial liner;
    oxidizing the epitaxial cap layer; and
    annealing the oxidized epitaxial cap layer to form the self-aligned mask layer.

20. The method of claim 19, further comprising:
    removing the self-aligned mask layer.

* * * * *